United States Patent
Mack et al.

(10) Patent No.: US 8,168,939 B2
(45) Date of Patent: May 1, 2012

(54) METHOD AND SYSTEM FOR A LIGHT SOURCE ASSEMBLY SUPPORTING DIRECT COUPLING TO AN INTEGRATED CIRCUIT

(75) Inventors: Michael Mack, San Diego, CA (US); Mark Peterson, San Diego, CA (US); Steffen Gloeckner, San Diego, CA (US); Adithyaram Narasimha, Carlsbad, CA (US); Roger Koumans, Irvine, CA (US); Peter De Dobbelaere, San Diego, CA (US)

(73) Assignee: Luxtera, Inc., Carlsbad, CA (US)

( * ) Notice: Subject to any disclaimer, the term of this patent is extended or adjusted under 35 U.S.C. 154(b) by 526 days.

(21) Appl. No.: 12/500,465

(22) Filed: Jul. 9, 2009

(65) Prior Publication Data
US 2010/0006784 A1    Jan. 14, 2010

Related U.S. Application Data

(60) Provisional application No. 61/079,358, filed on Jul. 9, 2008.

(51) Int. Cl.
| | |
|---|---|
| *G02F 1/01* | (2006.01) |
| *G01N 21/86* | (2006.01) |
| *G02B 5/30* | (2006.01) |
| *G01J 3/447* | (2006.01) |

(52) U.S. Cl. ............... 250/225; 250/559.09; 359/484; 356/327

(58) Field of Classification Search .......... 250/251, 250/559.08, 216, 225, 559.09; 359/251, 359/281, 484, 487, 283, 352, 437, 485, 489, 359/494, 495, 497; 356/33, 308, 322, 327, 356/453, 487, 491

See application file for complete search history.

(56) References Cited

U.S. PATENT DOCUMENTS

| | | | |
|---|---|---|---|
| 5,689,360 A * | 11/1997 | Kurata et al. | 359/281 |
| 6,856,717 B2 | 2/2005 | Kilian | |
| 6,865,006 B2 * | 3/2005 | Sakane et al. | 359/251 |
| 6,969,204 B2 | 11/2005 | Kilian | |
| 7,474,826 B2 * | 1/2009 | Tallone et al. | 385/49 |
| 7,505,192 B1 * | 3/2009 | Zhao et al. | 359/282 |
| 7,961,989 B2 * | 6/2011 | Kathman et al. | 385/14 |
| 2005/0023489 A1 * | 2/2005 | Kikuchi | 250/551 |
| 2008/0055704 A1 * | 3/2008 | Neidrich et al. | 359/290 |

\* cited by examiner

*Primary Examiner* — Georgia Y Epps
*Assistant Examiner* — Don Williams
(74) *Attorney, Agent, or Firm* — McAndrews, Held & Malloy

(57) ABSTRACT

Methods and systems for a light source assembly supporting direct coupling to a photonically enabled complementary metal-oxide semiconductor (CMOS) chip are disclosed. The assembly may include a laser, a microlens, a turning mirror, reciprocal and/or non-reciprocal polarization rotators, and an optical bench. The laser may generate an optical signal that may be focused utilizing the microlens. The optical signal may be reflected at an angle defined by the turning mirror, and may be transmitted out of the light source assembly to one or more grating couplers in the chip. The laser may include a feedback insensitive laser. The light source assembly may include two electro-thermal interfaces between the optical bench, the laser, and a lid affixed to the optical bench. The turning mirror may be integrated in a lid affixed to the optical bench or may be integrated in the optical bench.

57 Claims, 53 Drawing Sheets

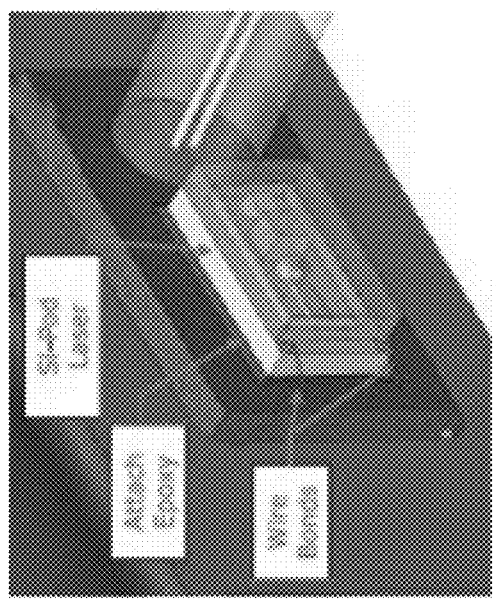
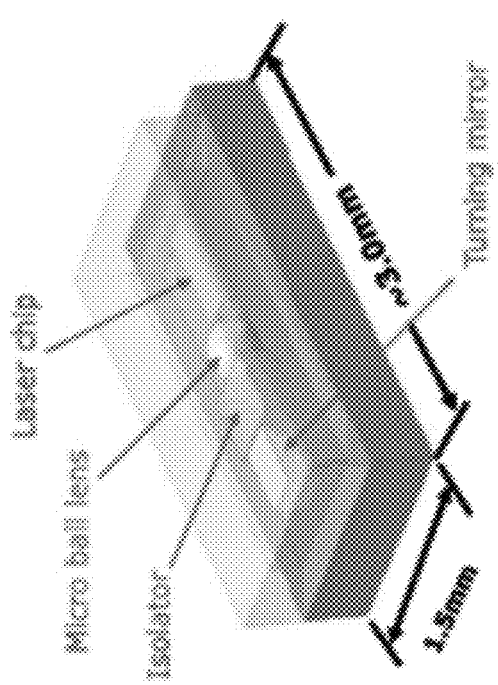
FIG. 2A

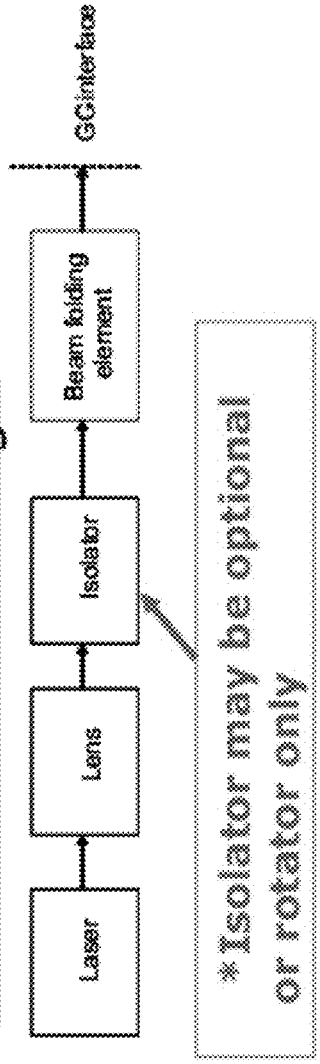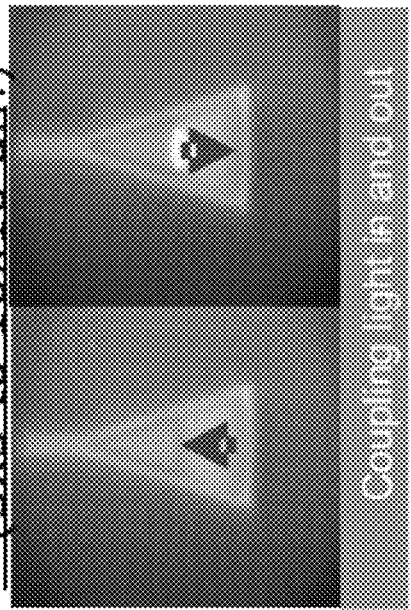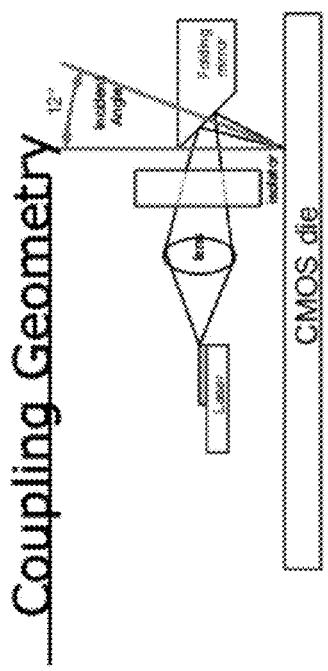
FIG. 2B

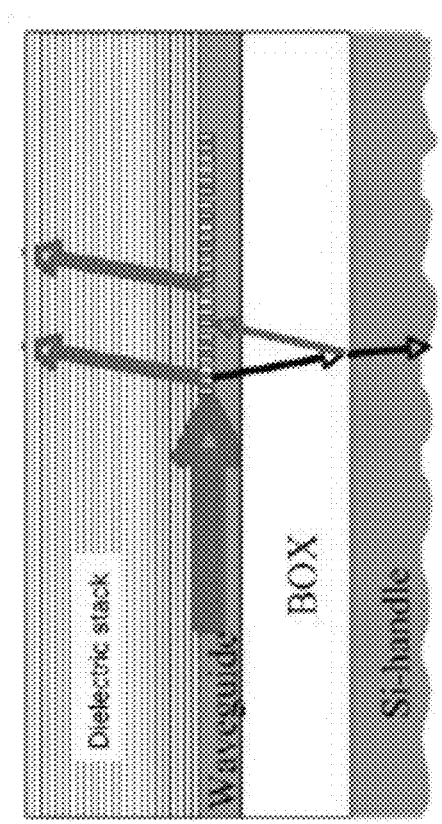
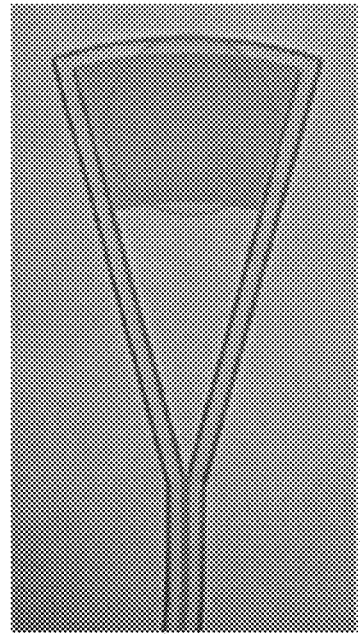
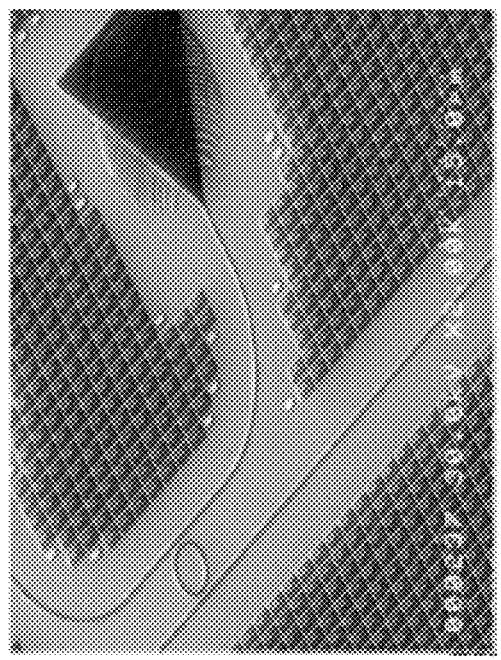
FIG. 2D

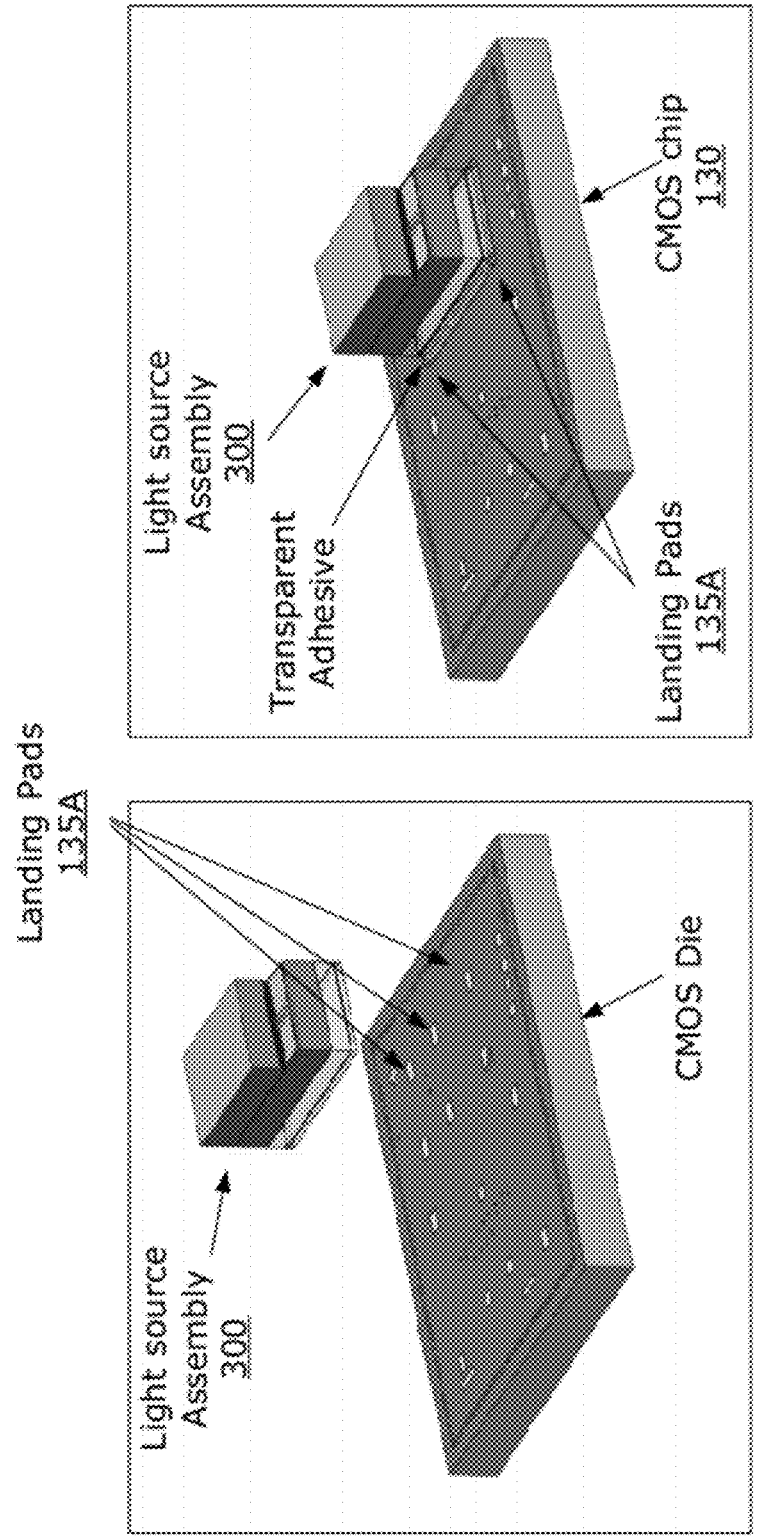

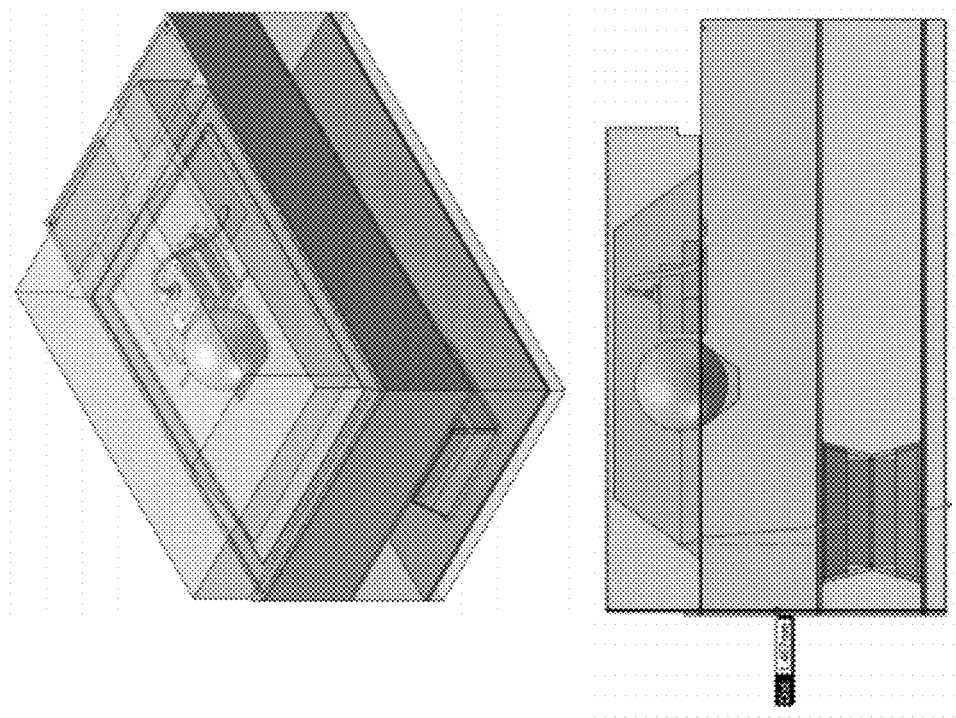
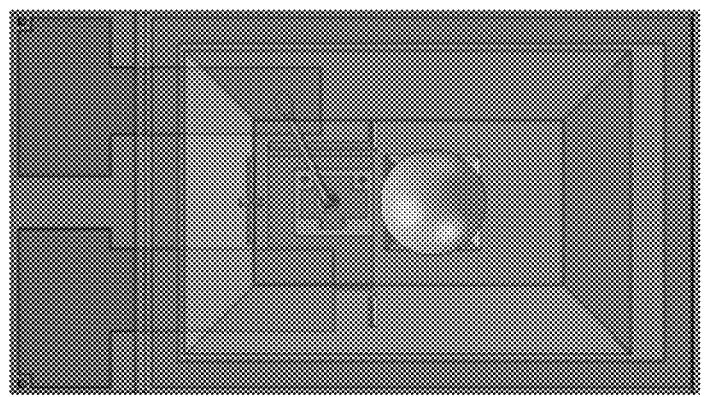
FIG. 3K

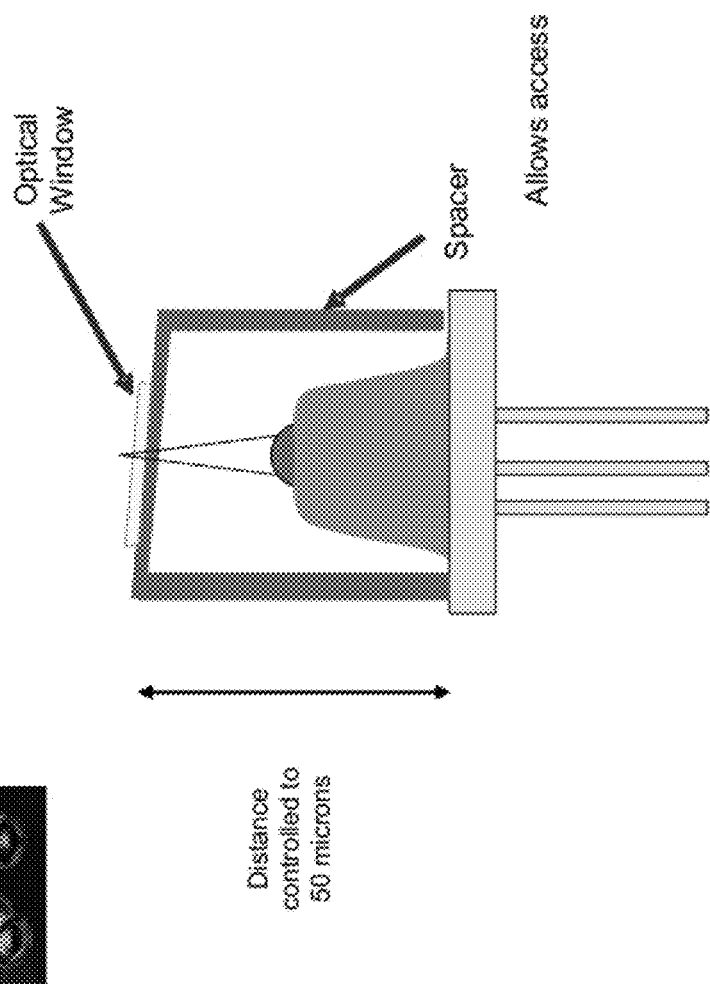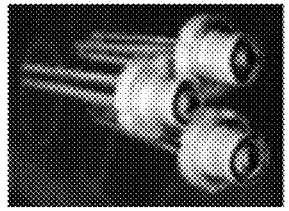
FIG. 5

Cavity Down Wire Bond w/Heatspreader
(External Heatsink)

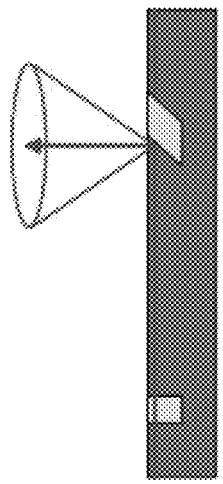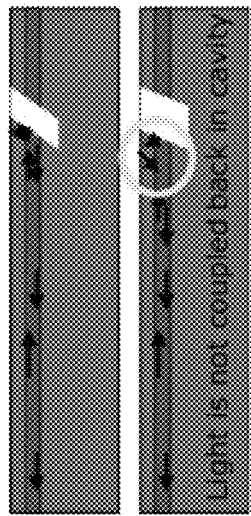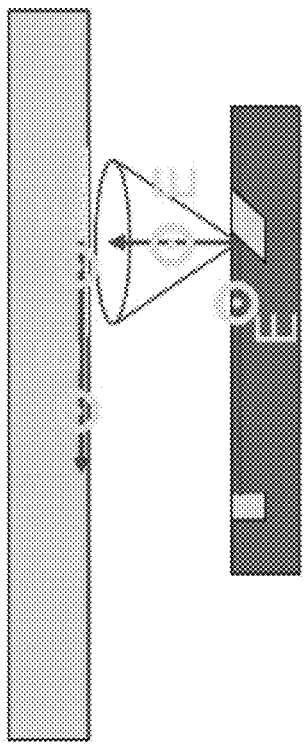
HCSEL (mirror):
- Output power (e.g. 20 mW)
- Defined polarization
- Mirror angle may be 45 deg
- Polarization compatible
FIG. 31

HCSEL Grating Coupler

- Uses grating coupler to obtain surface emission
- DBR type laser (superior spectrum)
- May use, e.g., 90 degree coupling (or alternatively 2 beams)
- Defined polarization
- Power may be > 20 mW, e.g. by making cavity longer and grating grates deeper.

METHOD AND SYSTEM FOR A LIGHT SOURCE ASSEMBLY SUPPORTING DIRECT COUPLING TO AN INTEGRATED CIRCUIT

CROSS-REFERENCE TO RELATED APPLICATIONS/INCORPORATION BY REFERENCE

This application makes reference to and claims priority to U.S. Provisional Application Ser. No. 61/079,358 filed on Jul. 9, 2008, which is hereby incorporated herein by reference in its entirety.

This application also makes reference to: U.S. Patent Application Ser. No. 61/190,857 filed on Sep. 3, 2008.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to optoelectronic communications. More specifically, certain embodiments of the invention relate to a method and system for a light source assembly supporting direct coupling to an integrated circuit.

BACKGROUND OF THE INVENTION

Optical communication has revolutionized how information is transmitted. Mass-produced semiconductor lasers transmit multiple-wavelength optical signals over low-loss, low-dispersion optical fibers, modulated at multi-gigabit per second (GB/s) rates, for hundreds of kilometers. Text, voice, audio, and video data are all transmitted around the globe utilizing optical fibers, supporting both wired and wireless communication systems.

Optical fiber communication has moved into lower cost, yet still high performance applications, such as metro access networks and enterprise LAN backbones. Single-mode fiber (SMF) is poised to replace short copper links in high data rate, 10 GB/s and above, applications.

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a light source assembly supporting direct coupling to an integrated circuit, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 2A is a block diagram of an exemplary micropackaged light source, in accordance with an embodiment of the invention.

FIG. 2B is a light source assembly functional block diagram, a coupling geometry diagram, and a micrograph of a functioning grating coupler, in accordance with an embodiment of the invention.

FIG. 2D is a block diagram of an exemplary optical input/output, in accordance with an embodiment of the invention.

FIG. 3I illustrates an exemplary light source module with landing pads, in accordance with an embodiment of the invention.

FIG. 3K is a diagram illustrating various views of the light source assembly, in accordance with an embodiment of the invention.

FIG. 5 illustrates a TO-can implementation, in accordance with an embodiment of the invention.

FIG. 31 illustrates an exemplary HCSEL embodiment with mirror coupling of light out of the surface of the laser diode chip, in accordance with an embodiment of the invention.

DETAILED DESCRIPTION OF THE INVENTION

Certain aspects of the invention may be found in a method and system for a light source assembly supporting direct coupling to an integrated circuit. In various exemplary aspects of the invention, a light source assembly affixed to the chip may comprise a laser, a microlens, a turning mirror, an optical bench, and reciprocal and non-reciprocal polarization rotating elements. The laser may generate an optical signal that may be focused utilizing the microlens, which may comprise a ball lens. The focused optical signal may be reflected at an angle defined by the turning mirror. The reflected optical signal may be transmitted out of the light source assembly to one or more grating couplers in the photonically enabled CMOS chip. The one or more grating couplers may comprise polarization independent optical couplers. The laser may comprise an edge-emitting semiconductor laser diode and/or a feedback insensitive laser diode. The light source assembly may comprise two electro-thermal interfaces between the optical bench, the laser, and a lid affixed to the optical bench. The turning mirror may be integrated in a lid affixed to the optical bench by etching, or may be integrated in the optical bench.

Figure 1A:
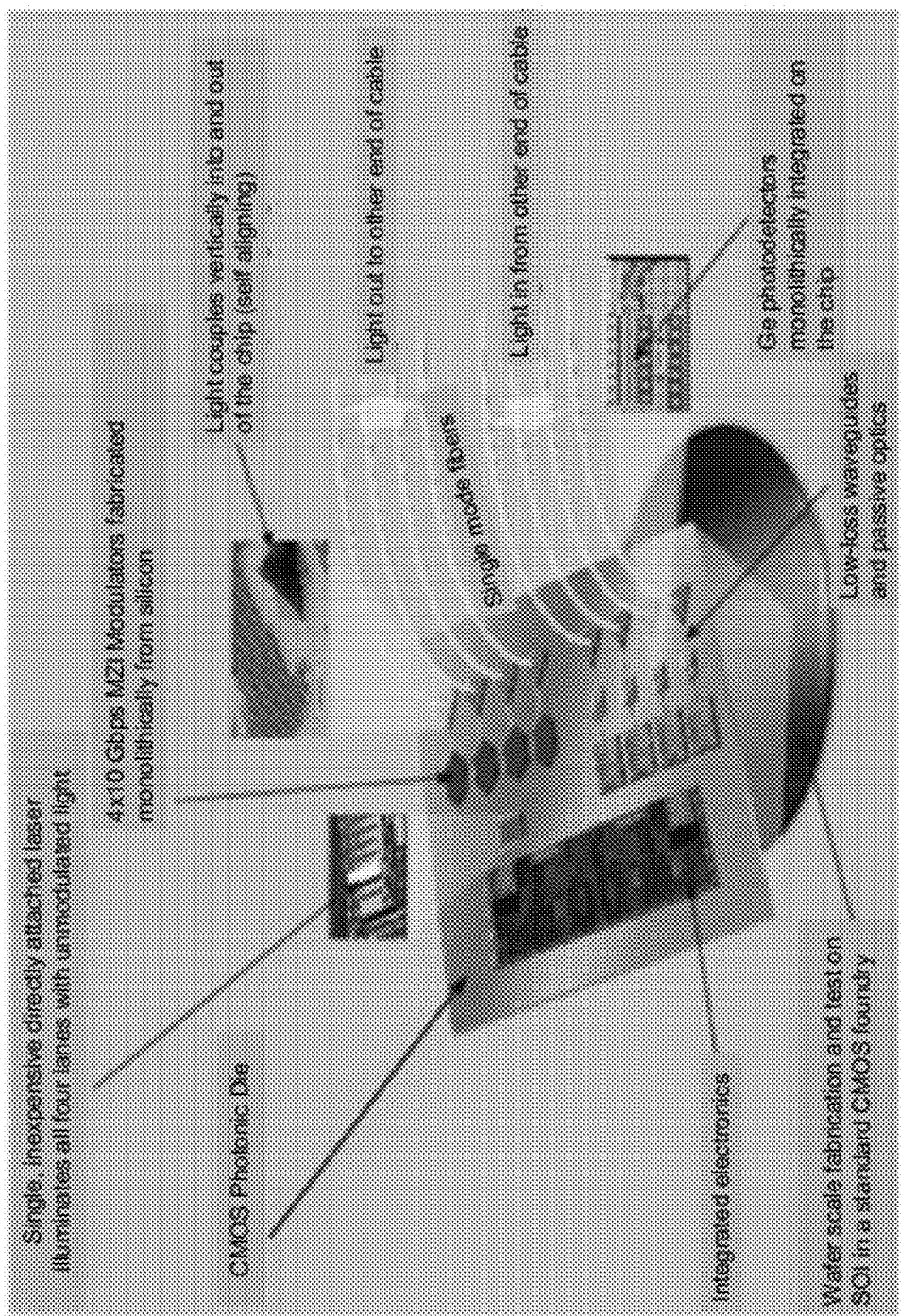
FIG. 1A is a block diagram of an exemplary CMOS wafer comprising optoelectronic transceiver chips, in accordance with an embodiment of the invention.

FIG. 1A is a block diagram of an exemplary CMOS wafer comprising optoelectronic transceiver chips, in accordance with an embodiment of the invention. Each chip, or die, comprises Mach-Zehnder interferometer (MZI) modulators, surface light couplers for fiber coupling, germanium (Ge) photodetectors, low-loss waveguides and passive optics, a coupled light source, and integrated electronics. By utilizing surface light coupling into and out of the chip, a standard CMOS process including a metal guard ring may be utilized. Similarly, by utilizing a single coupled light source with a photonically enabled CMOS chip, low cost, high performance optoelectronic transceivers are enabled.

Furthermore, the integration enables wafer-scale testing and screening for bad wafers and/or die, even during fabrication at the fab, using in line process monitors, and during subsequent wafer-scale testing. Conventional systems are tested after they are separated, the only exception being VCSELs. In an embodiment of the invention, the laser source may be mounted to the CMOS integrated circuit for testing of the optical and optoelectronic devices in the chip.

In an embodiment of the invention, simulation and verification of the entire OE signal path and low-speed control/power, and other blocks may be completed before fabrication, using standard CMOS design tools, such as standard tools that include simulation of optical devices in a SPICE-type simulator that are typically only used for electronics. This enables assurance of high-speed and optical signal integrity within the chip by design across all process/voltage/environmental corners, as opposed to the difficult task of ensuring signal integrity across PCB traces and wires when connecting electronics-only laser drivers and TIAs to optical elements in conventional optics hybrid systems.

Similarly, it enables a reduction in bill of material (BOM) items with almost no loss of yield due to element mismatch due to different technologies (CMOS high-speed drivers with directly modulated III-V lasers, TIAs with III-V photodetectors, for example) in the high-speed signal path. The result is a significant reduction of assembly cost, and a higher yield.

Integrated CMOS optical and electrical functionality enables improved reliability. For example, since there is no direct modulation of lasers or external modulators, but rather the modulation of a silicon junction, where the reliability is that of a CMOS chip. By utilizing a single edge emitting CW laser instead of an array of discrete VCSELs, reliability may be increased further, since edge emitting DFB and Fabry-Perot lasers exhibit increased reliability and are able to operate at higher temperatures. Furthermore, the system reliability is enhanced by standard SOI CMOS process reliability, for example, and high volume capability which enables lower cost optical data transmission. Similarly, the monolithic integration of electrical and optical functionality eliminates reliability limitations of the interconnection packaging technologies inherent in non-monolithic systems.

Further functions integrated in the CMOS chip comprise: digital circuits, mixed signal A/D, D/A, voltage regulators, bypass/decoupling, and feedback loops to control chip over temperature, which removes the need for temperature control via thermoelectric coolers, for example. This reduces power dissipation and cost. Further functionality comprises a built-in self test to reduce external testing equipment requirements and testing cost.

In addition, additional blocks from third parties may be integrated, such as SerDes and/or standard protocol blocks such as USB, PCI Express, for example.

In an embodiment of the invention, the CMOS optical and electrical integration provides a port to next generation CMOS nodes to benefit from smaller linewidths and faster transistors, for example.

An optical source may be coupled to the CMOS chip to provide a continuous-wave (CW) light beam that may be processed by the chip and transmitted over optical fibers. The optical source comprises a III-V, or other semiconductor material, laser diode, for example, that may be affixed to a support structure with one or more beam deflecting surfaces and/or devices that may enable coupling of the light into the CMOS chip. In an embodiment of the invention, the light is coupled into a grating coupler integrated in the chip which may result in optimum coupling efficiency when the light is transmitted to the surface with a particular polarization and angle. Thus, the optical source may comprise polarization control structures to optimize coupling efficiency into the chip.

In another or complimentary embodiment of the invention, an isolator is integrated in the optical source to isolate the laser diode from signals received from the grating coupler in the CMOS chip, which may adversely affect the operation of the laser diode.

Figure 1B:
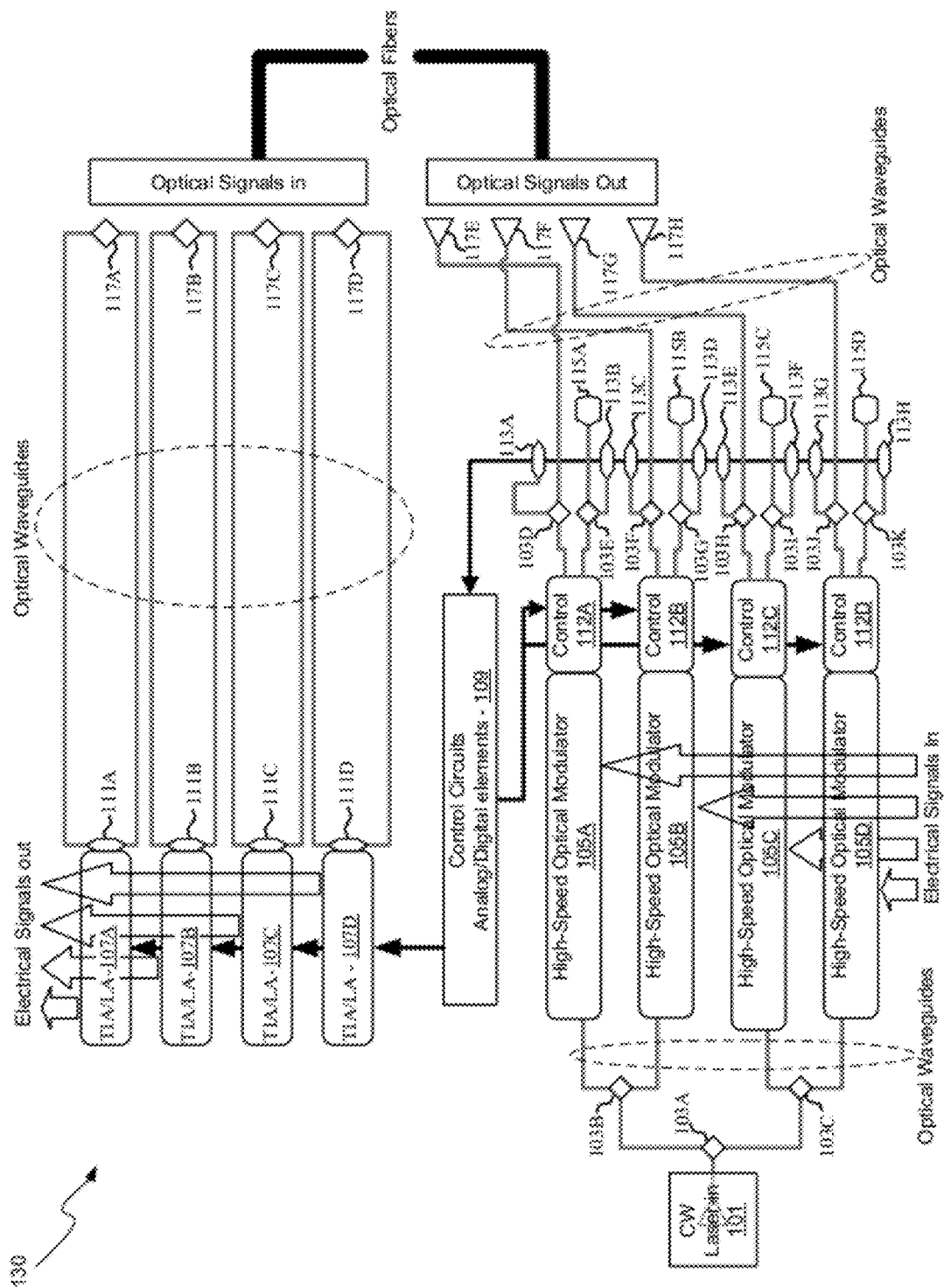
FIG. 1B is a block diagram of an exemplary integrated CMOS transceiver, in accordance with an embodiment of the invention.

FIG. 1B is a block diagram of a photonically enabled CMOS chip, in accordance with an embodiment of the invention. Referring to FIG. 1B, there is shown optoelectronic devices on a CMOS chip 130 comprising high speed optical modulators 105A-105D, high-speed photodiodes 111A-111D, monitor photodiodes 113A-113H, and optical devices comprising taps 103A-103K, optical terminations 115A-115D, and grating couplers 117A-117H. There is also shown electrical devices and circuits comprising transimpedance and limiting amplifiers (TIA/LAs) 107A-107D, analog and digital control circuits 109, and control sections 112A-112D. Optical signals are communicated between optical and optoelectronic devices via optical waveguides fabricated in the CMOS chip 130.

The high speed optical modulators 105A-105D comprise Mach-Zehnder or ring modulators, for example, and enable the modulation of the CW laser input signal. The high speed optical modulators 105A-105D are controlled by the control sections 112A-112D, and the outputs of the modulators are optically coupled via waveguides to the grating couplers 117E-117H. The taps 103D-103K comprise four-port optical couplers, for example, and are utilized to sample the optical signals generated by the high speed optical modulators 105A-105D, with the sampled signals being measured by the monitor photodiodes 113A-113H. The unused branches of the taps 103D-103K are terminated by optical terminations 115A-115D to avoid back reflections of unwanted signals.

The grating couplers 117A-117H comprise optical gratings that enable coupling of light into and out of the CMOS chip 130. The grating couplers 117A-117D are utilized to couple light received from optical fibers into the CMOS chip 130, and the grating couplers 117E-117H are utilized to couple light from the CMOS chip 130 into optical fibers. The optical fibers may be epoxied, for example, to the CMOS chip, and may be aligned at an angle from normal to the surface of the CMOS chip 130 to optimize coupling efficiency.

The high-speed photodiodes 111A-111D convert optical signals received from the grating couplers 117A-117D into electrical signals that are communicated to the TIA/LAs 107A-107D for processing. In another embodiment of the invention, photodetectors may be used in the high-speed data path as monitor photodiodes to monitor the signal strength, and as a feedback signal for control of the light source intensity, for example.

In an embodiment of the invention, optical terminations may be utilized to eliminate unneeded or unused optical signals. The analog and digital control circuits 109 may control gain levels or other parameters in the operation of the TIA/LAs 107A-107D. The TIA/LAs 107A-107D then communicate electrical signals off the CMOS chip 130.

The control sections 112A-112D comprise electronic circuitry that enable modulation of the CW laser signal received from the splitters 103A-103C. The high speed optical modulators 105A-105D require high-speed electrical signals to modulate the refractive index in respective branches of a Mach-Zehnder interferometer (MZI), for example. The voltage swing required for driving the MZI is a significant power drain in the CMOS chip 130. Thus, if the electrical signal for driving the modulator may be split into domains with each domain traversing a lower voltage swing, power efficiency is increased.

The 4×10 Gb/s transceiver, with four channels of transmit and four channels of receive on a single chip may comprise high-speed analog electronic circuits, high speed photodiodes 111A-111D, optical fibers, control circuits 112A-112D, high-speed optical modulators 105A-105D, modulator control circuits, taps 103A-103K, monitor photodiodes 113A-113H, a CW laser, and optical waveguides. In the illustrated embodiment, with the exception of the CW laser and the optical fibers, which may be coupled to the surface of the chip, all of the components shown may be integrated in a chip fabricated using a standard CMOS process, and a guard ring may be used. Light is coupled in and out of the surface of the chip, permitting the use of a guard ring.

In an embodiment of the invention, all optical and electrical functions of a high-speed optical data transceiver may be integrated in a single CMOS SOI chip, except for the light generation, which may be coupled into the chip via a laser source coupled to the surface of the chip. In conventional telecom and datacom systems, these functions are accomplished by separate components. For example, the laser and photodetectors may be fabricated in III-V materials such as indium gallium arsenide phosphide, for example. Furthermore, in conventional systems, the modulator/laser drivers and transimpedance amplifiers (TIAs) and receiver circuits may be fabricated in SiGe or CMOS chips. In an embodiment of the invention, by integrating the electrical and optical components on a single chip, multiple data channels may be readily fabricated on a single die. This approach leads to a highly scalable transmitter by replicating unit cells.

In an embodiment of the invention, the optical functionality that is integrated on the chip comprises: waveguiding, optical coupling, light splitting, high and low speed optical modulation, light detection, and light termination. Optical coupling comprises coupling light in and out of the chip via optical I/O, grating couplers, which may couple light in from an external laser, and also couple light in and out of optical fibers.

In an embodiment of the invention, splitting light may be enabled via splitters and/or taps. Splitters and/or taps may split the laser light four or more ways so that a single laser can feed four or more channels, via 50% splitters, or to tap off a small portion of the light, 1 to 2%, for example, for monitoring the optical signal at the output of the modulators.

High-speed optical modulation, from 1 to 10 GB/s or higher, for example, may be utilized to convert electrical high-speed signals to optical signals. Low-speed optical modulation, indicated by the control sections 112A-112D, may compensate for fabrication variations and environmental changes during operation, such as a change of temperature, for example.

Electrical control of optical functions integrated on the chip comprises routing light around the chip, similar to an electrical interconnect. High-speed analog circuits comprise: modulator drivers, transimpedance amplifiers, limiting amplifiers, transmitters/receivers to drive traces on host PCB, and clock/data recovery (CDR). Low-speed analog circuits comprise: monitor photodiode amplifiers, low-speed optical modulator drivers, and laser drivers. In an embodiment of the invention, the electrical functionality also comprises digital logic for interfacing with a host and controlling chip, A/D and D/A converters. Further functionality comprises voltage converters, passives such as inductors, capacitors, and resistors, for example, and ESD protection circuits.

In an embodiment of the invention, the "CW Laser In" block 101 comprises the optical source described with respect to FIGS. 2A-33. The optical components in FIG. 1B integrated on the CMOS chip may utilize the optical signal received from the CW Laser In 101 to generate modulated optical signals, via a Mach-Zehnder Interferometer modulator, for example, that may be transmitted over the optical fibers. The mode generated is suitable for transmission over single mode optical fiber.

Figure 1C:
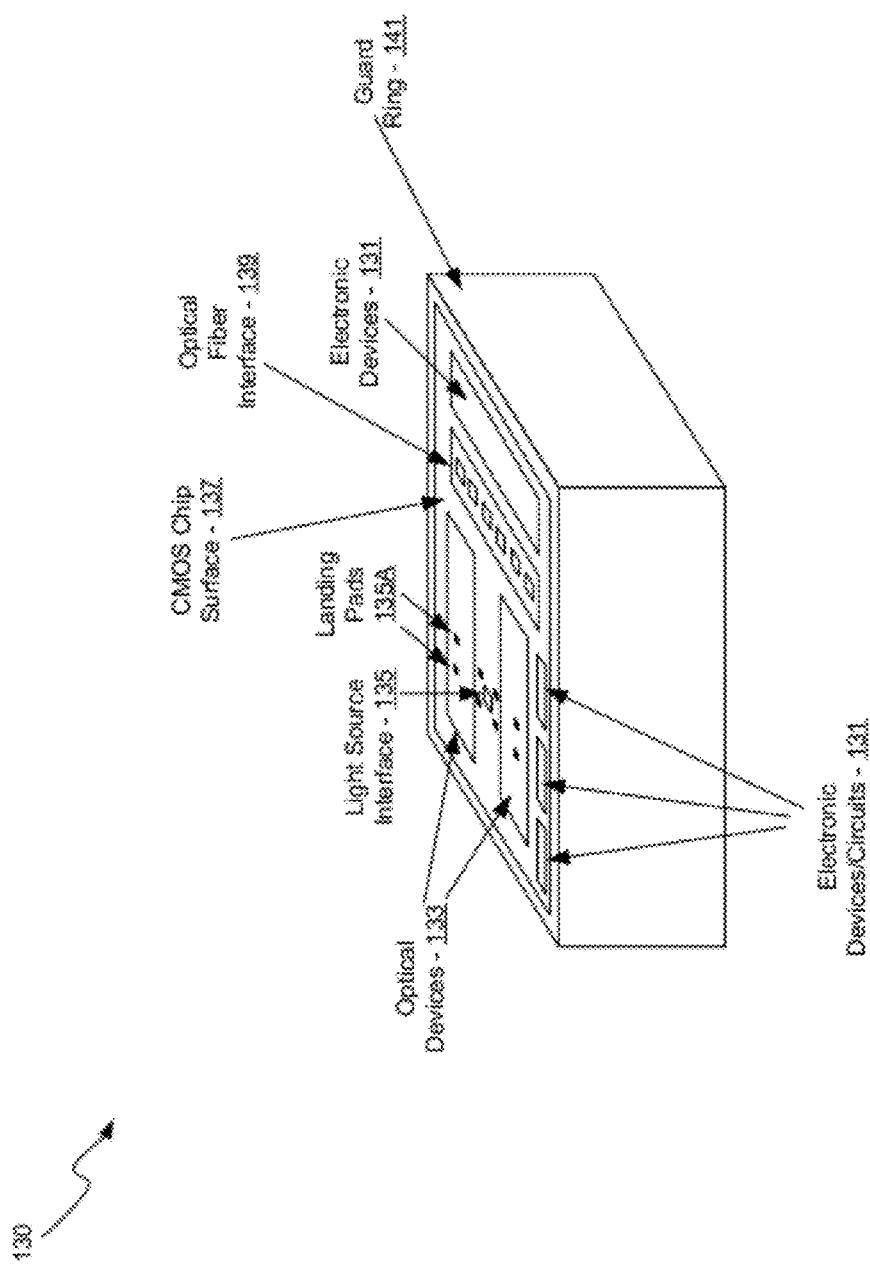
FIG. 1C is a block diagram of an exemplary photonically enabled CMOS chip with guard ring, in accordance with an embodiment of the invention.

FIG. 1C is a diagram illustrating an exemplary CMOS chip, in accordance with an embodiment of the invention. Referring to FIG. 1C, there is shown the CMOS chip 130 comprising electronic devices/circuits 131, optical and optoelectronic devices 133, a light source interface 135, CMOS chip surface 137, an optical fiber interface 139, and CMOS guard ring 141.

The light source interface 135 and the optical fiber interface 139 comprise grating couplers that enable coupling of light signals via the CMOS chip surface 137, as opposed to the edges of the chip as with conventional edge-emitting devices. Coupling light signals via the CMOS chip surface 137 enables the use of the CMOS guard ring 141 which protects the chip mechanically and prevents the entry of contaminants via the chip edge. The light source interface 135 may comprise the landing pads 135A with a thickness that may protect the CMOS chip surface 137 from contact that could damage the surface when affixing the light source to the CMOS chip 130. The landing pads 135A may be integrated into the CMOS chip 130, such as through a metal deposition, or may comprise post-CMOS processing polymer deposition and patterning, for example.

The optical fiber interface 139 may enable the coupling of one or more optical fibers to the CMOS chip 130, and may comprise grating couplers for near-vertical light coupling as compared to conventional systems which couple light through the chip edge, precluding the use of a guard ring. The light source interface may enable the coupling of an external light source to the CMOS chip, and may comprise a grating coupler, for example. An optical source, such as a laser diode in a light source module, for example, may couple an optical signal into the light source interface 135. The coupled light signal may be processed by the optical and electronics devices in the CMOS chip 130.

The electronic devices/circuits 131 comprise circuitry such as the TIA/LAs 107A-107D and the analog and digital control circuits 109 described with respect to FIG. 1A, for example. The optical and optoelectronic devices 133 comprise devices such as the taps 103A-103K, optical terminations 115A-115D, grating couplers 117A-117H, high speed optical modulators 105A-105D, high-speed photodiodes 111A-111D, and monitor photodiodes 113A-113H.

Figure 1D:
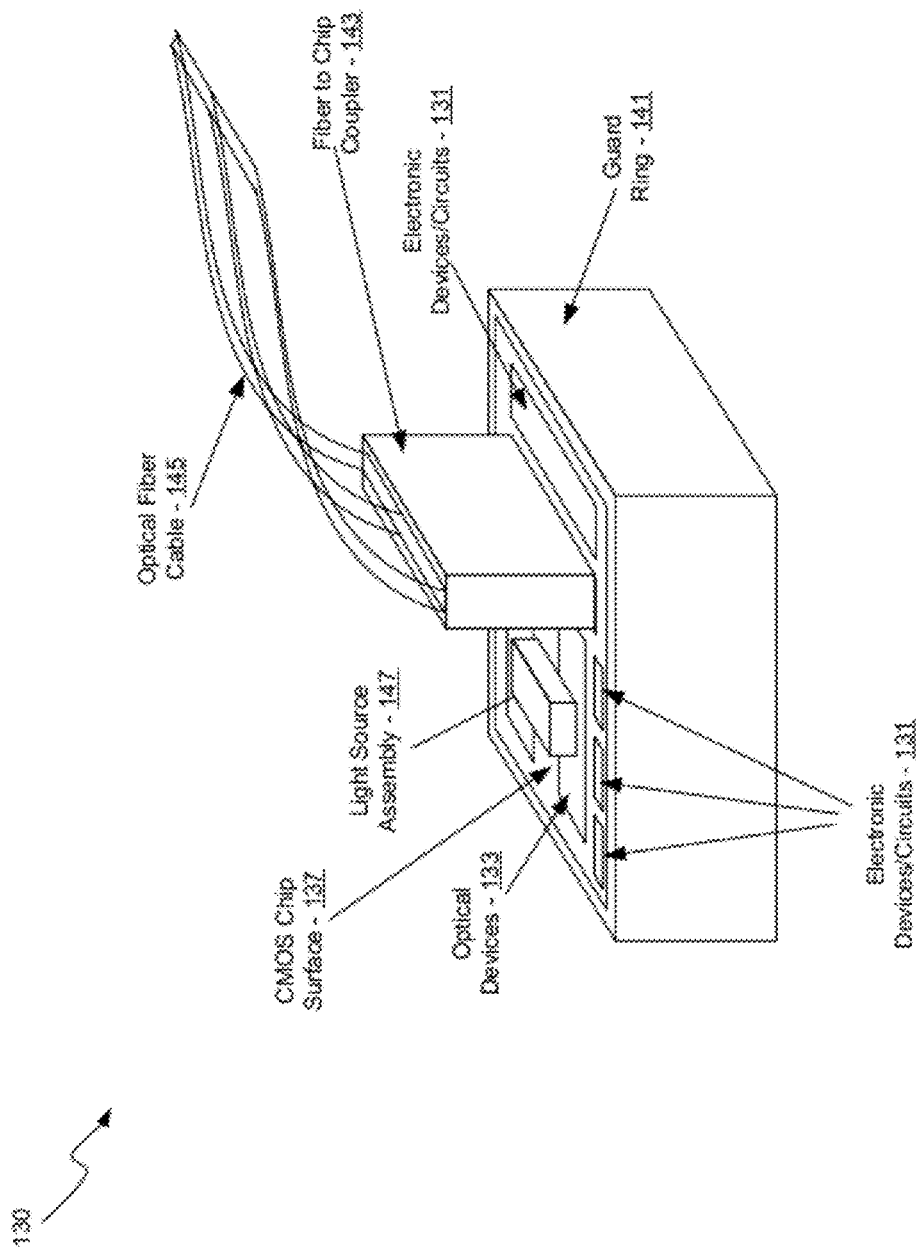
FIG. 1D is a block diagram of an exemplary photonically enabled CMOS chip with guard ring, light source, and optical fiber cable, in accordance with an embodiment of the invention.

FIG. 1D is a block diagram of an exemplary photonically enabled CMOS chip with guard ring, light source, and optical fiber cable, in accordance with an embodiment of the invention. Referring to FIG. 1D, there is shown the CMOS chip 130 comprising the electronic devices/circuits 131, the optical and optoelectronic devices 133, the light source interface 135, pads 135A, the CMOS chip surface 137, and the CMOS guard ring 141. There is also shown a fiber to chip coupler 143, an optical fiber cable 145, and a light source assembly 147.

The CMOS chip 130 comprising the electronic devices/ circuits 131, the optical and optoelectronic devices 133, the light source interface 135, the CMOS chip surface 137, and the CMOS guard ring 141 may be as described with respect to FIG. 1B.

In an embodiment of the invention, the optical fiber cable may be affixed, via adhesive for example, to the CMOS chip surface 137. The fiber to chip coupler 143 enables the physical coupling of the optical fiber cable 145 to the CMOS chip 130.

The light source assembly 147 may be affixed, via optically transmissive epoxy or solder, for example, to the CMOS chip surface 137, which may comprise landing pads 135A to protect the CMOS chip 130 from physical and electrical damage from excessive force or scratching, for example, during mounting of the assembly. In another embodiment of the invention, the light source assembly 147 may be soldered to contact pads on the CMOS chip 130 and then under filled or encapsulated to fill the space left between the structures and protect the optical path. In this manner a high power light source may be integrated with optoelectronic and electronic functionalities of one or more high-speed optoelectronic transceivers on a single CMOS chip.

The optical devices comprise MZI or ring modulators, waveguides, multiplexers, demultiplexers, splitters, taps, Y-junctions, directional couplers, and photodetectors, for example. The electronic devices comprise, TIA's, voltage regulators, driver circuits, control circuits, A/D and D/A converters, limiting amplifiers, and laser drivers, for example. The guard ring 141 may increase chip reliability by providing a barrier to contaminants diffusing into the edge of the chip and also reducing crack migration.

Light signals may be communicated from the light source assembly 147 to the CMOS chip 130 via the light source interface 135 and to and from the optical fibers in the optical fiber cable 145 via the optical fiber interface 139 in the CMOS chip 130. In an exemplary embodiment of the invention, the fiber to chip coupler 143 may be epoxied to the CMOS chip 130, and the light source assembly 147 may be soldered, wire bonded, flip-chip bonded, and/or epoxied to the CMOS chip 130, for example.

In an exemplary embodiment of the invention, the light source assembly 147 comprises an edge emitting compound semiconductor laser diode mounted on a support substrate. The compound semiconductor may comprise a plurality of layers of InP-based materials, such as GaInAsP, for example, and the support substrate may comprise Si or a suitable ceramic, for example. The support substrate may also comprise a reflective surface for directing the laser optical mode down into a grating coupler on the CMOS chip 130. In an exemplary embodiment of the invention, the reflective surface may be etched into the support substrate.

In another embodiment of the invention, the light source assembly 147 comprises an optical isolator comprising a faraday rotator and/or a half-wave plate and faraday rotator, depending on the polarization requirements as determined by the type, polarization, and physical configuration of the light source utilized. For example, a laser diode in a TO-can may be utilized, which may be physically rotated in the light source assembly eliminating the need for a half-wave rotator. Alternatively, in instances where an edge-emitting laser diode is utilized, rotation of the device may not be practical, thus a half-wave plate polarization rotator may be implemented.

The laser source in the light source assembly 147, may comprise a compound semiconductor laser diode, for example, and may emit light at a wavelength suitable for communication over an optical fiber, such as 1.3 or 1.55 microns, for example. The compound semiconductor laser may operate in continuous wave (CW) mode, with the modulation of the light signal performed by modulators integrated in the CMOS chip 130.

In another embodiment of the invention, the light source assembly 147 comprises a compound semiconductor surface emitting laser, such as a vertical cavity surface emitting laser (VCSEL) mounted on a support substrate. The VCSEL may comprise compound semiconductor materials, such as InP or GaAs-based materials, for example, and may emit light at a wavelength suitable for communication over an optical fiber, such as 1.3 or 1.55 microns, for example. The compound semiconductor laser may operate in continuous wave (CW) mode, with the modulation of the light signal performed by modulators integrated in the CMOS chip 130.

By integrating the optical functions within the CMOS chip 130, a single laser source may be utilized for a plurality of transmitting channels by splitting the source into multiple signals via splitters, for example. In this manner, a high power laser may be utilized without requiring high speed operation of the laser.

FIG. 2A is a block diagram of an exemplary micropackaged light source, in accordance with an embodiment of the invention. Referring to FIG. 2A, there is shown a hermetically sealed light source assembly which enables a small form factor with high coupling efficiency resulting in an improved link budget and more channels. A laser chip may generate light that may be focused via a micro-ball lens and pass through an isolator before being reflected down by the turning mirror. This may enable light to be directed down onto a CMOS chip into a grating coupler as shown in the right schematic. The turning mirror may be formed into a surface of the support block under the laser chip and the ball lens, or may be a discrete device placed on the support block. The micropackaged light source may be epoxied to the CMOS chip.

FIG. 2B is a light source assembly functional block diagram, a coupling geometry diagram, and a micrograph of a functioning grating coupler, in accordance with an embodiment of the invention. Referring to FIG. 2B, there is shown a functional block diagram of a light source assembly comprising a laser source, a lens, an isolator, a beam-folding element, and a grating coupler interface. The isolator comprises a faraday rotator or a half-wave and faraday rotator, depending on the polarization requirements as determined by the type, polarization, and physical configuration of the light source utilized.

The coupling geometry block diagram illustrates the optical path from the laser source to the CMOS die via a lens, isolator, and folding mirror. The light incident angle may range in angle from 1-60 degrees from normal, for example, to increase the coupling efficiency of light coupling into the grating coupler in the CMOS die.

The micrograph of a grating coupler demonstrates light being coupled into the coupler on the left, and light coupling out of the coupler on the right of the micrograph, demonstrating the two-way capability of the grating coupler used to couple the light source assembly.

Figure 2C:
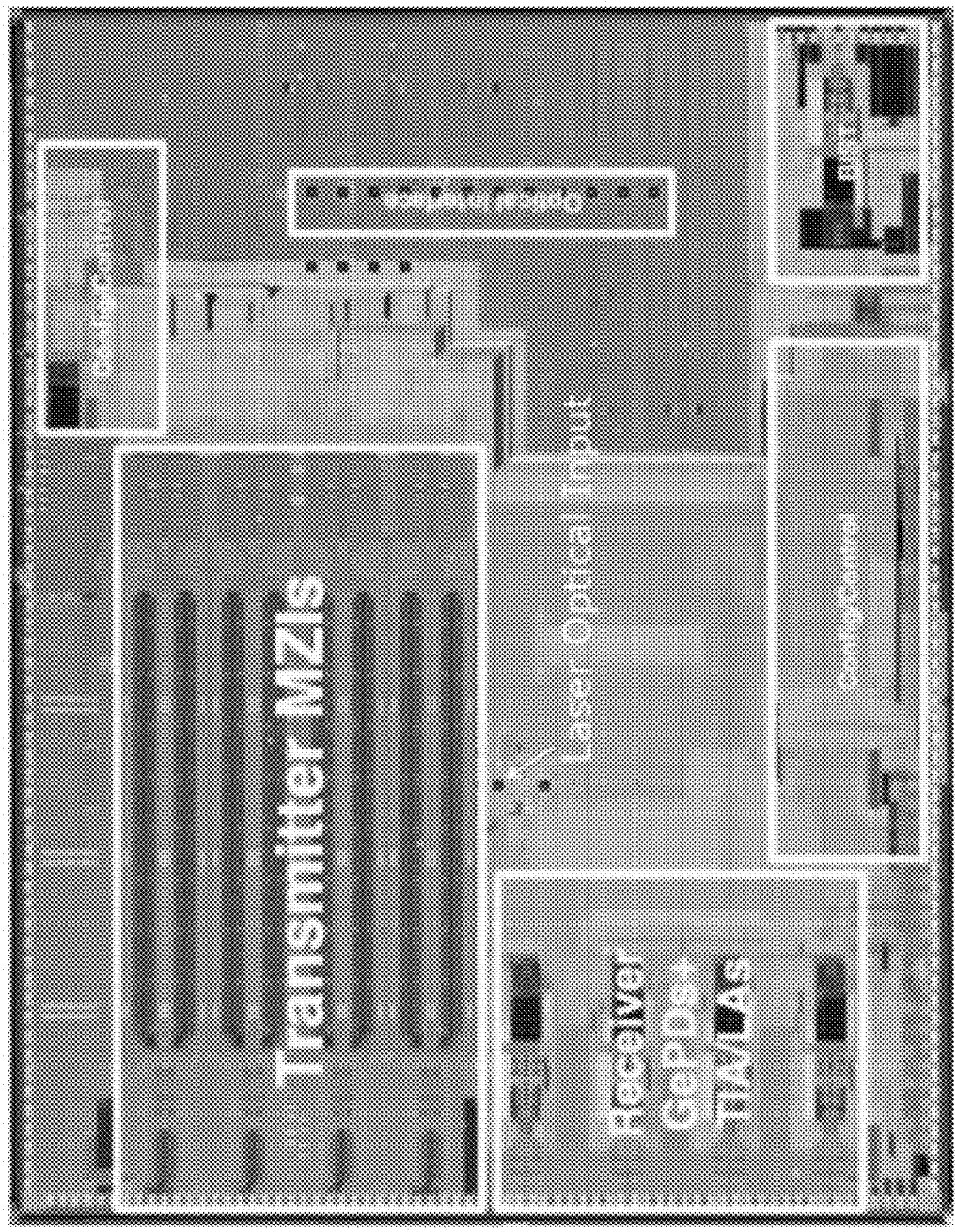
FIG. 2C is a block diagram of an exemplary photonically enabled CMOS chip, in accordance with an embodiment of the invention.

FIG. 2C is a block diagram of an exemplary photonically enabled CMOS chip, in accordance with an embodiment of the invention. Referring to FIG. 2C, there is shown a fabricated die illustrating an exemplary layout comprising transmitter MZIs, receiver, Ge photodiodes and associated electronics, configuration and control electronics, laser optical input, and optical interfaces.

The Laser Optical Input comprises a grating coupler and may be utilized to couple light into the CMOS chip from a light source assembly as described with respect to FIG. 2E.

FIG. 2D is a block diagram of an exemplary optical input/output, in accordance with an embodiment of the invention. Referring to FIG. 2D, there is shown a cross section and two scanning electron microscope (SEM) images of grating optical couplers. The grating couplers may couple light vertically into and out of the chip, and may couple light from various elements such as fibers, lasers, photodetectors, and planar lightwave chips. The grating couplers may utilize diffractive elements to couple light.

In an embodiment of the invention, the coupler cross section may illustrate the various layers of an exemplary grating coupler comprising a silicon substrate, a buried oxide layer, grating layers, and a dielectric stack. A waveguide may couple light into the coupler in the plane of the grating layer, for example. Loss coupling may be 1.5 dB or lower, for example, and may enable wafer-scale testing. In an embodiment of the invention, the grating coupler may enable 20× mode-size conversion laterally and longitudinally.

Vertical coupling of the light enables wafer-scale, known good die testing before dicing, utilization of a CMOS chip guard ring, which is not possible in conventional edge emitting configurations, and direct attachment of the laser module and optical fibers on the chip. Wafer-scale testing enables full optoelectronic probing at full data rate, and possible built-in self test to improve yield and reduce cost of testing. The self test comprises PRBS/error checker and optical loopback, which is not possible without the integration of the photonically enabled CMOS chip.

Figure 3A:
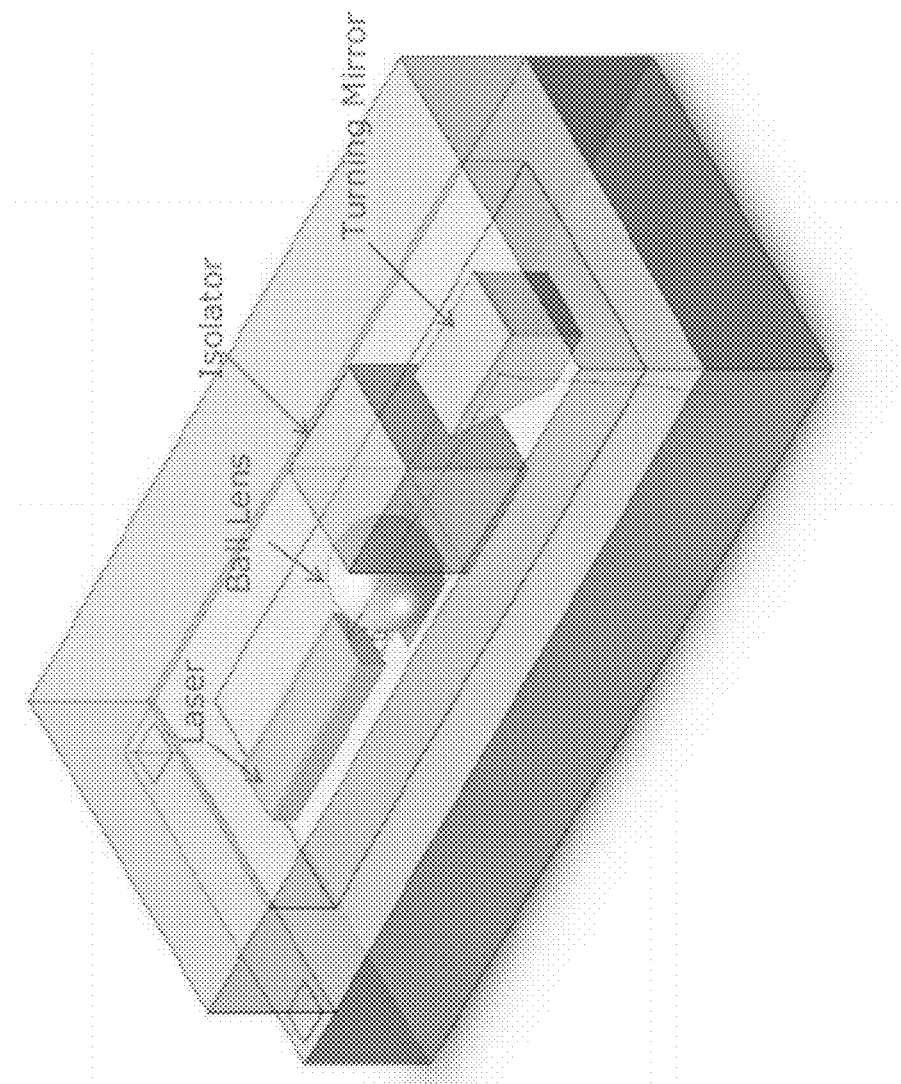
FIG. 3A is a schematic of a light source assembly comprising a laser, a ball lens, an isolator, and a turning mirror incorporated in a hermetically sealed package, in accordance with an embodiment of the invention.

FIG. 3A is a schematic of a light source assembly comprising a laser, a ball lens, an isolator, and a turning mirror incorporated in a hermetically sealed package, in accordance with an embodiment of the invention. Each device comprises a discrete device and may be affixed to a support substrate comprising silicon or a ceramic material, for example. Utilizing silicon substrates enables the utilization of semiconductor photolithography and etching techniques to define features for affixing various devices such as the ball lens or laser diode, for example.

The turning mirror may be a discrete device, or alternatively, may be fabricated directly in the substrate, for example. Etched surfaces in crystalline surfaces may be utilized for reflective surfaces.

The light source assembly may be hermetically sealed via a lid affixed via solder, epoxy, or glass frit, for example. Hermetic sealing of the light source assembly may increase device lifetime by reducing or eliminating environmental effects on the optical elements in the assembly.

Figure 3B:
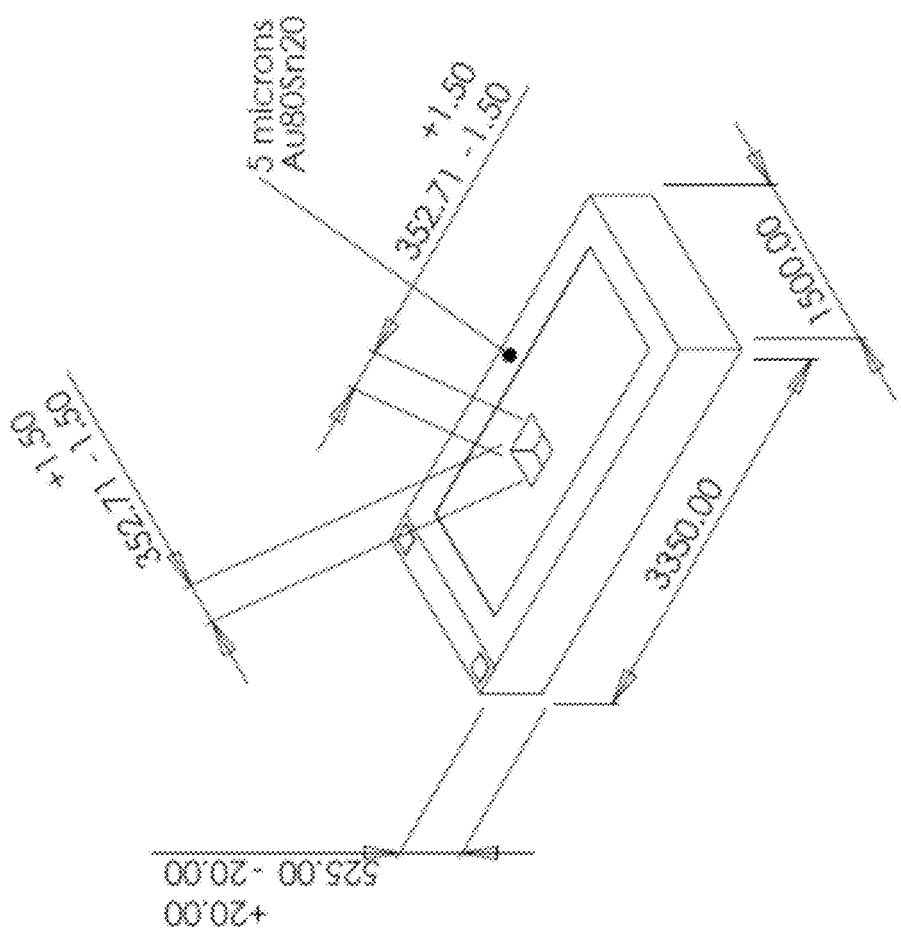
FIG. 3B is a block diagram of a support substrate with exemplary dimensions, in accordance with an embodiment of the invention.

FIG. 3B is a block diagram of a support substrate with exemplary dimensions, in accordance with an embodiment of the invention. The square hole near the center may be utilized to place a ball lens, and the solder deposited around the outer edge of the substrate or mating lid part may be utilized as a solder line for hermetically sealing a lid as described with respect to FIG. 3A. The two square pads on the left side of the top surface of the substrate may be utilized for bond pads enabling electrical connection to devices integrated on the substrate, for example.

Figure 3C:
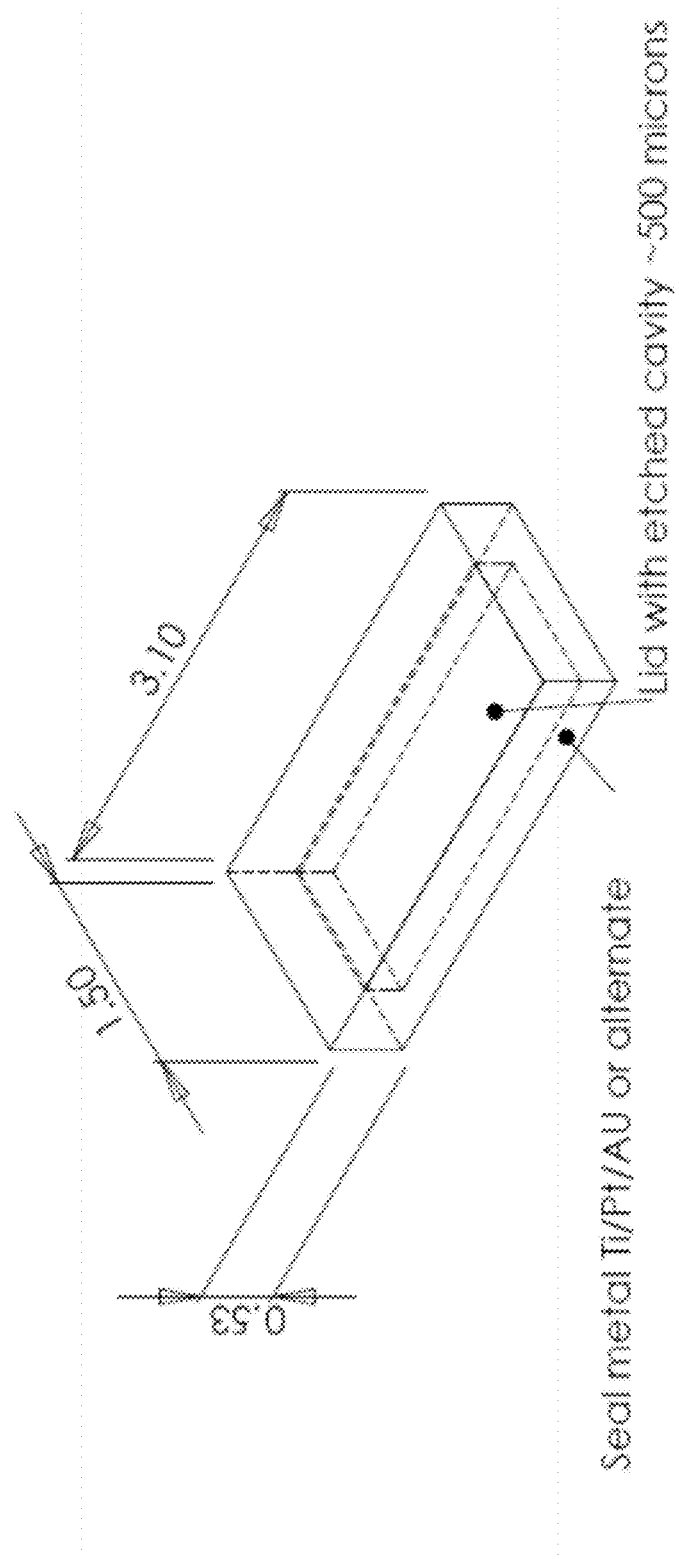
FIG. 3C is a block diagram of a lid for hermetic sealing of the light source assembly, in accordance with an embodiment of the invention.

FIG. 3C is a block diagram of a lid for hermetic sealing of the light source assembly, in accordance with an embodiment of the invention. The lid may be etched to result in a cavity to allow for increased volume within the light source assembly. The lid may be affixed via epoxy, solder, or glass frit, for example, to the substrate to enable hermetic sealing.

Figure 3D:
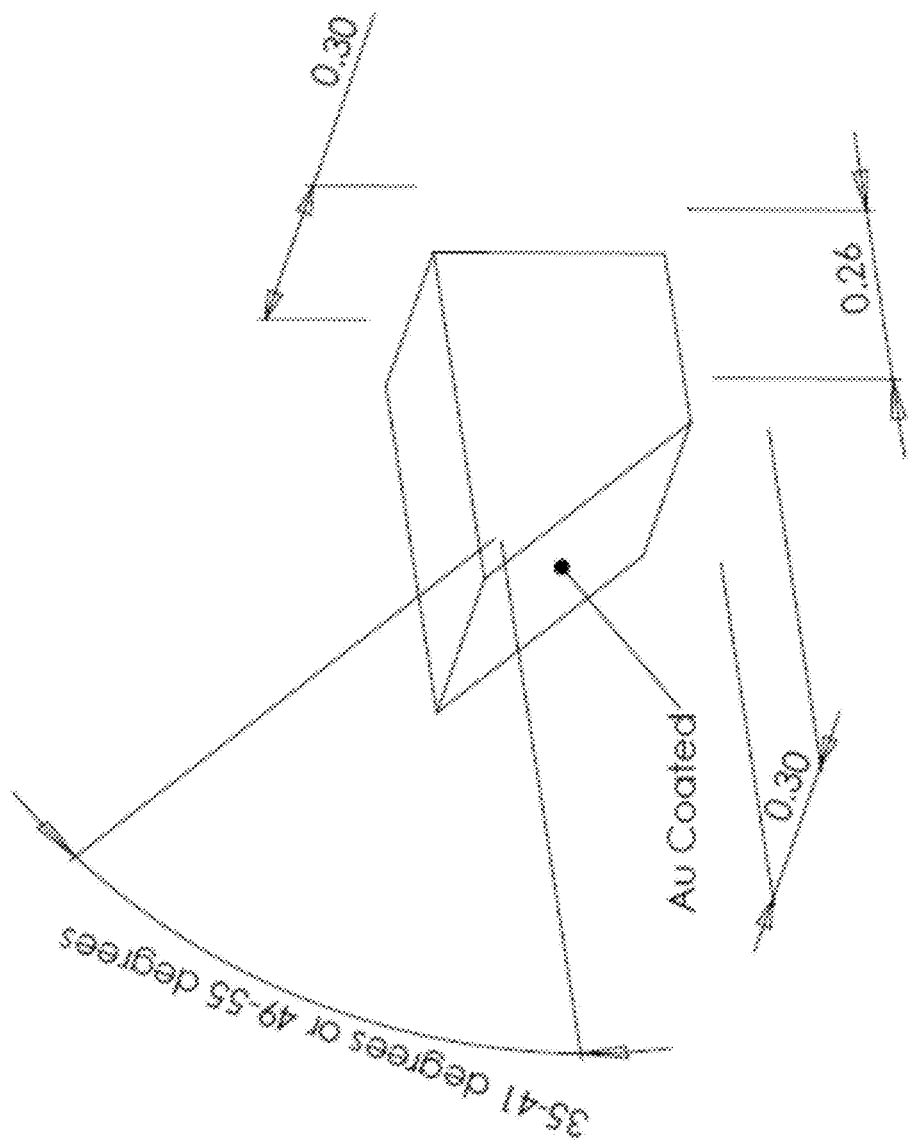
FIG. 3D is a block diagram of a turning mirror, in accordance with an embodiment of the invention.

FIG. 3D is a block diagram of a turning mirror, in accordance with an embodiment of the invention. Referring to FIG. 3D, there is shown a turning mirror with an angled reflective surface that may enable directing an optical signal down into a CMOS chip from an adjacent laser diode. The angle of the reflective surface may be configured for optimum coupling of the optical signal into a grating coupler in the CMOS chip. The turning mirror comprises an etched silicon block, or gold coated glass, for example.

Figure 3E:
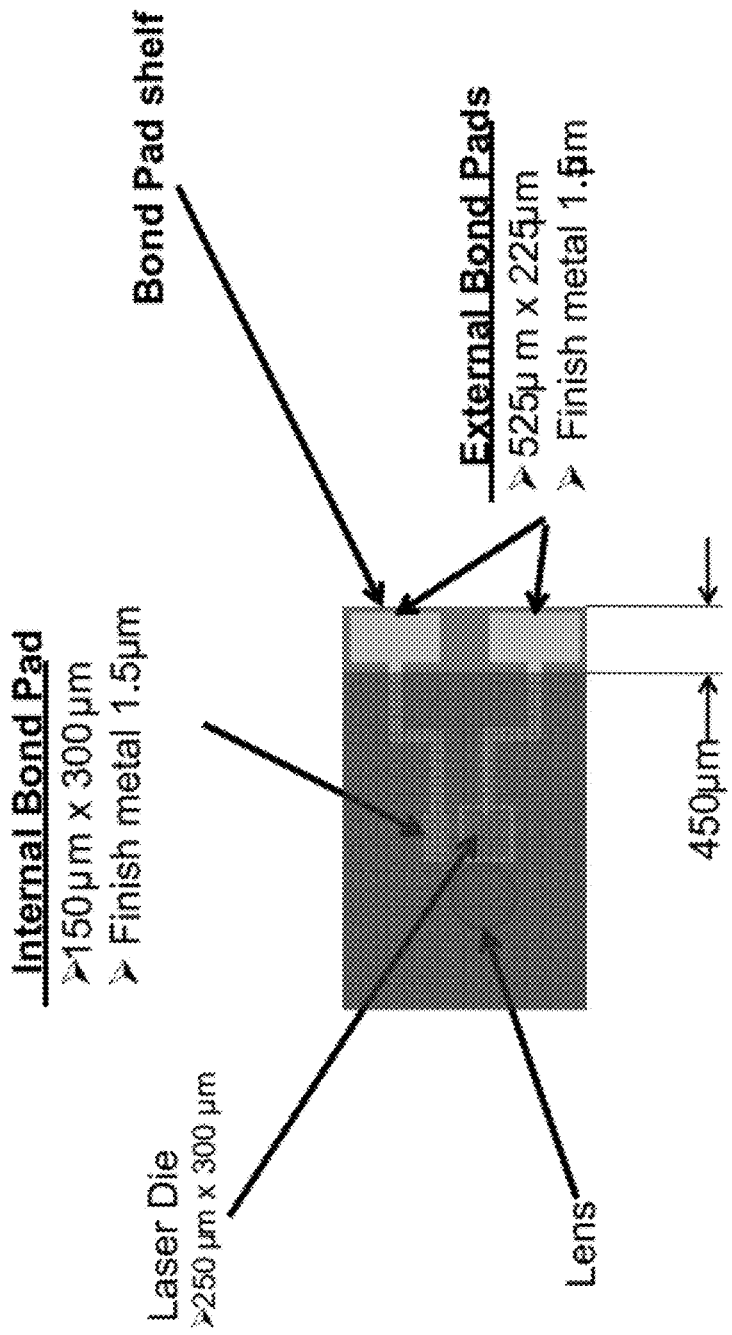
FIG. 3E is a block diagram illustrating an exemplary bond pad configuration, in accordance with an embodiment of the invention.

FIG. 3E is a block diagram illustrating an exemplary bond pad configuration, in accordance with an embodiment of the invention. Referring to FIG. 3E, there is shown a light source assembly substrate with attached ball lens, laser diode, and electrical bond pads. The bond pads may enable electrical connection to the laser diode, for example.

Figure 3F:
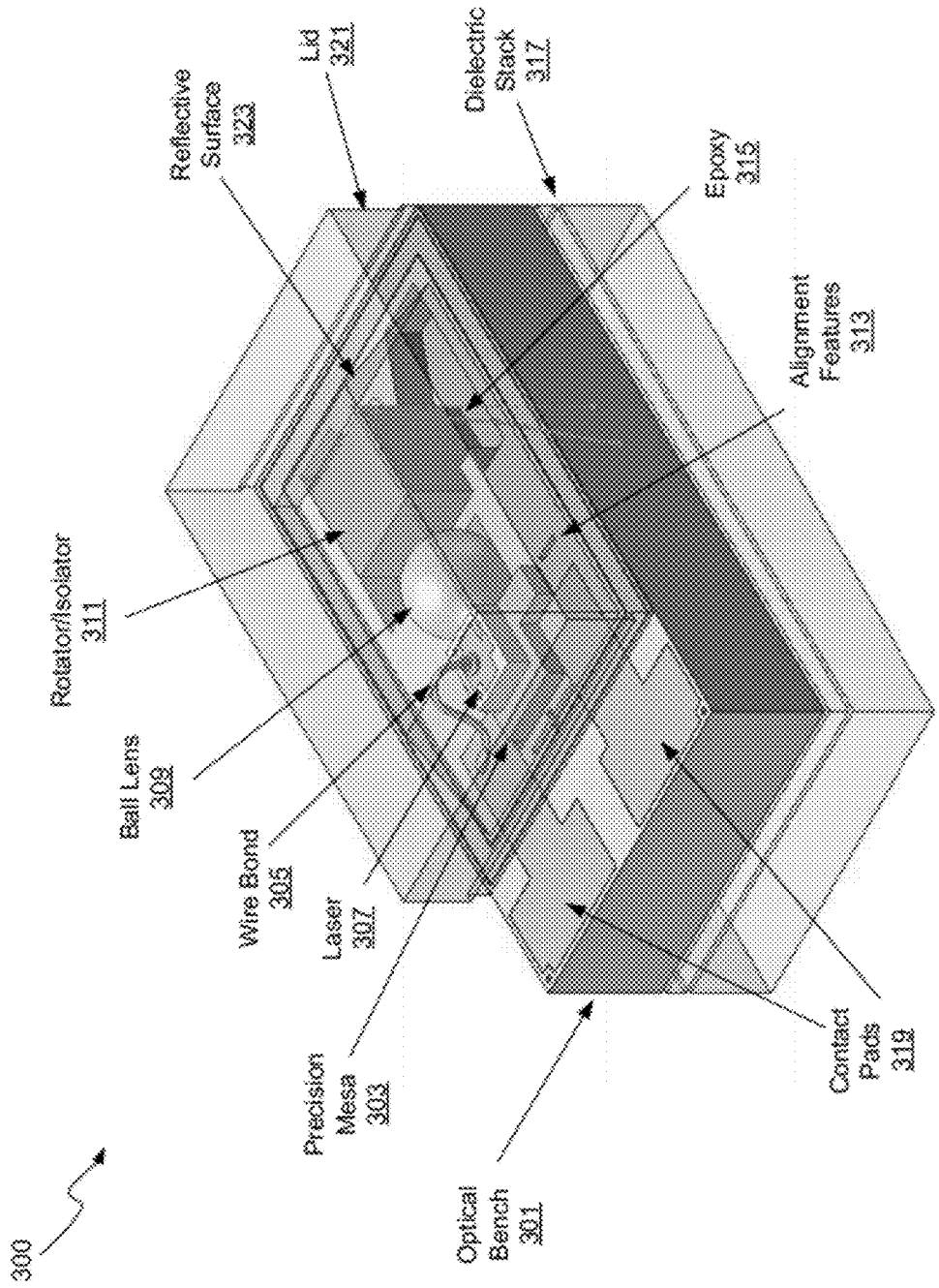
FIG. 3F is a diagram of an exemplary light source assembly, in accordance with an embodiment of the invention.

FIG. 3F is a diagram of an exemplary light source assembly, in accordance with an embodiment of the invention. Referring to FIG. 3F, there is shown an light source assembly 300 comprising an optical bench 301, a precision mesa 303, a wire bond 305, a laser 307, a rotator/isolator 311, alignment features 313, epoxy 315, a dielectric stack 317, contact pads 319, a lid 321, and a reflective surface 323.

The optical bench 301 may comprise a silicon optical bench, for example, and may comprise a micro-machined silicon substrate that may be configured to support optical, electrical, and/or optoelectronic devices enabling accurate alignment of devices. Utilizing a micro-machined silicon substrate for the optical bench 301 enables the use of anisotropic etch techniques to define features in the substrate, such as the alignment features 313 or openings for the ball lens 309 or the rotator/isolator 311.

The precision mesa 303 may comprise an insulating material with an accurate thickness for placement on the optical bench 301, enabling accurate alignment of the laser 307 with respect to other devices on the optical bench 301, such as the ball lens 309.

The wire bond 305 may comprise a metal or other conductive material, gold for example, that may provide an electrical connection between the laser 307 and the contact pads 319.

The laser 307 may comprise a semiconductor laser diode, for example, and may be coupled epi-side down to the precision mesa 303. The laser 307 may emit light at a wavelength that corresponds to the appropriate wavelength of light for the optical transceivers integrated in the CMOS chip 130 and the optical fiber cable 145 described with respect to FIGS. 1B-1D.

The utilization of the precision mesa 303 and bonding the laser 307 epi-side down enables accurate height control of the optical signal from the laser 307 with the ball lens 309. In addition, the laser 307 mounted epi-side down allows for better heat transfer to the large thermal mass of the laser 307 substrate as well as into the precision mesa 303.

The ball lens 309 may comprise a microlens fabricated from an optical material formed in the shape of a sphere, for example, that may enable the focusing of the optical signal generated by the laser 307 to a desired device, such as the rotator/isolator 311.

The rotator/isolator 311 may comprise reciprocal and/or non-reciprocal polarization rotation capability that enables rotation of the polarization vector of the optical beam generated by the laser 307. The non-reciprocal capability of the rotator/isolator 311 may comprise a faraday rotator. In addition, if a faraday rotator is utilized for isolation, the resulting optical mode may not be perpendicular to the plane of incidence at the CMOS chip 130, thus resulting in poor coupling efficiency. This may be corrected by adding a half-wave rotator, which may be integrated in the dielectric stack 317, for example. The combination of a faraday rotator and a half-wave plate results in the desired polarization, TE polarized in the short dimension of the grating coupler, illustrated in FIG. 2D and 22-26, at the surface of the CMOS chip 130 for optimum coupling efficiency.

The rotator/isolator 311 may be an optional component between the ball lens 309 and the reflective surface 323, as the polarization rotation may be enabled entirely by the dielectric stack 317 or the grating coupler in the CMOS chip 130 may be polarization independent, for example. The rotator/isolator 311 may reduce and/or eliminate optical feedback to the laser 307 by rotating any reflected optical signal another 45 degrees for a total of 90 degrees from the optical mode emitted by the laser 307 to reduce and/or eliminate feedback effects. In instances where a feedback insensitive laser is utilized for the laser 307, the isolation function provided by a non-reciprocal polarization rotator in the rotator/isolator 311 may not be required.

In addition to improved coupling efficiency, the rotator/isolator 311 and a half-wave rotator integrated in the dielectric stack 317 may provide isolation from reflected optical signals to the laser 307. If no isolation is utilized, a feedback insensitive laser may be required, which may significantly increase cost.

The alignment features 313 comprise micro-machined features in the optical bench 301 and may enable proper alignment of the light source assembly 300 to the CMOS chip 130.

The dielectric stack 317 may comprise pyrex or other glass layer, a quartz and/or half-wave plate, and a fabricated support substrate. The half-wave plate may comprise single-crystal quartz, sapphire, or other birefringent material, and may enable the desired optical polarization at the surface of the CMOS chip 130, which may be coupled below the dielectric stack 317.

The contact pads 319 may enable external electrical coupling to the laser 307 via the wire bond 305. The lid 321 may be affixed via epoxy, solder, or glass frit, for example, to the optical bench 301 to enable hermetic sealing of the optical component space for improved lifetime. The reflective surface 323 may be fabricated into the lid 321, or may comprise a separate optical component mounted to the optical bench 301, and may be operable to reflect the optical signal down towards the CMOS chip 130 mounted below the optical bench 301. In an embodiment of the invention, the reflective surface 321 may be anisotropically etched in the lid 321.

In operation, a bias voltage may be coupled to the laser 307 via the contact pads 319 and the wire bond 305. An optical signal may be generated by the laser 307 that may be focused onto the rotator/isolator 311 via the ball lens 309. The rotator/isolator 311 may rotate the polarization of the optical signal before the signal is reflected downward by the reflective surface 323. The polarization may be further rotated by a half-wave plate integrated in the dielectric stack 317 to configure the polarization to that of grating couplers integrated in the CMOS chip 130, such as the light source interface 135, described with respect to FIG. 1C. The optical signal communicated to the CMOS chip 130 may then be utilized to communicate signals over the optical cable fiber 145 after processing by optoelectronic devices in the CMOS chip 130.

Figure 3G:
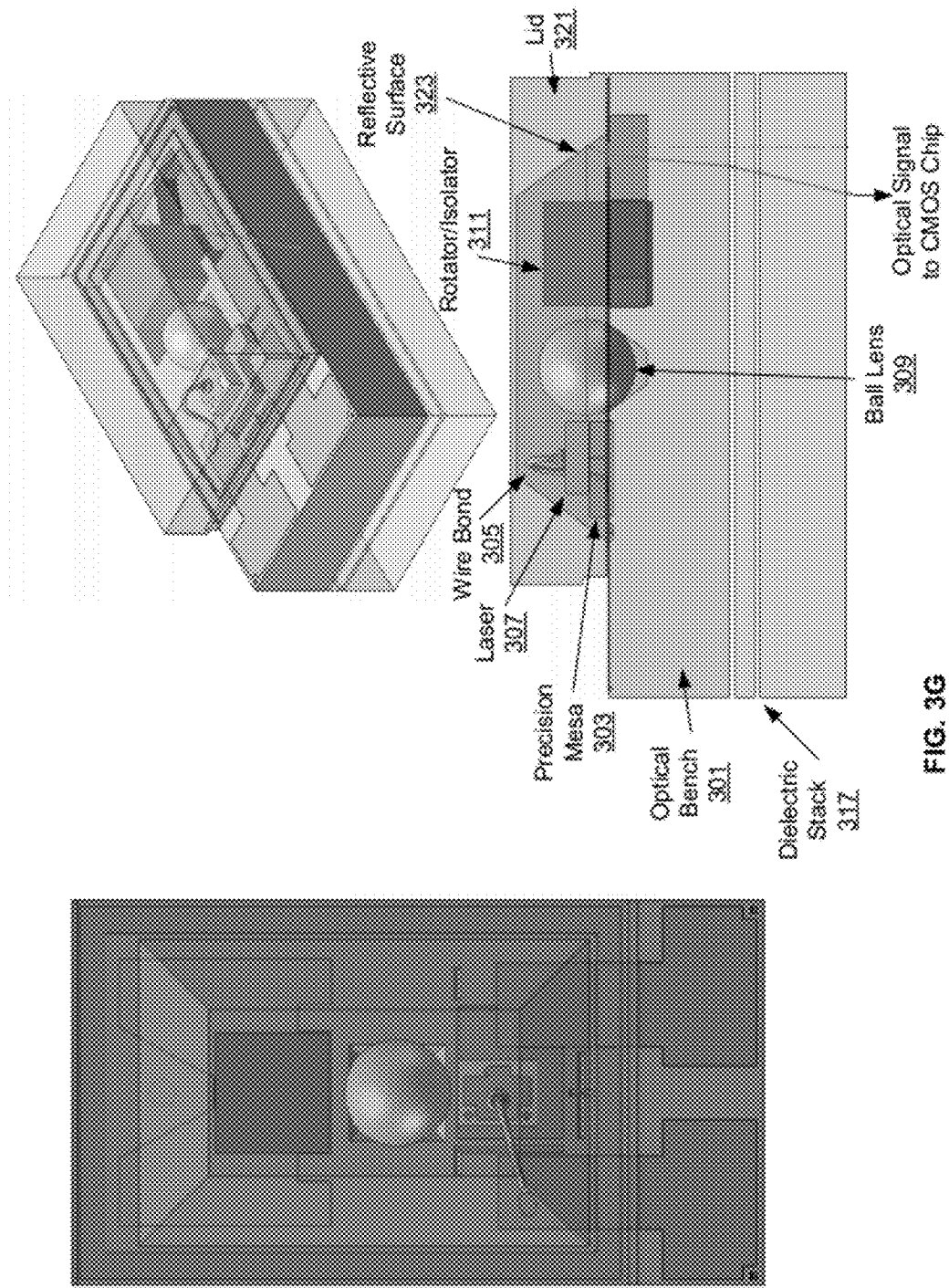
FIG. 3G is a diagram illustrating various views of the light source assembly, in accordance with an embodiment of the invention.

FIG. 3G is a diagram illustrating various views of the light source assembly, in accordance with an embodiment of the invention. The placement of the laser 307, the precision mesa 303, the ball lens 309, and the rotator/isolator 311 is shown in the various views. In the bottom right figure, the optical beam path is visible, including the angle from normal incidence at the CMOS chip interface at the bottom of the dielectric stack 317.

Figure 3H:
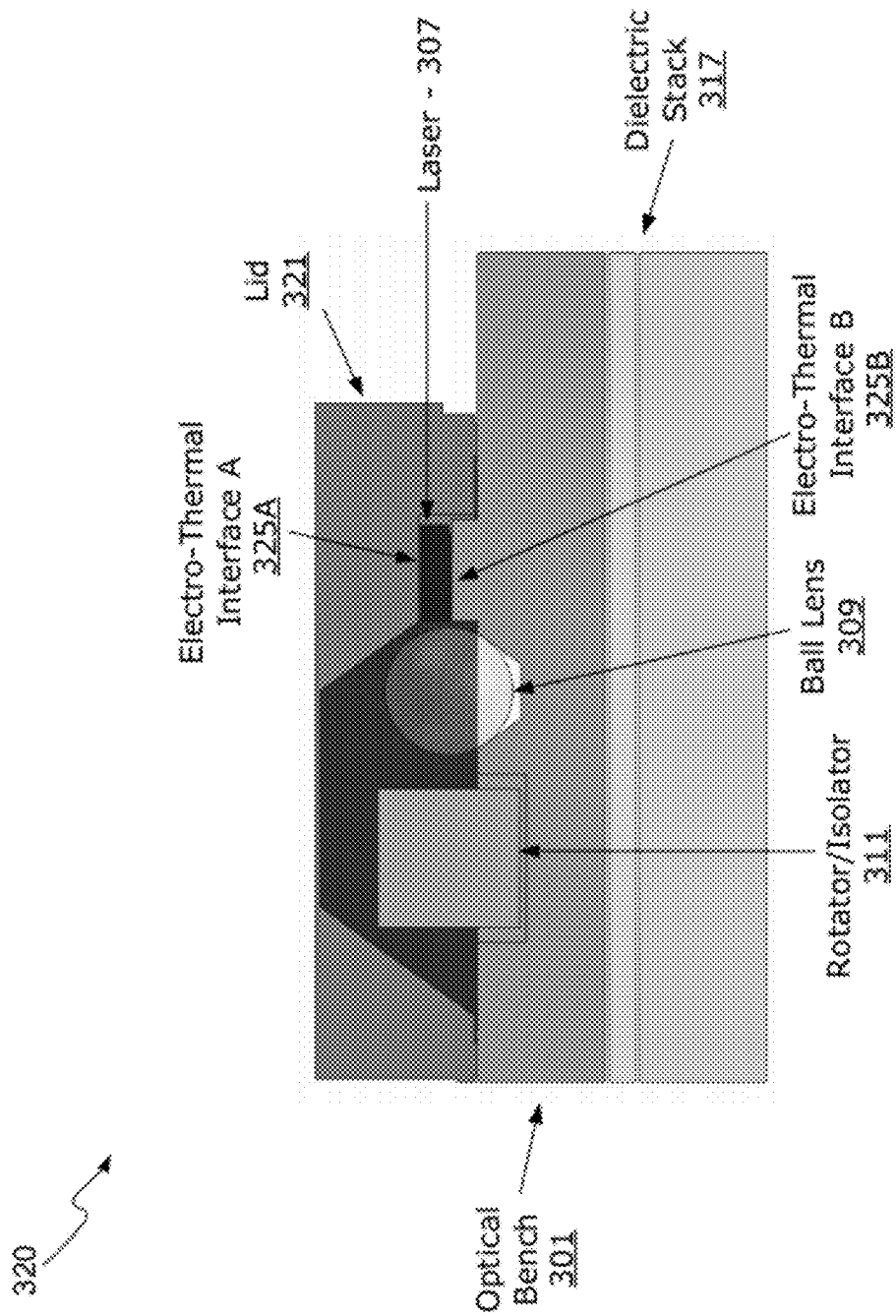
FIG. 3H illustrates an exemplary light source module, in accordance with an embodiment of the invention.

FIG. 3H illustrates an exemplary light source module, in accordance with an embodiment of the invention. Referring to FIG. 3H, there is shown a light source module 320 comprising the laser 307 mounted between the optical bench 301 and the lid 321 together with the ball lens 309 and the rotator/isolator 311 which may comprise an optical-isolator element. The laser 307 may comprise an edge emitting compound semiconductor laser diode comprising a plurality of layers of InP-based materials, such as GaInAsP, for example. The optical bench 301 may comprise Si or a suitable ceramic, or various laminated materials (i.e. glass, quartz, etc.) for example.

The optical bench 301 may also comprise a reflective surface for directing the laser optical mode down into a grating coupler on the CMOS chip 130. In an exemplary embodiment of the invention, the reflective surface may be etched into the optical bench 301. In this embodiment the lid forms one-half of the package cavity whilst making electrical and thermal contacts to the laser 307. The laser 307 may be bonded to the optical bench 301 and or lid 321 using a solder or other interface material with desirable electrical and thermal properties. If the laser 307 has it contacts on opposite sides of the chip then both the lid-to-laser interfaces (Electro-Thermal Interface A—325A) and base-to-laser (Electro-Thermal Interface B—325B) may serve as electrical and thermal contacts to the laser 307. By placing both sides of the laser 307 in intimate thermal contact with the large thermal masses such as the lid 321 and the optical bench 301, the thermal resistance to the laser 307 active area is reduced and the performance of the device is improved by reducing the self-heating effect.

FIG. 3I illustrates an exemplary light source module with landing pads, in accordance with an embodiment of the invention. The landing pads 135A may comprise metal or polymer pads, for example, that may provide protection from physical, and subsequent electrical, damage to the CMOS chip 130 from the light source assembly 300 coupling process. A transparent adhesive may be utilized to affix the light source assembly 300 to the CMOS chip 130.

Figure 3J:
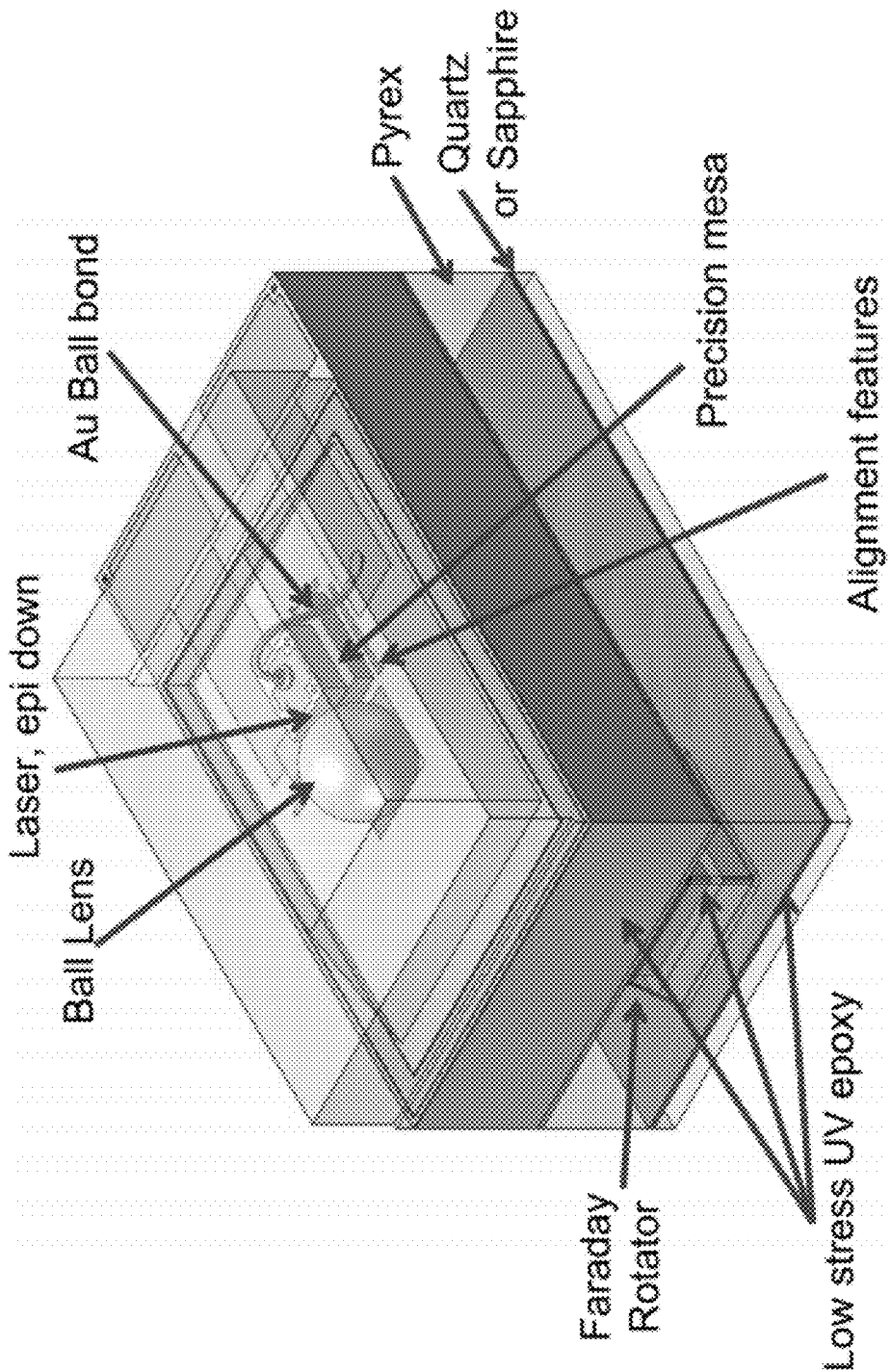
FIG. 3J illustrates an alternative embodiment of the light source assembly where the faraday rotator is encased within pyrex and quartz or sapphire layers below the silicon substrate.

FIG. 3J illustrates an alternative embodiment of the light source assembly where the faraday rotator is encased within pyrex and quartz or sapphire layers below the silicon substrate. The laser diode may be mounted epi-side down on a precision mesa to enable accurate alignment with the ball lens. The various layers, such as the silicon substrate, the pyrex, and the quartz or sapphire layers, may be joined or bonded via a low stress UV epoxy, such as Dymax OP29, for example.

FIG. 3K is a diagram illustrating various views of the light source assembly, in accordance with an embodiment of the invention. The placement of the laser diode, the precision mesa, the ball lens, and the faraday rotator is shown in the various views. In the bottom right figure, the optical beam path is visible, including the angle from normal incidence at the CMOS chip interface at the bottom of the pyrex layer via the embedded faraday rotator.

Figure 4A:
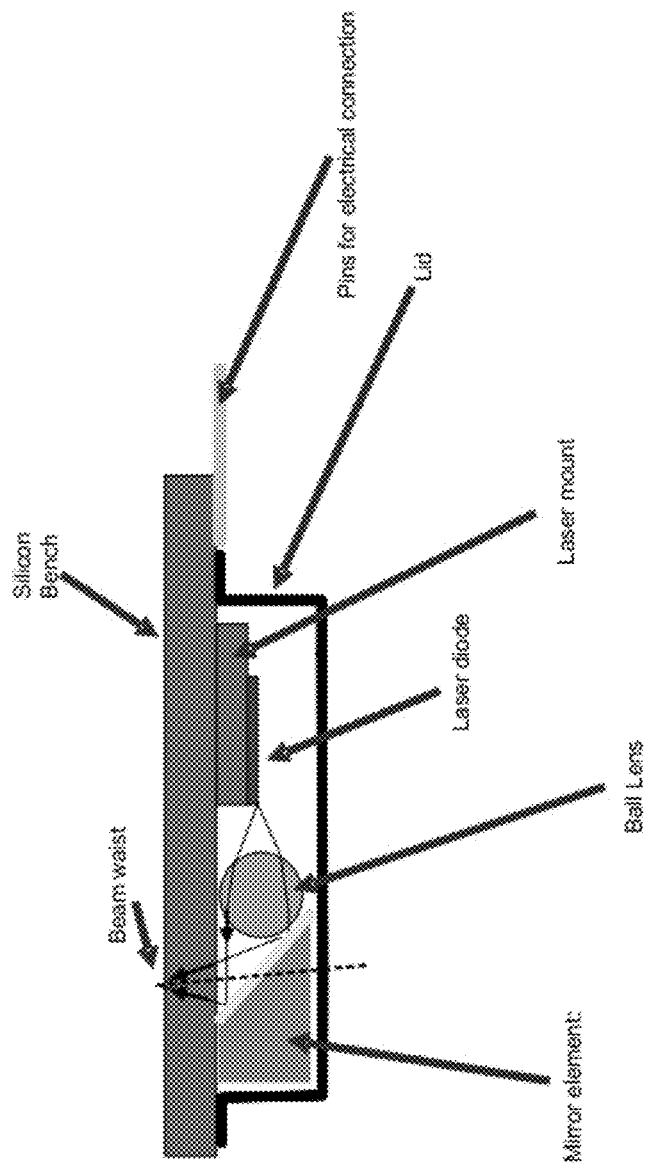
FIG. 4A is a diagram illustrating an alternative embodiment of a light source assembly, in accordance with an embodiment of the invention.

FIG. 4A is a diagram illustrating an alternative embodiment of a light source assembly, in accordance with an embodiment of the invention. Referring to FIG. 4A, there is shown a silicon bench or substrate, an attached laser mount, a laser diode, a ball lens, a mirror element, a lid, and pins for electrical connection.

The silicon bench may be polished on both sides and comprises an AR coating to air on the cavity side and AR coating to glass or epoxy on the side outside the cavity. The silicon bench comprises patterned interconnections for the laser diode, and comprises pins for electrical connection to electrical circuitry, such as on the CMOS chip to which the light source assembly is affixed.

The lid may enable hermetic sealing of the cavity and comprises silicon or metal, for example. The laser mount provides better or equal heat conduction than silicon to enable proper heat sinking for the laser diode, which may be soldered or epoxied utilizing electro-thermal adhesive, such as silver epoxy, to the mount. The laser mount comprises a pedestal etched in silicon, for example.

The ball lens comprises a high index optical material, such as glass, sapphire, or a gemstone material, for example, and may be 1 mm in radius or less, for example. The placement of the ball lens may be defined by structures etched into the silicon bench.

The mirror element comprises a reflective surface that may enable coupling light nearly vertically out of the light source assembly as oriented in the figure. The optical signal may range in angle from 1-60 degrees from normal, for example, to optimize coupling efficiency to a grating coupler in the CMOS chip. The optical mode comprises a beam waist approximately 50 microns above the surface of the silicon bench to coincide with grating coupler structures in the CMOS chip.

Figure 4B:
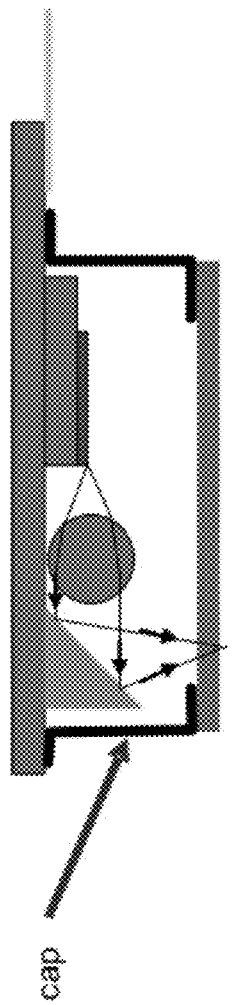
FIG. 4B is a diagram illustrating an alternative embodiment of a light source assembly, in accordance with an embodiment of the invention.

FIG. 4B is a diagram illustrating an alternative embodiment of a light source assembly, in accordance with an embodiment of the invention. Referring to FIG. 4B, there is shown a silicon bench or substrate, an attached laser mount, a laser diode, a ball lens, a mirror element, a cap and lid, and pins for electrical connection. The components are substantially similar to those described with respect to FIG. 4A, but with an inverted orientation. Accordingly, the light emitting horizontally from the laser diode and into the ball lens reflects off the turning mirror and down through the transparent lid into a CMOS chip. The cap may comprise a walled cavity that enables hermetic sealing of the optical components to improve device lifetime. In this manner, the laser diode may be accessed from the top for thermal control—i.e. heatsinking away from the CMOS chip.

Figure 4C:
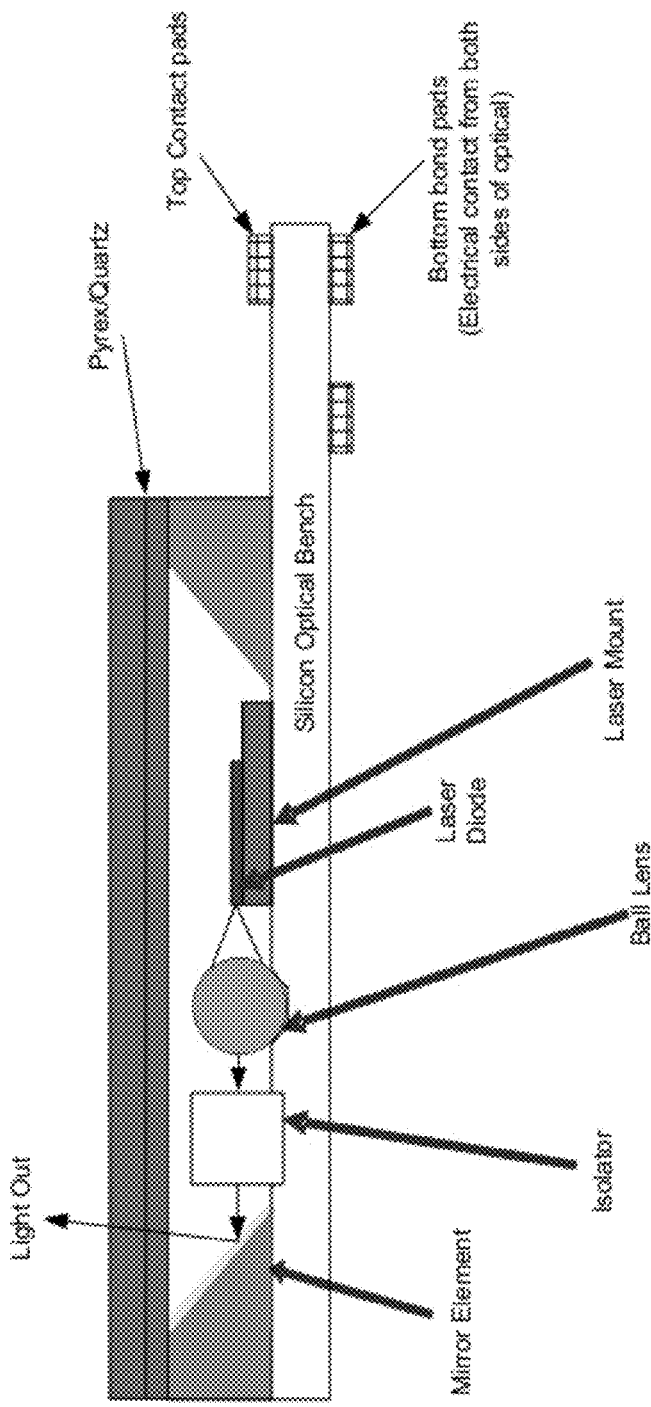
FIG. 4C is a diagram illustrating an alternative embodiment of a light source assembly, in accordance with an embodiment of the invention.

FIG. 4C is a diagram illustrating an alternative embodiment of a light source assembly, in accordance with an embodiment of the invention. Referring to FIG. 4C, there is shown a silicon optical bench, an attached laser mount, a laser diode, a ball lens, an isolator or faraday rotator, a mirror element, a pyrex/quartz stack lid, and bond pads for electrical connection. The lid comprises a pyrex/quartz stack which may be orientated either way, with the pyrex or the quartz on top, and enables hermetic sealing of the optical components to improve device lifetime. This embodiment with the electrical and optical interface on the same side of the wafer allows wafer-scale fiber coupling testing of the laser package. The bottom side pad facilitates wire bonding after attachment to the CMOS die. A membrane may be incorporated into the silicon bench as shown in FIG. 4E or alternately one or more thermistors may be fabricated in the package as a hermeticity sensor.

Figure 4D:
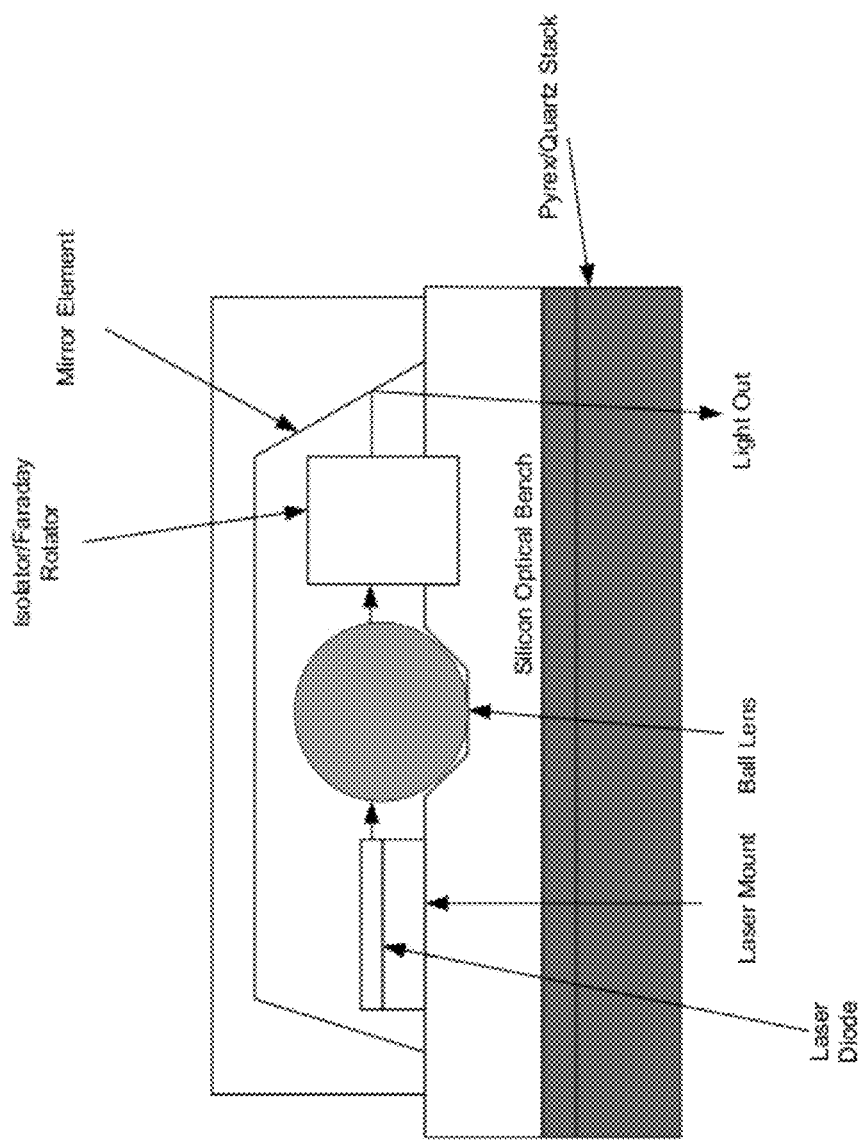
FIG. 4D is a diagram illustrating an alternative embodiment of a light source assembly, in accordance with an embodiment of the invention.

FIG. 4D is a diagram illustrating an alternative embodiment of a light source assembly, in accordance with an embodiment of the invention. Referring to FIG. 4D, there is shown a silicon bench, an attached laser mount, a laser diode, a ball lens, an isolator or faraday rotator, a mirror element, a pyrex/quartz stack lid, and bond pads for electrical connection. The pyrex/quartz stack may be orientated either way, with the pyrex or the quartz on top, and enables optical mode polarization rotation.

Figure 4E:
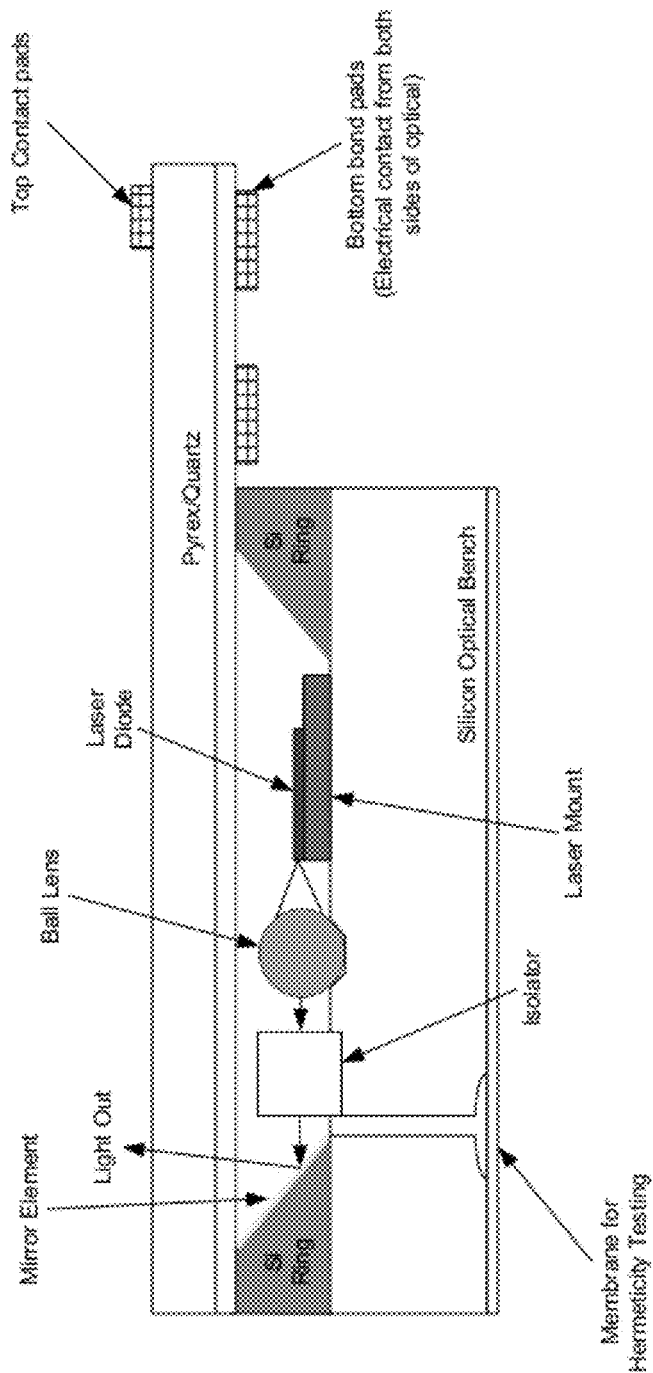
FIG. 4E is a diagram illustrating an alternative embodiment of a light source assembly, in accordance with an embodiment of the invention.

FIG. 4E is a diagram illustrating an alternative embodiment of an light source assembly, in accordance with an embodiment of the invention. Referring to FIG. 4E, there is shown a silicon optical bench, an attached laser mount, a laser diode, a ball lens, an isolator or faraday rotator, a mirror element formed on a silicon ring, a pyrex/quartz stack lid, and bond pads for electrical connection. By utilizing bond pads on both sides of the lid, electrical and optical testing of the laser source may be enabled prior to affixing the assembly to the CMOS chip. In an embodiment of the invention, the topside electrical pad can be placed in the dicing lanes on the wafer and diced away as part of the singulation process leaving the bottom contact pad for wire bonding after attach to the CMOS die. A membrane may be incorporated into the silicon bench as shown or alternately one or more thermistors may be fabricated in the package as a hermeticity sensor.

The lid comprises a pyrex/quartz stack which may be orientated either way, with the pyrex or the quartz on top, and enables hermetic sealing of the optical components to improve device lifetime. The silicon ring comprises a silicon substrate that may be etched and coated to generate angled surfaces that may form mirror elements. A via may be etched through the substrate to provide hermeticity testing via deflection of a membrane placed over the via.

FIG. 5 illustrates a TO-can implementation, in accordance with an embodiment of the invention. Referring to FIG. 5, there is shown an image of exemplary laser diode TO-cans and a cross-section of an exemplary TO-can with tilted optical window. The window may be tilted to enable the desired angle of incidence of the emitted light to the grating coupler in the CMOS chip, for example.

The spacer enables the distance between the laser diode and the grating coupler in the CMOS chip to be defined such that the beam waist location optimizes coupling efficiency.

Figure 6A:
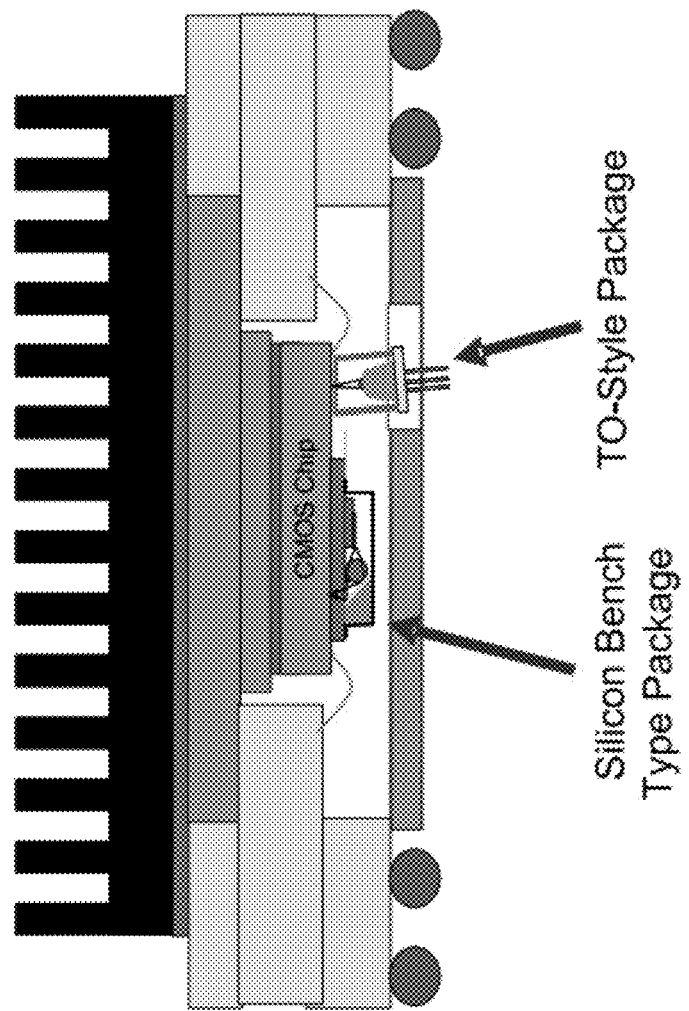
FIG. 6A illustrates a light source assembly with a TO-can and a edge-emitting laser diode implementation with an external heatsink, in accordance with an embodiment of the invention.

FIG. 6A illustrates a light source assembly with a TO-can and a edge-emitting laser diode implementation with an external heatsink, in accordance with an embodiment of the invention. Referring to FIG. 6A, there is shown a silicon optical bench-type package and a TO-style package illustrating two options for coupling light into a CMOS chip. Wire bonds may be utilized to provide electrical connectivity as shown.

Figure 6B:
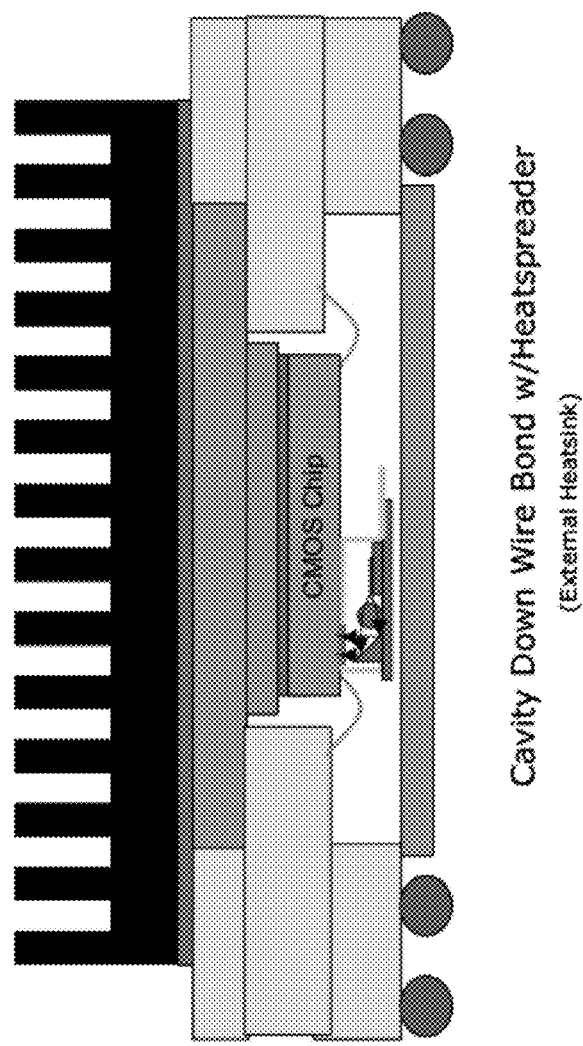
FIG. 6B illustrates a light source assembly implementation having a cavity-down wire bond edge-emitting laser diode with an external heatsink, in accordance with an embodiment of the invention.

FIG. 6B illustrates a light source assembly implementation having a cavity-down wire bond edge-emitting laser diode with an external heatsink, in accordance with an embodiment of the invention. Referring to FIG. 6B, there is shown a silicon optical bench-type package and a cavity-down wire bond embodiment for coupling light into a CMOS chip. Wire bonds may be utilized to provide electrical connectivity as shown.

Figure 7:
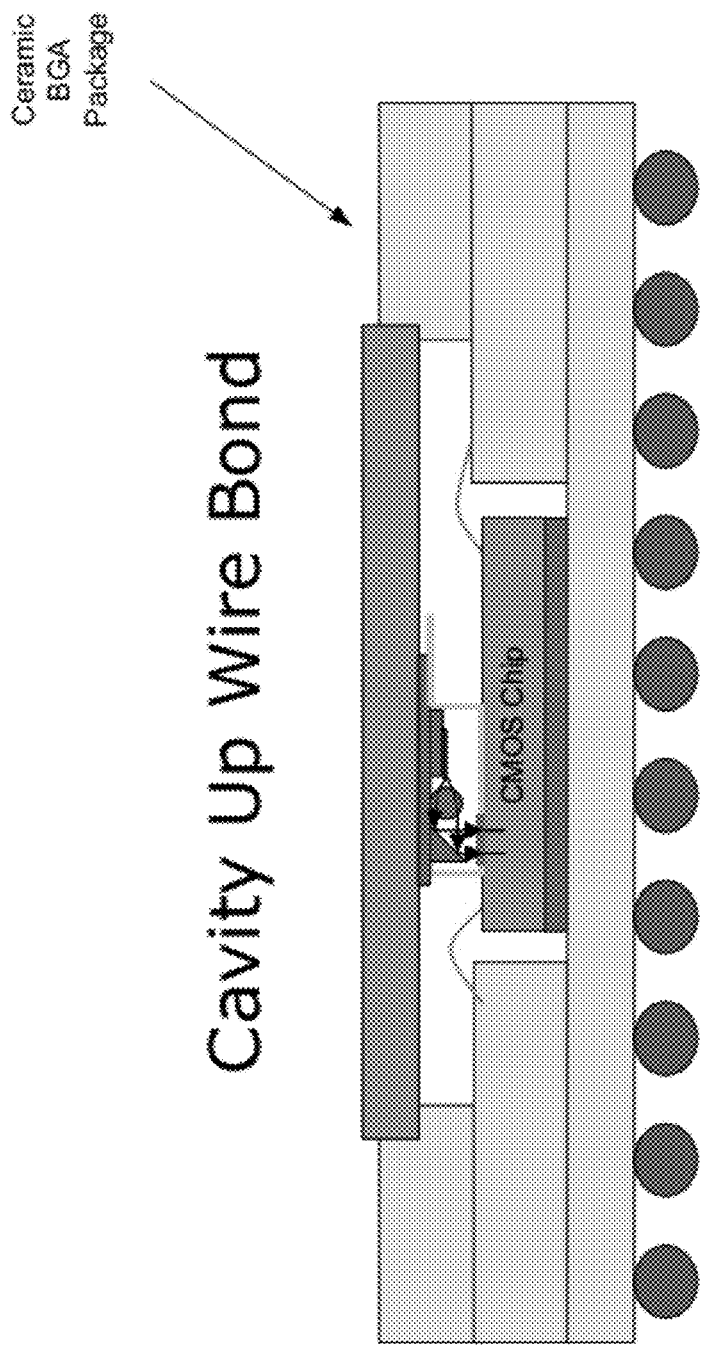
FIG. 7 illustrates an alternative embodiment with a cavity-up wire bond implementation, in accordance with an embodiment of the invention.

FIG. 7 illustrates an alternative embodiment with a cavity-up wire bond implementation, in accordance with an embodiment of the invention. Referring to FIG. 7, there is shown a light source assembly affixed to a CMOS chip within a ceramic BGA package. The BGA package may be bump-bonded to a circuit board, for example. Wire bonds may be utilized to provide electrical connectivity to the CMOS chip.

Figure 8:
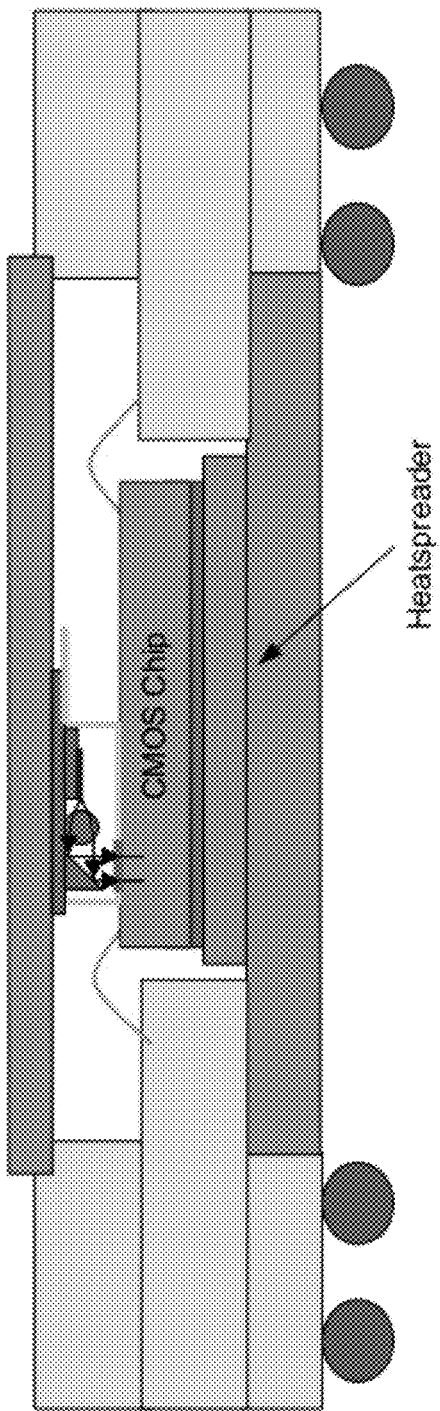
FIG. 8 illustrates a cavity-up wire bond implementation with heat spreader, in accordance with an embodiment of the invention.

FIG. 8 illustrates a cavity-up wire bond implementation with heat spreader, in accordance with an embodiment of the invention. The CMOS chip may be affixed to a heat spreader to enable thermal control of the CMOS chip and may also enable wire bond electrical interconnects to the CMOS chip.

Figure 9:
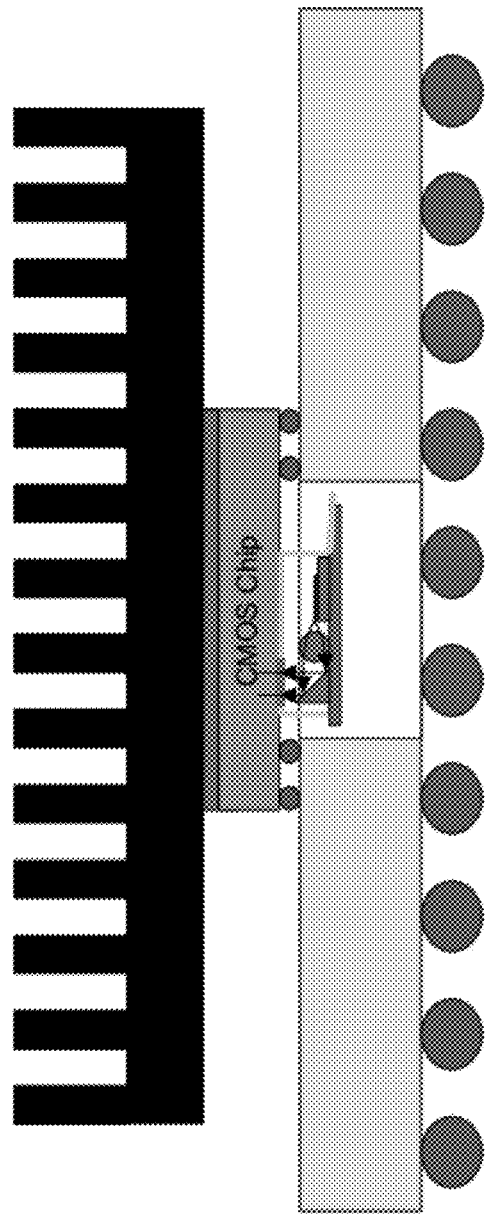
FIG. 9 is an external heatsink flip-chip implementation of a light source assembly, in accordance with an embodiment of the invention.

FIG. 9 is an external heatsink flip-chip implementation of a light source assembly, in accordance with an embodiment of the invention. The CMOS chip which is bump-bonded to a carrier, which may also be bonded to a circuit board, for example. The CMOS chip may be coupled to an external heatsink for enhanced thermal conduction out of the chip.

Figure 10:
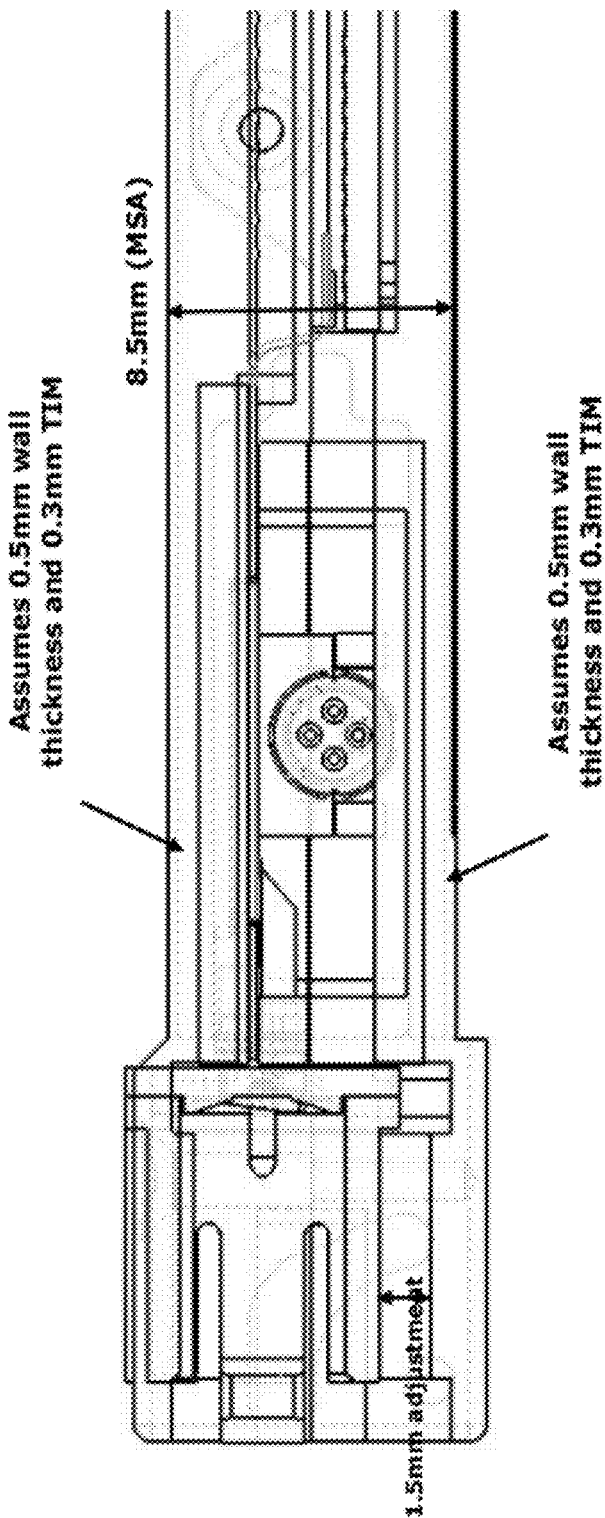
FIG. 10 illustrates an exemplary module assembly comprising a TO-can optical source implementation, in accordance with an embodiment of the invention.

FIG. 10 illustrates an exemplary module assembly comprising a TO-can optical source implementation, in accordance with an embodiment of the invention. Height limitations as per multi-source agreement (MSA) modules may determine the allowable wall thicknesses in the module as well as placement of the TO can.

Figure 11:
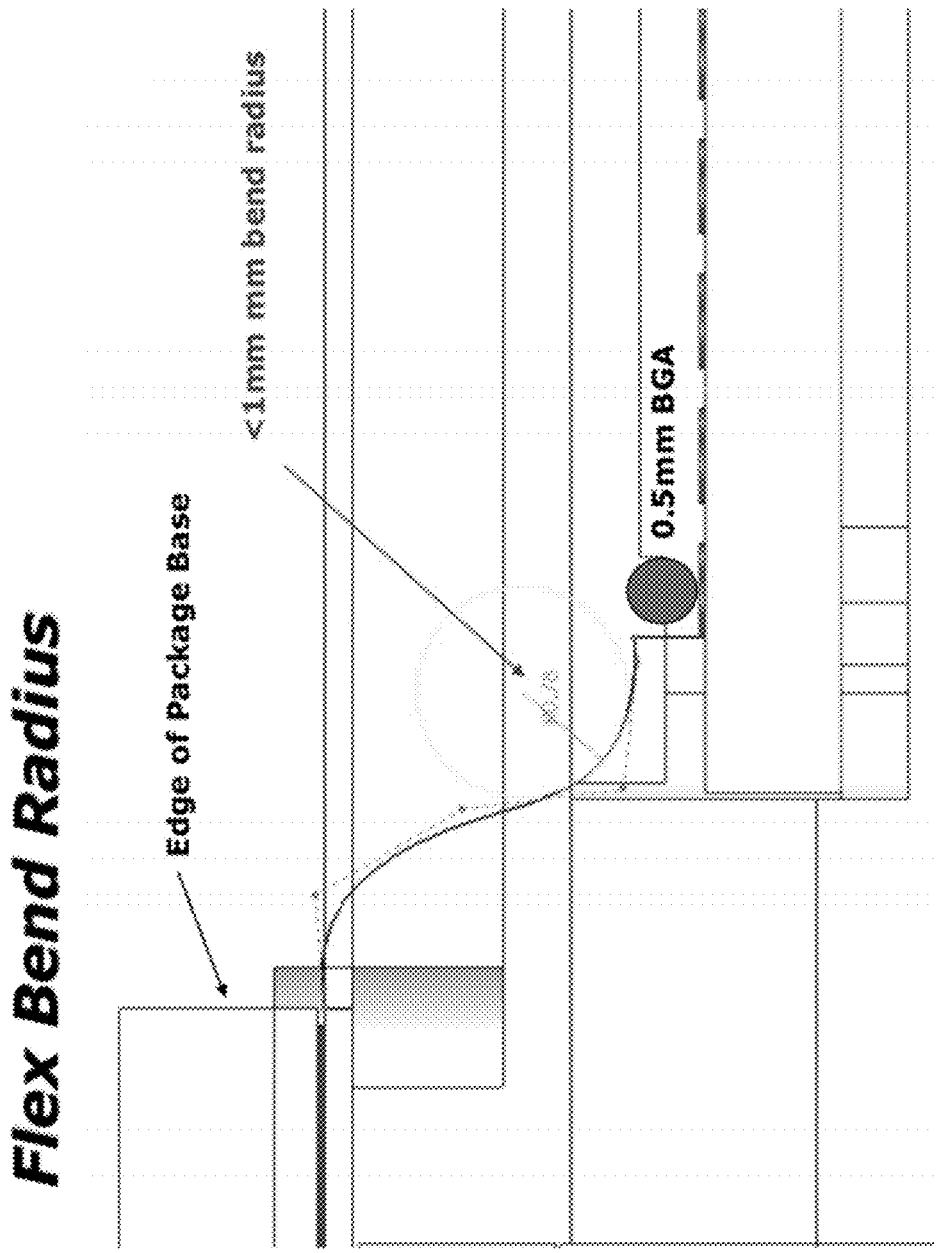
FIG. 11 illustrates exemplary flex circuit bend radius limitations within a module, in accordance with an embodiment of the invention.

FIG. 11 illustrates exemplary flex circuit bend radius limitations within a module, in accordance with an embodiment of the invention. To fit within an MSA module, the flex circuit comprises less than 1 mm bend radius.

Figure 12:
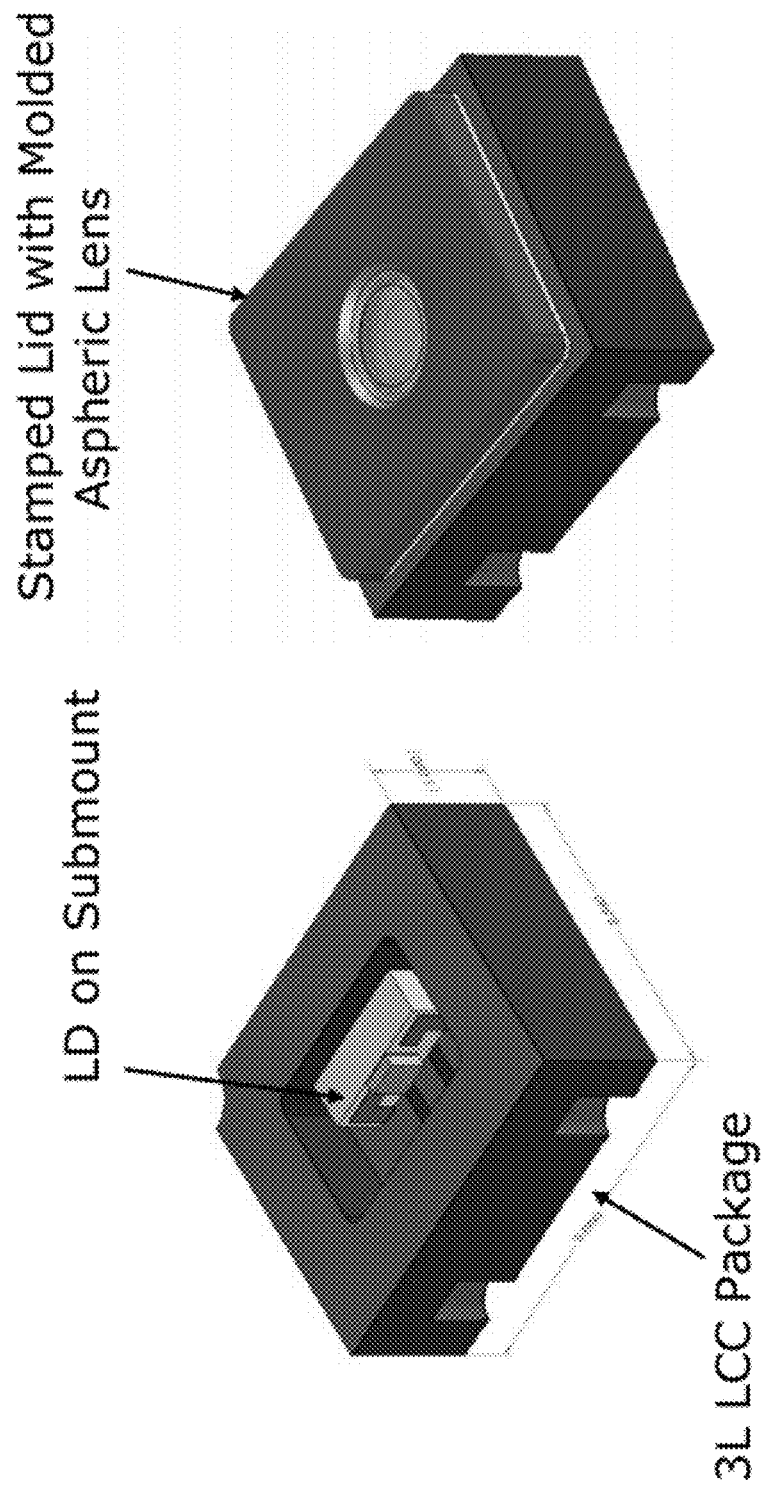
FIG. 12 illustrates an alternative implementation comprising a laser diode on a submount coupled to a leadless chip carrier (LCC) package, in accordance with an embodiment of the invention.

FIG. 12 illustrates an alternative implementation comprising a laser diode on a submount coupled to a leadless chip carrier (LCC) package, in accordance with an embodiment of the invention. The laser diode may be mounted vertically on a submount to enable direct optical coupling to a grating coupler in the CMOS chip, but then may require accurate alignment control for optimal optical coupling efficiency.

A stamped lid with a molded aspheric lens may provide a hermetic seal for the LCC package, as shown in the right diagram. The lid may be epoxied or soldered to the LCC package and may be integrated in a module as shown in FIG. 13.

Figure 13:
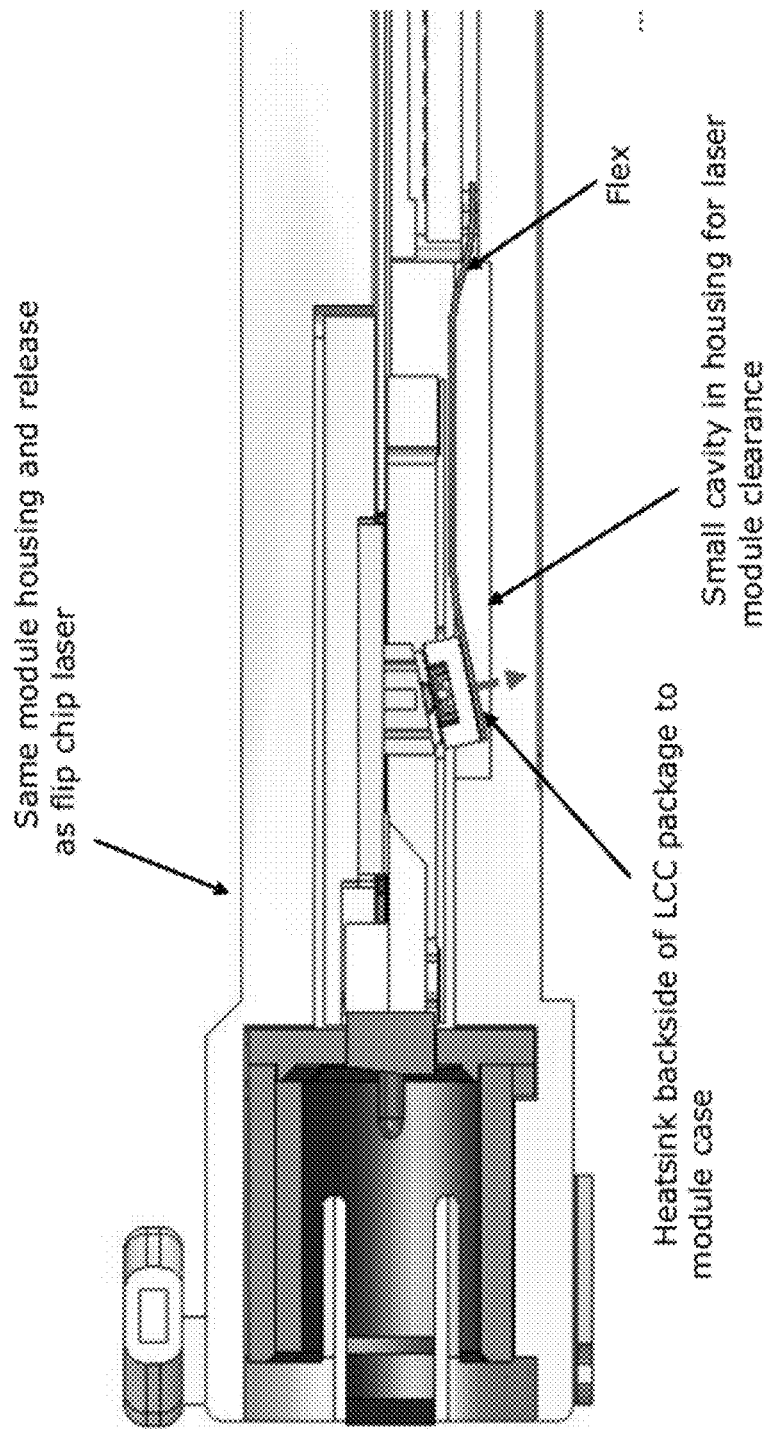
FIG. 13 illustrates an LCC package module implementation, in accordance with an embodiment of the invention.

FIG. 13 illustrates an LCC package module implementation, in accordance with an embodiment of the invention. The module housing may be substantially similar to the housing utilized for the flip-chip implementation. The LCC package may be heatsinked to the module case, and a cavity may be utilized to provide clearance for the laser module within the housing.

Figure 14:
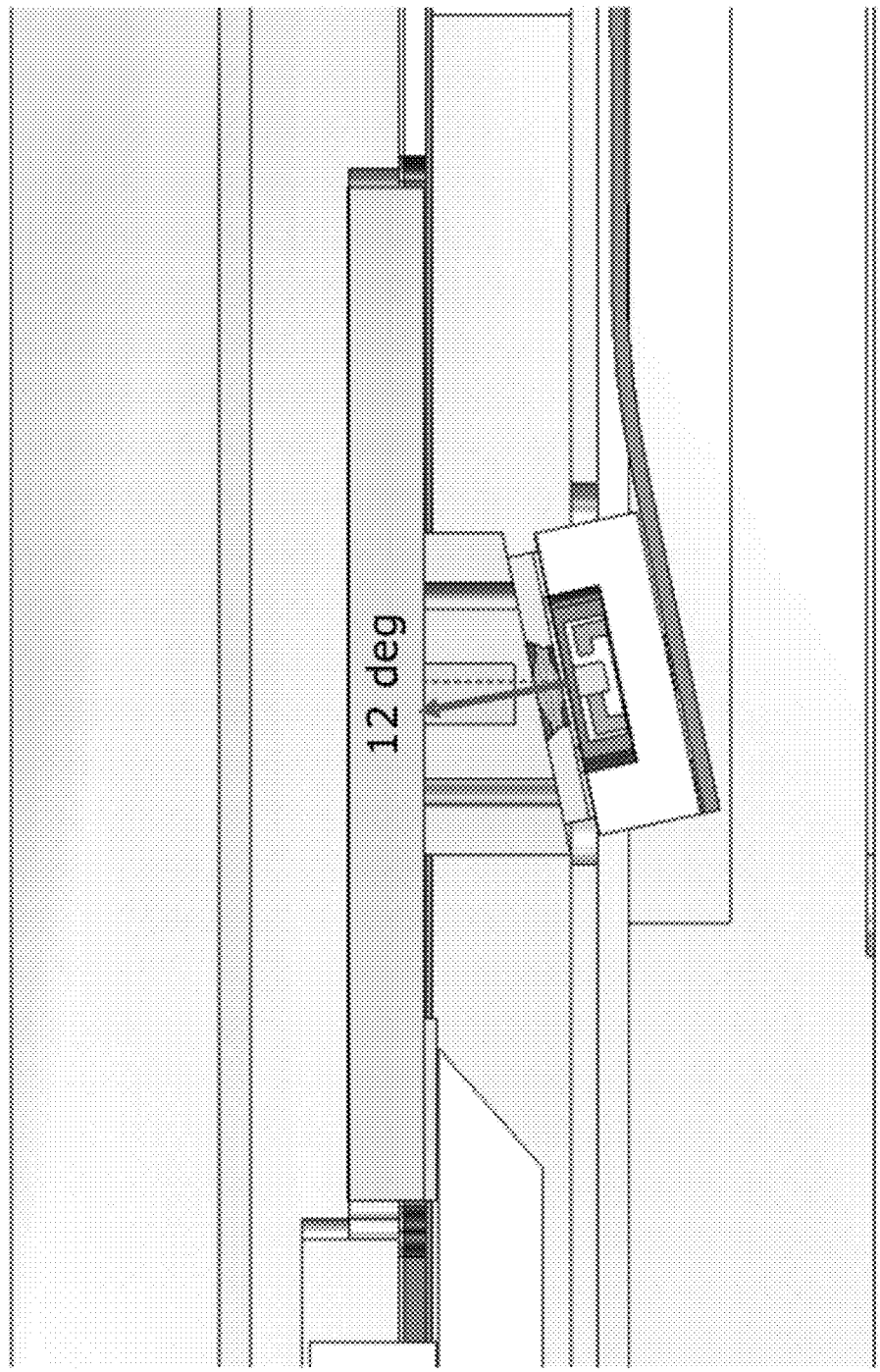
FIG. 14 illustrates the non-normal incidence of the optical mode from the LCC package, in accordance with an embodiment of the invention.

FIG. 14 illustrates the non-normal incidence of the optical mode from the LCC package, in accordance with an embodiment of the invention. The angle provides for increased coupling efficiency with the grating coupler in the CMOS chip as normal incidence results in low or negligible coupling efficiency in the grating coupler.

Figure 15:
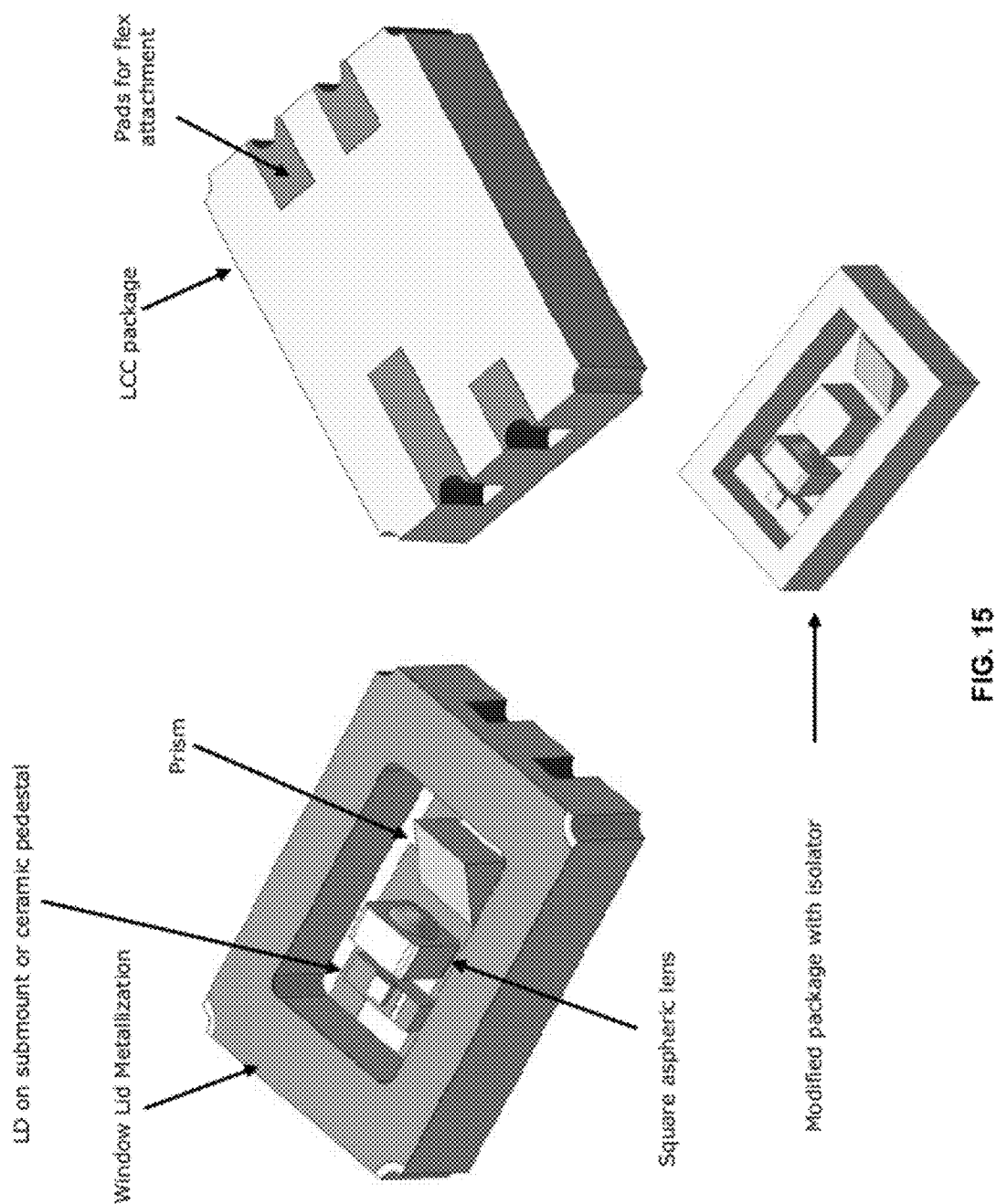
FIG. 15 illustrates an LCC package with a laser diode on submount implementation, in accordance with an embodiment of the invention.

FIG. 15 illustrates an LCC package with a laser diode on submount implementation, in accordance with an embodiment of the invention. Referring to FIG. 15, in the left figure, there is shown an LCC package comprising a laser diode on a submount or ceramic pedestal, a square aspheric lens, and a prism. The outer edge of the top surface of the LCC package may be metalized for attachment of a window lid. The prism may enable beam reflection for directing the optical signal out of the top of the LCC package and into a grating coupler on a CMOS chip. In the right figure, bond pads are implemented to provide electrical connection to the laser diode.

The bottom figure in FIG. 15 illustrates a modified package with an integrated isolator, in accordance with an embodiment of the invention. The isolator comprises a faraday rotator or a faraday and half-wave rotator to provide appropriate polarization at the grating coupler in the CMOS chip to which the LCC package is attached.

Figure 16:
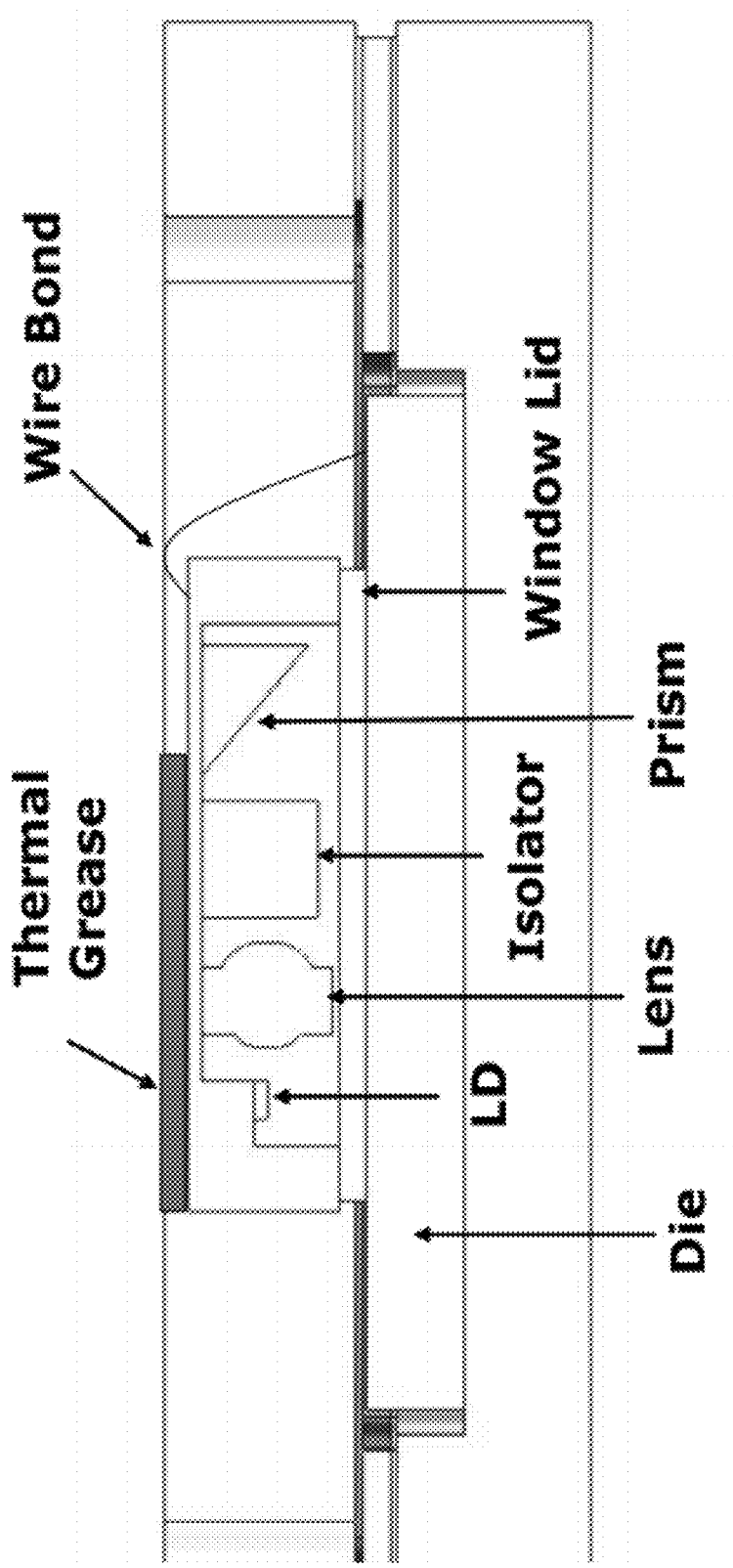
FIG. 16 illustrates a cavity-down implementation utilizing thermal grease, in accordance with an embodiment of the invention.

FIG. 16 illustrates a cavity-down implementation utilizing thermal grease, in accordance with an embodiment of the invention. Referring to FIG. 16, there is shown a CMOS chip or die, a laser diode, a lens, an isolator, thermal grease, a prism, a window lid, and a wire bond. The laser diode may generate a CW optical beam that may be focused by the lens, then passed through the isolator, and then reflected by the mirror down onto the CMOS die through the window lid. The wire bond may provide electrical connectivity to the laser diode. The thermal grease may provide thermal conduction of heat out of the laser diode.

Figure 17:
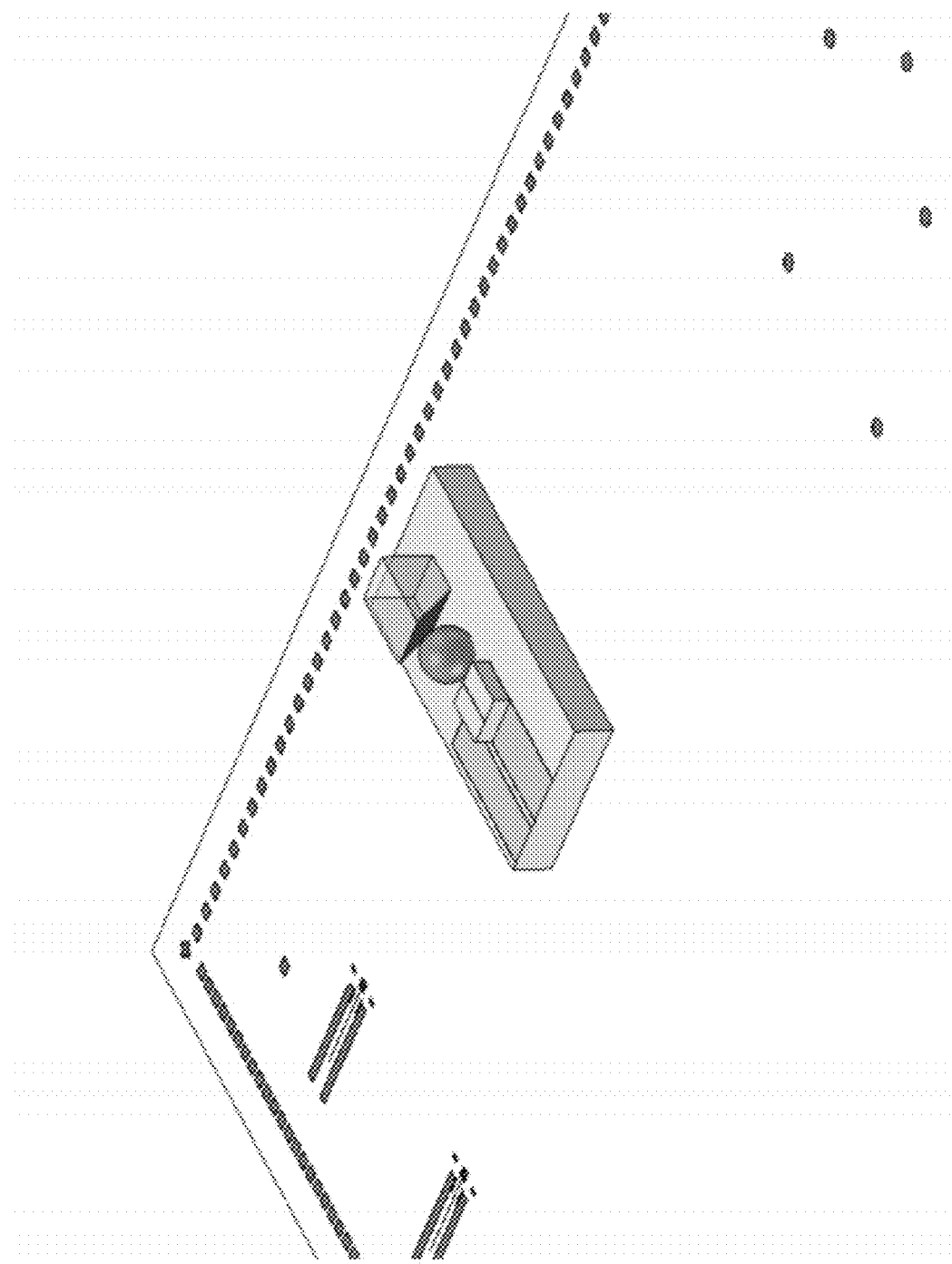
FIG. 17 is a simplified illustration of an exemplary light source assembly, in accordance with an embodiment of the invention.

FIG. 17 is a simplified illustration of an exemplary light source assembly, in accordance with an embodiment of the invention. The laser diode may be mounted on a mesa or pedestal and may emit light in the horizontal direction into the ball lens, which may focus the light onto a prism or angled reflective surface, which directs the light signal down into the CMOS chip through the substrate. The substrate may be transparent or may comprise an optical window to allow the light to pass through. In an embodiment of the invention, an isolator may be integrated in the optical path for proper polarization at the CMOS chip surface.

Figure 18:
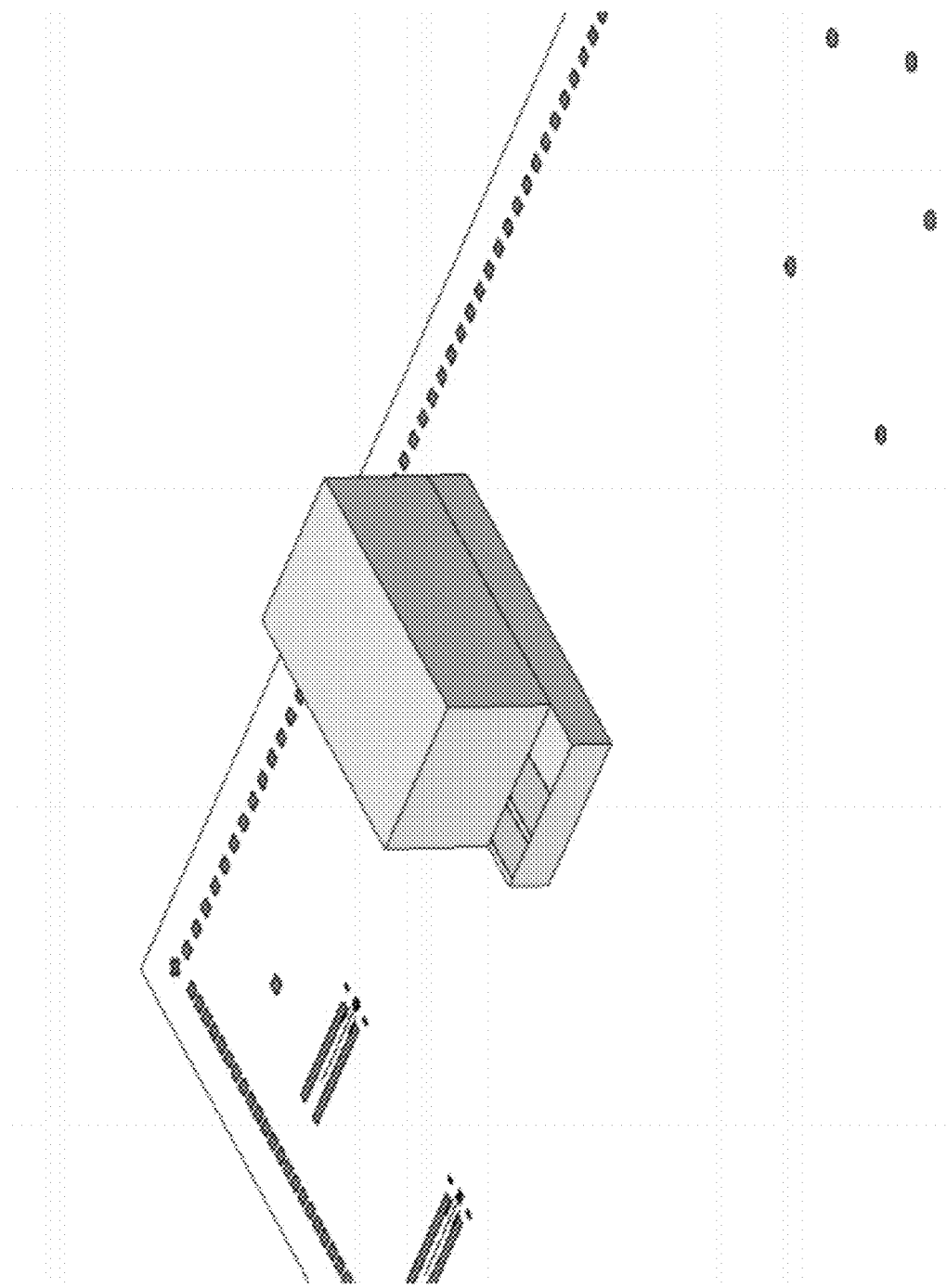
FIG. 18 illustrates an exemplary light source assembly enclosed in a hermetic package by a lid over the substrate, in accordance with an embodiment of the invention.

FIG. 18 illustrates an exemplary light source assembly enclosed in a hermetic package by a lid over the substrate, in accordance with an embodiment of the invention. The package comprises the laser diode, the ball lens, and a prism, or reflective surface. In this manner, optical component lifetime may be increased by reducing or eliminating environmental effects on the devices.

Figure 19:
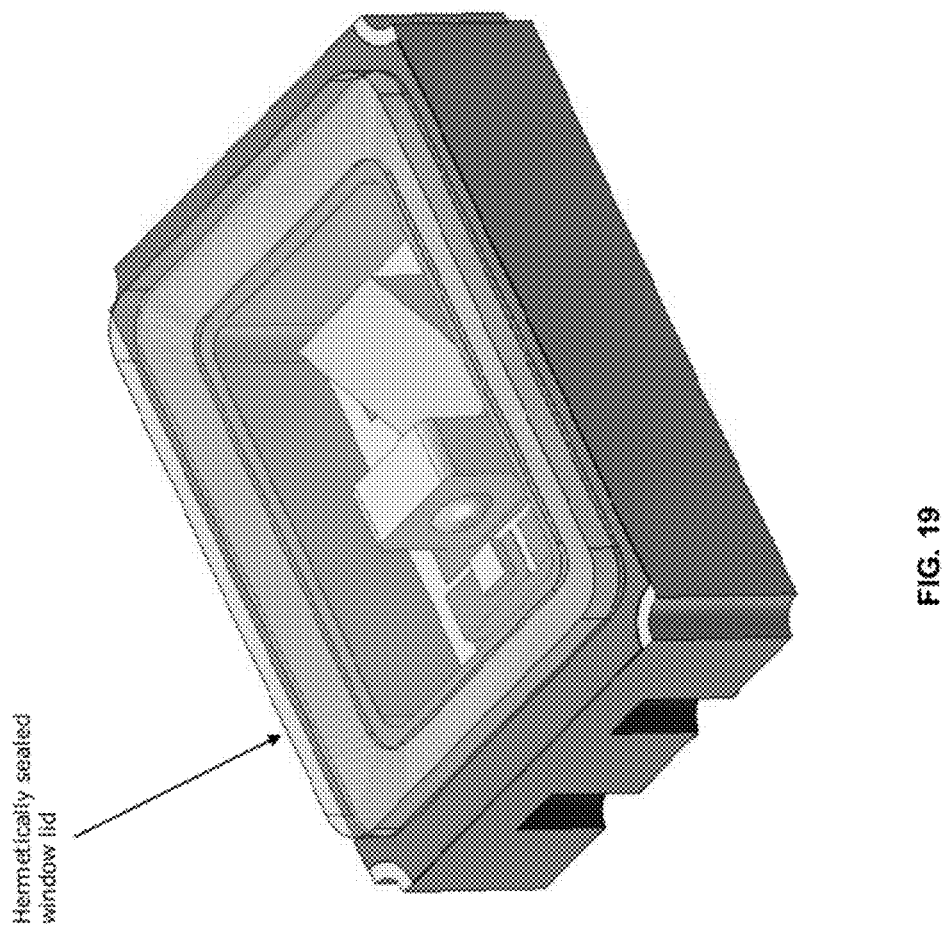
FIG. 19 illustrates an LCC package with a hermetically sealed window lid, in accordance with an embodiment of the invention.

FIG. 19 illustrates an LCC package with a hermetically sealed window lid, in accordance with an embodiment of the invention. The LCC package may be mounted on a CMOS chip to provide an optical signal into the surface of the chip, while allowing thermal and electrical access to the back side of the package.

Figure 20:
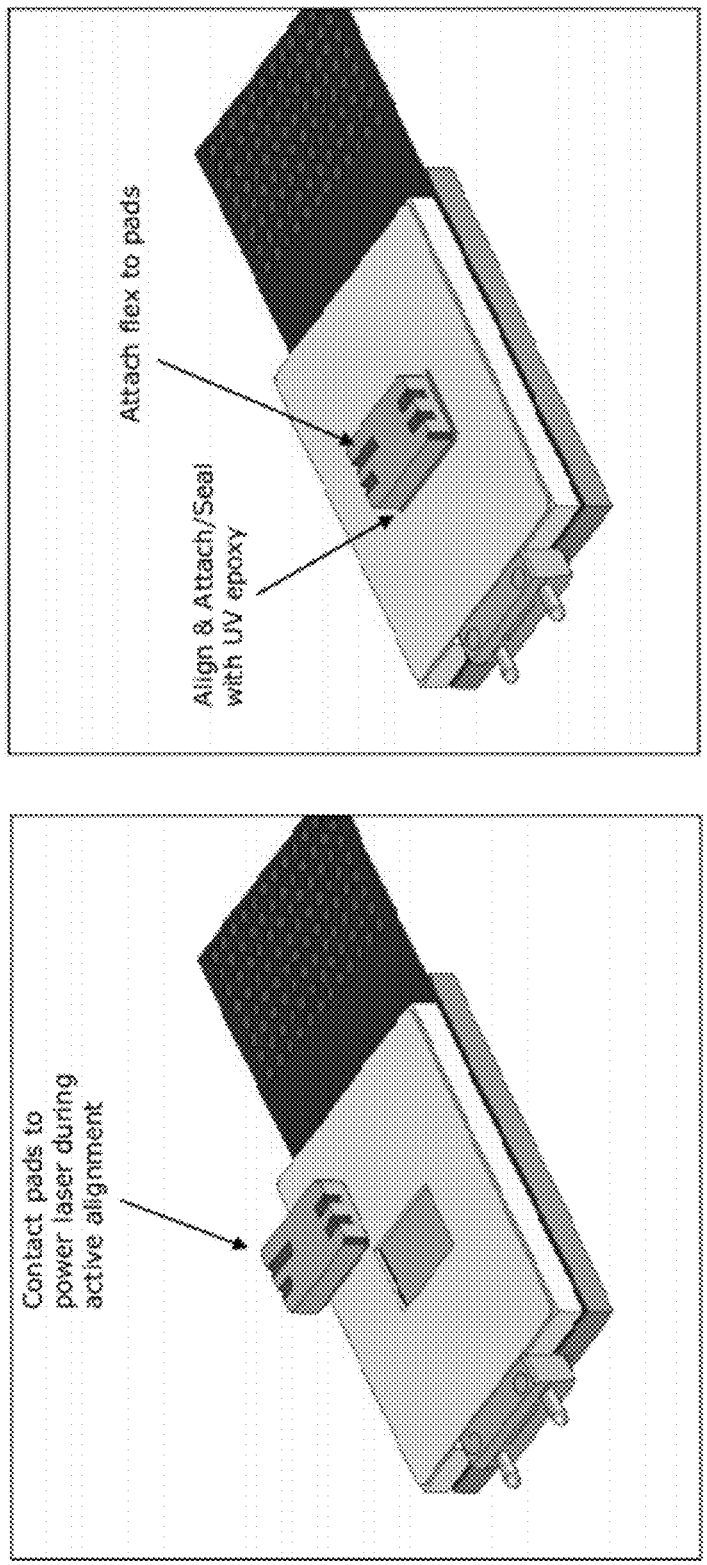
FIG. 20 illustrates the integration of the hermetically sealed LCC package onto the CMOS chip and associated printed circuit board and interconnects, in accordance with an embodiment of the invention.

FIG. 20 illustrates the integration of the hermetically sealed LCC package onto the CMOS chip and associated printed circuit board and interconnects, in accordance with an embodiment of the invention. The contact pads are accessible when the package is mounted to the CMOS chip, and the package may be aligned by maximizing the received optical signal in the CMOS chip before being epoxied in place.

Figure 21:
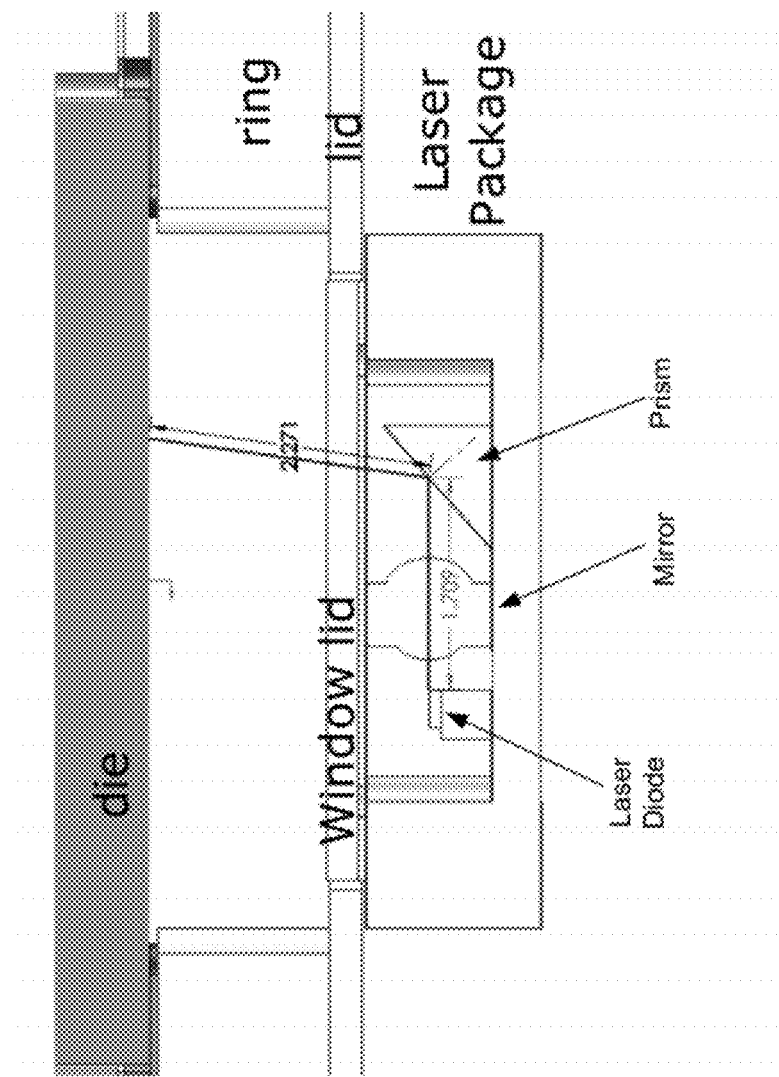
FIG. 21 illustrates an alternative embodiment utilizing a ring to determine vertical distance between the laser diode source assembly and the CMOS die, in accordance with an embodiment of the invention.

FIG. 21 illustrates an alternative embodiment utilizing a ring to determine vertical distance between the laser diode source assembly and the CMOS die, in accordance with an embodiment of the invention. The laser diode generates an optical signal that may be focused by an aspheric lens, and then reflected by the prism up towards the CMOS die. The ring height may be configured to optimize coupling efficiency by placing the beam waist at the appropriate point vertically in a grating coupler in the CMOS die.

Figure 22:
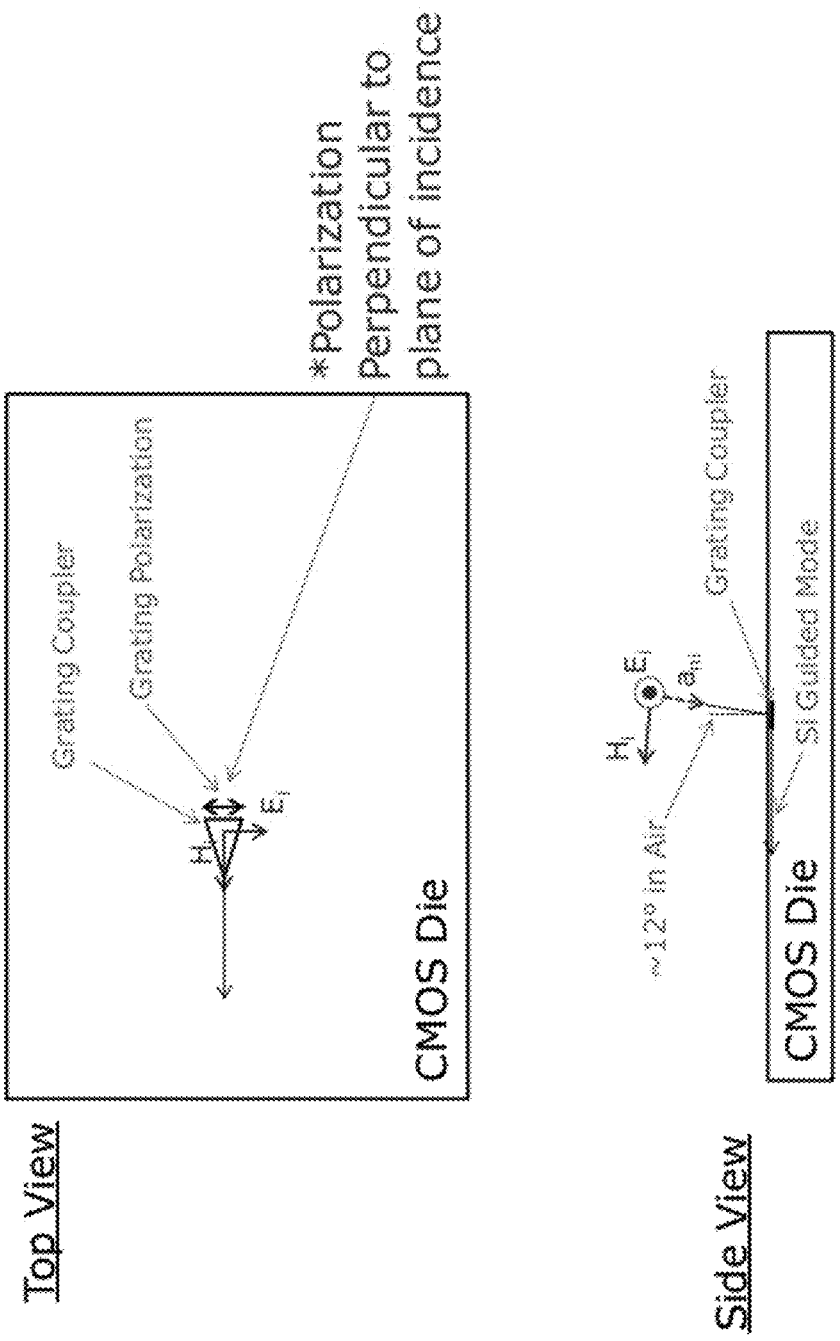
FIG. 22 illustrates the desired polarization for increased grating coupling efficiency into a single polarization grating coupler in the CMOS chip, in accordance with an embodiment of the invention.

FIG. 22 illustrates the desired polarization for increased grating coupling efficiency into a single polarization grating coupler in the CMOS chip, in accordance with an embodiment of the invention. The incoming optical mode is TE polarized in the direction perpendicular to the longest dimension of the coupler, as illustrated by $E_i$. In addition, the optical mode may range in angle from 1-60 degrees from normal, for example, to the surface of the CMOS chip. In this manner, a silicon guided mode may be generated in the CMOS chip that may then be processed by optical devices in the chip.

Figure 23:
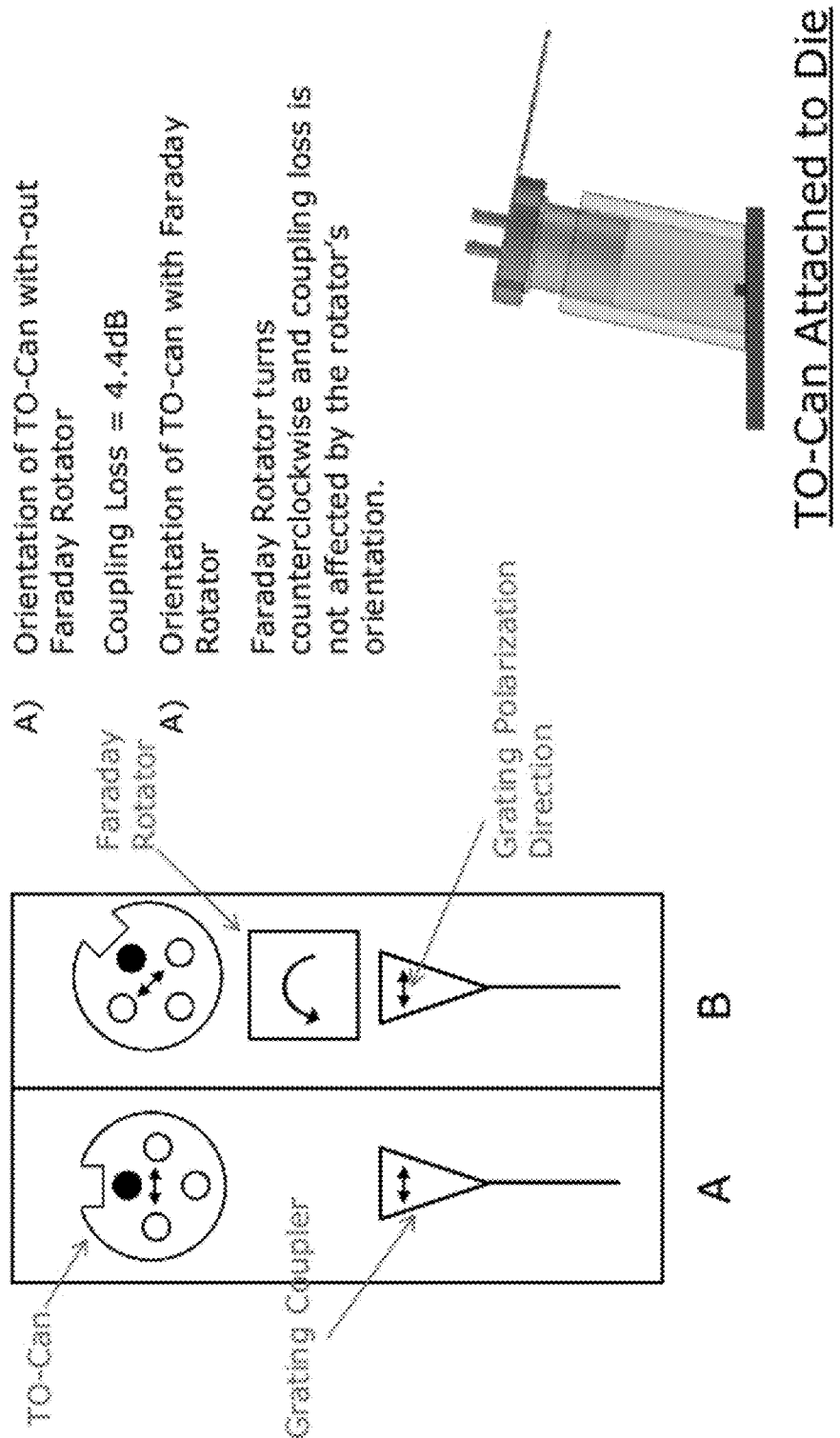
FIG. 23. illustrates a TO can implementation polarization configuration, in accordance with an embodiment of the invention.

FIG. 23. illustrates a TO can implementation polarization configuration, in accordance with an embodiment of the invention. To obtain maximized grating coupling efficiency by impinging an optical mode with the appropriate polarization, a TO can may be orientated with or without a faraday rotator, since a TO can may be easily rotated in place. If, in example A, where there is no faraday rotator, the optical mode results in the correct polarization, by adding a faraday rotator, as in example B, the TO can may then be rotated to account for the rotation, resulting in the appropriate polarization.

The bottom right image demonstrates the ability to rotate the TO can when attached to the CMOS die.

Figure 24:
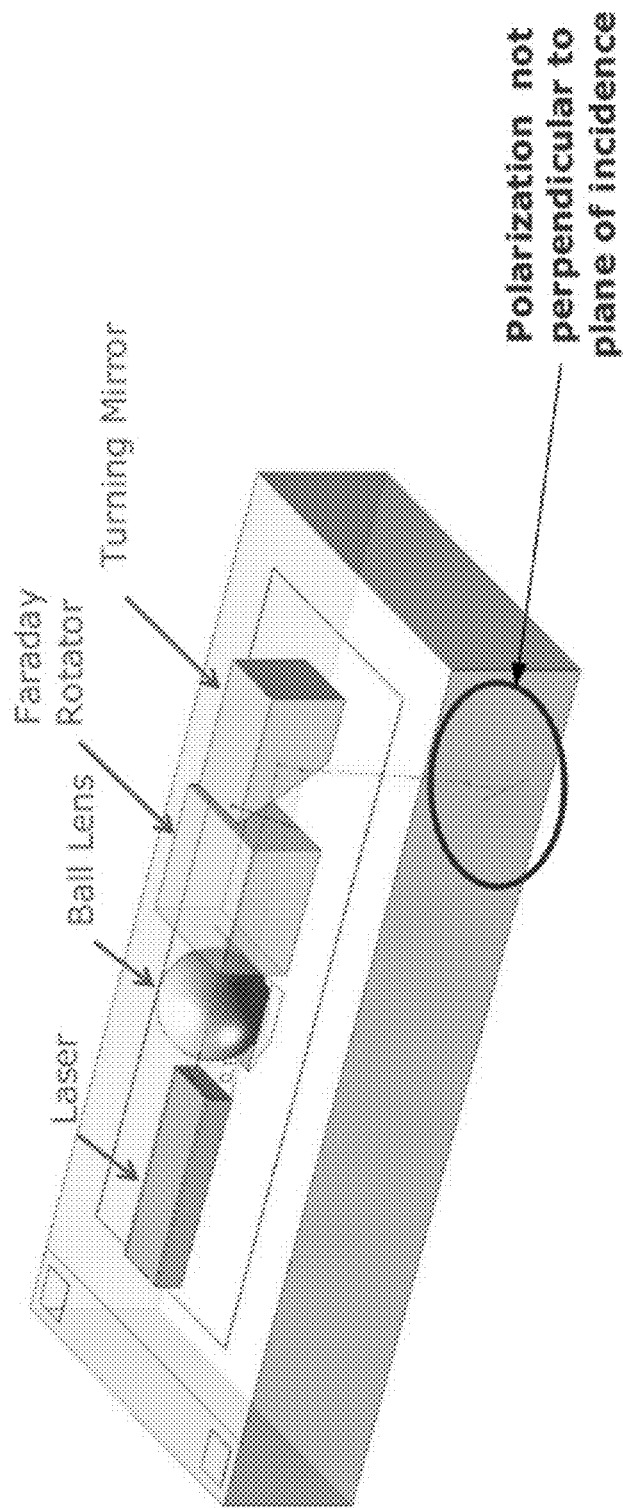
FIG. 24 illustrates the challenge of supplying the appropriate polarization when using a flat-stacked laser diode chip on a mesa, in accordance with an embodiment of the invention.

FIG. 24 illustrates the challenge of supplying the appropriate polarization when using a flat-stacked laser diode chip on a mesa, in accordance with an embodiment of the invention. If a faraday rotator is utilized for isolation, the resulting optical mode is not perpendicular to the plane of incidence at the CMOS chip, thus resulting in poor coupling efficiency. This is corrected by adding a half-wave rotator, as illustrated in FIG. 25.

Figure 25:
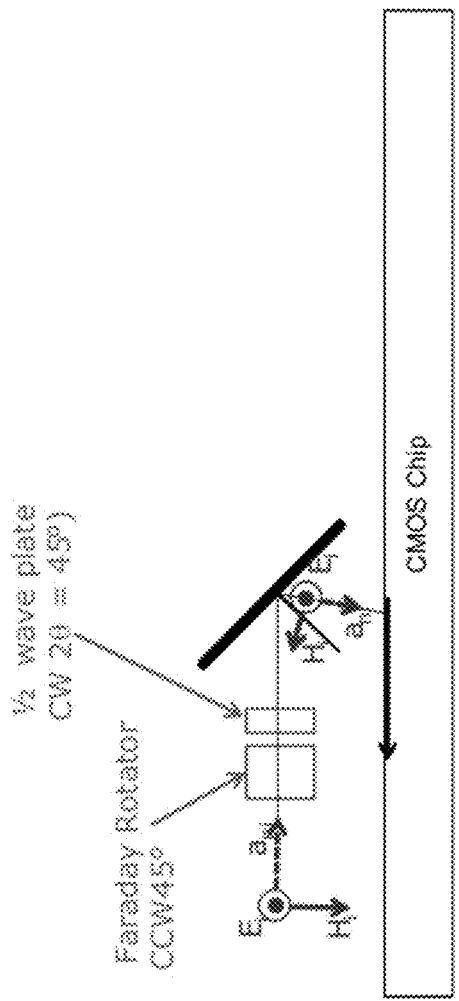
FIG. 25 illustrates a laser diode source assembly with a faraday rotator plus a half-wave plate, in accordance with an embodiment of the invention.

FIG. 25 illustrates a laser diode source assembly with a faraday rotator plus a half-wave plate, in accordance with an embodiment of the invention. The combination of a faraday rotator and a half-wave plate results in the desired polarization, TE polarized in the short dimension of the grating coupler, at the surface of the CMOS chip for optimum coupling efficiency. The desired polarization orientation for a single-polarization grating coupler on the CMOS chip 130 may be achieved together with feedback isolation for the laser.

In addition to coupling efficiency, the faraday rotator and the half-wave rotator provide isolation from reflected optical signals to the laser source. If no isolation is utilized, a feedback insensitive laser may be required, which may significantly increase cost.

Figure 26:
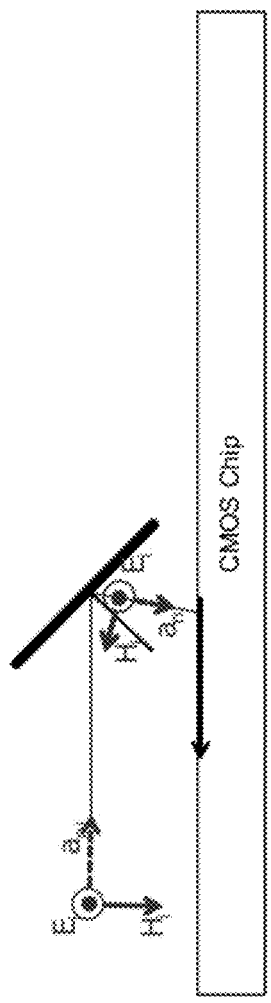
FIG. 26 illustrates the optical mode polarization without an isolator, in accordance with an embodiment of the invention.

FIG. 26 illustrates the optical mode polarization without an isolator, in accordance with an embodiment of the invention. In this instance, the optical mode may be at the appropriate polarization at the CMOS chip surface, but optical modes may be reflected and/or transmitted back to the optical source which may affect the output power of the laser diode, thus requiring a feedback insensitive laser. Cost factors may determine whether an isolator or a feedback insensitive laser is preferred.

In instances where no laser isolation is utilized, a feedback insensitive laser may be required. The desired polarization orientation may be achieved without polarization rotating elements.

In another embodiment of the invention, polarization-independent gratings and a feedback insensitive laser may be utilized, eliminating the need for rotators and isolators. Cost may be the determining factor in which embodiment to utilize, as polarization-independent gratings and feedback insensitive lasers may be more costly and difficult to integrate.

Figure 27:
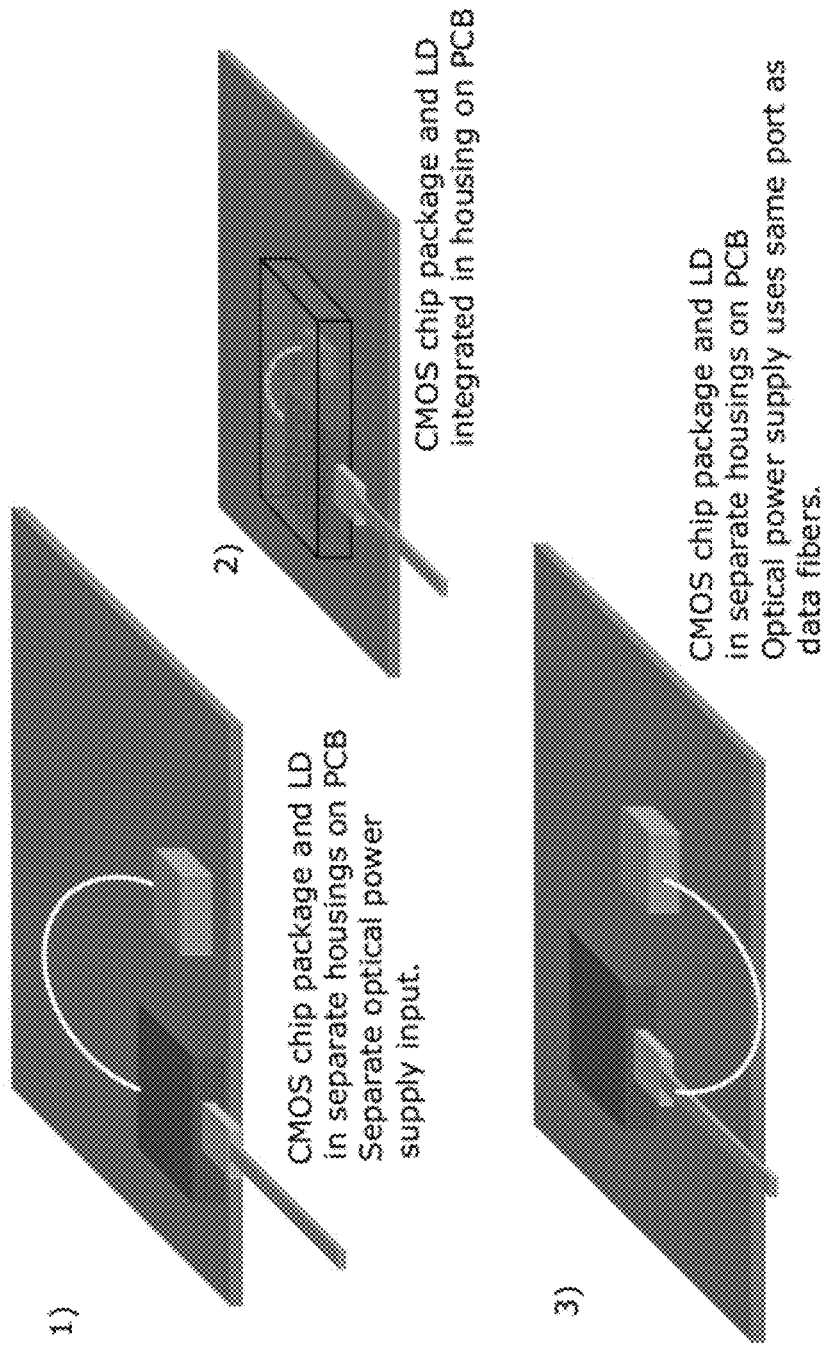
FIG. 27 illustrates several embodiments of external integration for coupling light into a CMOS photonics chip, in accordance with an embodiment of the invention.

FIG. 27 illustrates several embodiments of external integration for coupling light into a CMOS photonics chip, in accordance with an embodiment of the invention. Illustration 1) shows an embodiment with the CMOS chip package and a laser diode in separate housings on a printed circuit board. In this case the laser light source is functioning like an "optical power supply" in a manner similar to en electrical power supply in a conventional electronic system. Illustration 2) shows an embodiment with the CMOS photonics chip and a laser diode integrated in a single housing mounted to a printed circuit board. Illustration 3) shows an embodiment with the CMOS photonics chip and a laser diode in separate housings on a printed circuit board. In this embodiment, the "optical power supply" may use the same port as the optical fibers coupled to the CMOS photonics chip.

Figure 28:
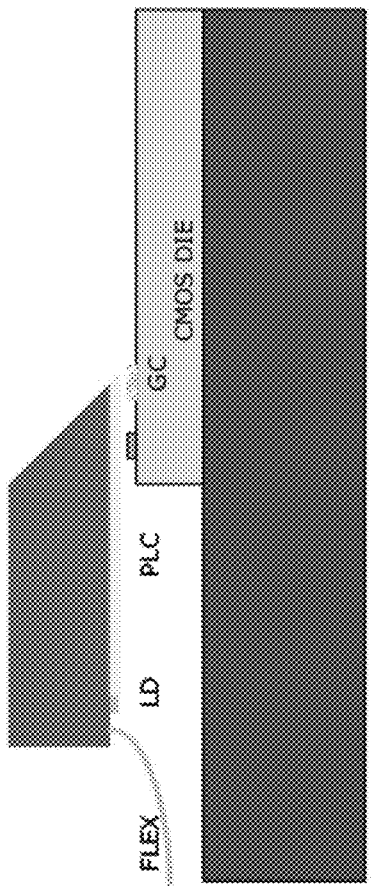
FIG. 28 illustrates an exemplary co-packaging embodiment, in accordance with an embodiment of the invention.

FIG. 28 illustrates an exemplary co-packaging embodiment, in accordance with an embodiment of the invention. A laser diode chip may be mounted on a planar lightwave circuit (PLC) with a reflective surface to direct the emitted light down into the CMOS photonics chip via a grating coupler. In an embodiment of the invention, a flex cable may be utilized to couple the laser diode and PLC to a power source. In this manner, active alignment may be enabled.

Figure 29:
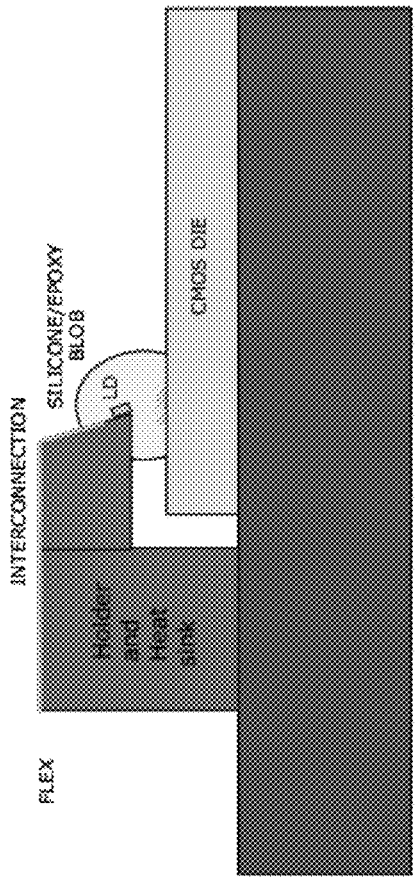
FIG. 29 illustrates an exemplary co-packaging embodiment with a laser diode mounted on a heat sink and angled holder, in accordance with an embodiment of the invention.

FIG. 29 illustrates an exemplary co-packaging embodiment with a laser diode mounted on a heat sink and angled holder, in accordance with an embodiment of the invention. The optical path may include an encapsulation material such as silicon or epoxy which can serve to protect the optical path and improve reliability. A flex connector may be utilized for electrical interconnection to the laser diode assembly.

Figure 30:
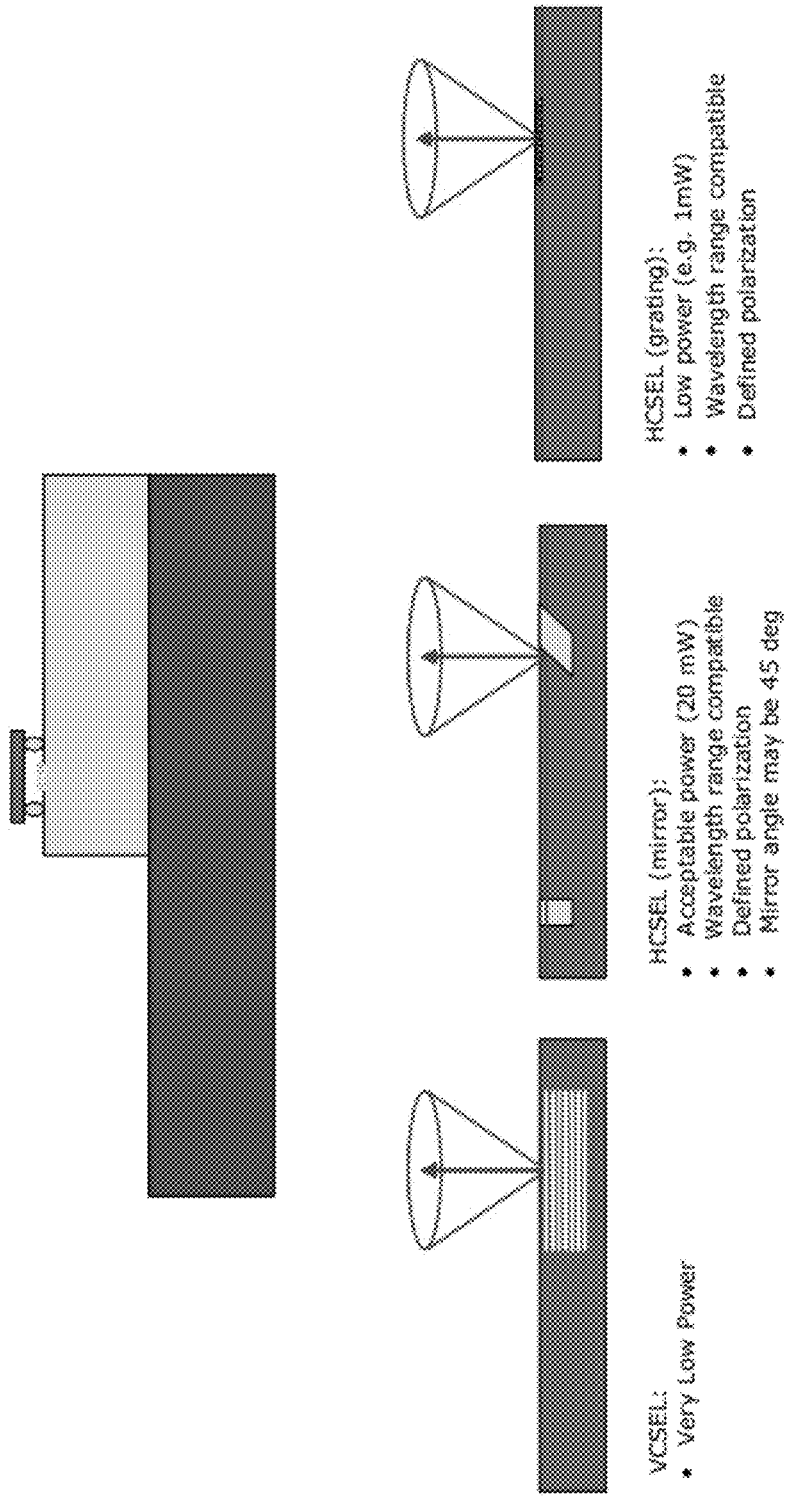
FIG. 30 illustrates exemplary vertical coupling embodiments, in accordance with an embodiment of the invention.

FIG. 30 illustrates exemplary vertical coupling embodiments, in accordance with an embodiment of the invention. The embodiment on the left comprises a vertical cavity surface emitting laser (VCSEL) implementation demonstrating vertical coupling of light out of the laser diode chip. In this manner, the laser diode may be directly mounted to the CMOS photonics chip.

The embodiment in the middle illustrates an exemplary horizontal cavity surface emitting laser (HCSEL) with an angled reflective surface that couples light from the laser cavity out of the surface of the laser diode chip. In this manner, light may be coupled into the CMOS photonics chip with a suitable polarization and angle for the grating coupler.

The embodiment on the right illustrates a HCSEL with grating coupling out of the surface of the laser diode chip. The grating in the laser diode enables surface emission of light. In this manner, the laser diode chip may be mounted to the CMOS photonics chip with light coupled into the CMOS photonics chip with a suitable polarization and angle for the grating coupler.

FIG. 31 illustrates an exemplary HCSEL embodiment with mirror coupling of light out of the surface of the laser diode chip, in accordance with an embodiment of the invention. By utilizing an angled mirror surface, light coupling back into the laser cavity may be reduced and/or eliminated. The mode polarization is shown in the lower left figure, illustrating the compatibility of the HCSEL structure with the grating coupler in the CMOS photonics chip.

Figure 32:
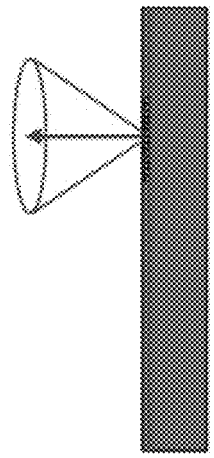
FIG. 32 illustrates an exemplary HCSEL embodiment with grating coupling of light out of the surface of the laser diode chip, in accordance with an embodiment of the invention.

FIG. 32 illustrates an exemplary HCSEL embodiment with grating coupling of light out of the surface of the laser diode chip, in accordance with an embodiment of the invention. By utilizing grating coupling, such as from a distributed Bragg reflector (DBR), an improved light spectrum, reduced linewidth, for example, from the laser diode may be enabled. The HCSEL structure may enable definition of the polarization mode emitted by the laser diode, which enables suitable coupling to the grating coupler in the CMOS photonics chip.

In an embodiment of the invention, a method and system are disclosed for a light source assembly supporting direct coupling to an integrated circuit. In this regard, a light source assembly affixed to a photonically enabled CMOS chip 130 may comprise a laser 307, a microlens 309, a turning mirror 323, an optical bench 301, and reciprocal and non-reciprocal polarization rotating elements. The laser 307 may generate an optical signal that may be focused utilizing the microlens, which may comprise a ball lens 309. The focused optical signal may be reflected at an angle defined by the turning mirror 323. The reflected optical signal may be transmitted out of the light source assembly 300/320 to one or more grating couplers 101/135 in the photonically enabled CMOS chip 130. The one or more grating couplers 101/135 may comprise polarization independent optical couplers. The laser 307 may comprise an edge-emitting semiconductor laser diode and/or a feedback insensitive laser diode. The light source assembly 300/320 may comprise two electrothermal interfaces 325A and 325B between the optical bench 301, the laser 307, and a lid 321 affixed to the optical bench 301. The turning mirror 323 may be integrated in a lid 321 affixed to the optical bench 301 by etching, or may be integrated in the optical bench 301.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A system for processing signals, the system comprising:
a light source assembly affixed to a photonically enabled complementary metal-oxide semiconductor (CMOS) chip, said light source assembly comprising a laser, a microlens, a reciprocal polarization rotator, a non-reciprocal polarization rotator, a turning mirror, and an optical bench, said light source assembly being operable to:
generate an optical signal utilizing said laser;
focus said optical signal utilizing said microlens;
rotate a polarization of said optical signal utilizing said reciprocal polarization rotator;
reflect said optical signal at an angle defined by said turning mirror;
transmit said reflected optical signal out of said light source assembly to one or more grating couplers in said photonically enabled CMOS chip; and
reduce optical feedback to said laser from an optical signal returned from said photonically enabled CMOS chip utilizing said non-reciprocal polarization rotator.

2. The system according to claim 1, wherein said non-reciprocal polarization rotator comprises a faraday rotator.

3. The system according to claim 1, wherein said non-reciprocal polarization rotator comprises a latching faraday rotator.

4. The system according to claim 1, wherein said reciprocal polarization rotator comprises a half-wave plate.

5. The system according to claim 4, wherein said half-wave plate comprises a dielectric stack comprising one or more birefringent materials affixed to said optical bench.

6. The system according to claim 1, wherein said turning mirror is integrated in said optical bench.

7. The system according to claim 1, wherein said turning mirror is integrated in a lid affixed to said optical bench.

8. The system according to claim 1, wherein said light source assembly comprises two electro-thermal interfaces between said optical bench, said laser, and a lid affixed to said optical bench.

9. The system according to claim 1, wherein said microlens comprises a ball lens.

10. The system according to claim 1, wherein said laser comprises a semiconductor laser diode.

11. The system according to claim 1, wherein said laser comprises an edge emitting laser diode.

12. The system according to claim 1, wherein said optical bench functions as a mechanical support structure for one or more optical components of said light source assembly and said reflected optical signal passes through said optical bench.

13. The system according to claim 1, wherein said optical bench comprises silicon.

14. The system according to claim 1, wherein one or more interposers are applied between said light source assembly and said CMOS chip.

15. The system according to claim 14, wherein said one or more interposers comprise metal pads integrated into said CMOS chip.

16. The system according to claim 14, wherein said one or more interposers comprise one or more polymer pads deposited on said CMOS chip.

17. A system for processing signals, the system comprising:
a light source assembly affixed to a photonically enabled complementary metal-oxide semiconductor (CMOS) chip, said light source assembly comprising a laser, a microlens, a non-reciprocal polarization rotator, a turning mirror, and an optical bench, said light source assembly being operable to:
generate an optical signal utilizing said laser;
focus said generated optical signal utilizing said microlens;
reflect said optical signal at an angle defined by said turning mirror; and
transmit said reflected optical signal out of said light source assembly to one or more grating couplers in said photonically enabled CMOS chip; and
reduce optical feedback to said laser from an optical signal returned from said photonically enabled CMOS chip utilizing said non-reciprocal polarization rotator.

18. The system according to claim 17, wherein said non-reciprocal polarization rotator comprises a faraday rotator.

19. The system according to claim 17, wherein said non-reciprocal polarization rotator comprises a latching faraday rotator.

20. The system according to claim 17, wherein said light source assembly comprises two electro-thermal interfaces between said optical bench, said laser, and a lid affixed to said optical bench.

21. The system according to claim 17, wherein said turning mirror is integrated in said optical bench.

22. The system according to claim 17, wherein said turning mirror is integrated in a lid affixed to said optical bench.

23. The system according to claim 17, wherein said microlens comprises a ball lens.

24. The system according to claim 17, wherein said laser comprises a semiconductor laser diode.

25. The system according to claim 17, wherein said laser comprises an edge emitting laser diode.

26. The system according to claim 17, wherein said optical bench functions as a mechanical support structure for one or more optical components of said light source assembly and said reflected optical signal passes through said optical bench.

27. The system according to claim 17, wherein said optical bench comprises silicon.

28. The system according to claim 17, wherein one or more interposers are integrated between said light source assembly and said CMOS chip.

29. The system according to claim 28, wherein said one or more interposers comprise metal pads integrated into said CMOS chip.

30. The system according to claim 28, wherein said one or more interposers comprise one or more polymer pads deposited on said CMOS chip.

31. A system for processing signals, the system comprising:
a light source assembly affixed to a photonically enabled complementary metal-oxide semiconductor (CMOS) chip, said light source assembly comprising a laser, a microlens, a turning mirror, a reciprocal polarization rotator, and an optical bench, said light source assembly being operable to:
generate an optical signal utilizing said laser;
focus said generated optical signal utilizing said microlens;
rotate a polarization of said optical signal utilizing said reciprocal polarization rotator;
reflect said optical signal at an angle defined by said turning mirror;
transmit said reflected optical signal out of said light source assembly to one or more grating couplers in said photonically enabled CMOS chip.

32. The system according to claim 31, wherein said laser comprises a semiconductor laser diode.

33. The system according to claim 31, wherein said laser comprises an edge-emitting laser diode.

34. The system according to claim 31, wherein said reciprocal polarization rotator comprises a half-wave plate.

35. The system according to claim 34, wherein said half-wave plate comprises a dielectric stack comprising one or more birefringent materials affixed to said optical bench.

36. The system according to claim 31, wherein said light source assembly comprises two electro-thermal interfaces between said optical bench, said laser, and a lid affixed to said optical bench.

37. The system according to claim 31, wherein said turning mirror is integrated in a lid affixed to said optical bench.

38. The system according to claim 31, wherein said turning mirror is integrated in said optical bench.

39. The system according to claim 31, wherein said microlens comprises a ball lens.

40. The system according to claim 31, wherein said optical bench functions as a mechanical support structure for one or more optical components of said light source assembly and said reflected optical signal passes through said optical bench.

41. The system according to claim 31, wherein said optical bench comprises silicon.

42. The system according to claim 31, wherein one or more interposers are integrated between said light source assembly and said CMOS chip.

43. The system according to claim 42, wherein said one or more interposers comprise metal pads integrated into said CMOS chip.

44. The system according to claim 42, wherein said one or more interposers comprise one or more polymer pads deposited on said CMOS chip.

45. A system for processing signals, the system comprising:
   a light source assembly affixed to a photonically enabled complementary metal-oxide semiconductor (CMOS) chip, said light source assembly comprising a laser, a microlens, a turning mirror, and an optical bench, said light source assembly being operable to:
   generate an optical signal utilizing said laser;
   focus said generated optical signal utilizing said microlens;
   reflect said optical signal at an angle defined by said turning mirror; and
   transmit said reflected optical signal out of said light source assembly to one or more grating couplers in said photonically enabled CMOS chip.

46. The system according to claim 45, wherein said laser comprises semiconductor laser diode.

47. The system according to claim 45, wherein said laser comprises an edge-emitting laser diode.

48. The system according to claim 45, wherein said laser comprises a feedback insensitive laser diode.

49. The system according to claim 45, wherein said light source assembly comprises two electro-thermal interfaces between said optical bench, said laser, and a lid affixed to said optical bench.

50. The system according to claim 45, wherein said turning mirror is integrated in a lid affixed to said optical bench.

51. The system according to claim 45, wherein said turning mirror is integrated in said optical bench.

52. The system according to claim 45, wherein said microlens comprises a ball lens.

53. The system according to claim 45, wherein said optical bench functions as a mechanical support structure for one or more optical components of said light source assembly and said reflected optical signal passes through said optical bench.

54. The system according to claim 45, wherein said optical bench comprises silicon.

55. The system according to claim 45, wherein one or more interposers are integrated between said light source assembly and said CMOS chip.

56. The system according to claim 55, wherein said one or more interposers comprise metal pads integrated into said CMOS chip.

57. The system according to claim 55, wherein said one or more interposers comprise one or more polymer pads deposited on said CMOS chip.

* * * * *